(12) United States Patent
Iwata et al.

(10) Patent No.: US 7,376,003 B2
(45) Date of Patent: May 20, 2008

(54) MAGNETIC RANDOM ACCESS MEMORY

(75) Inventors: Yoshihisa Iwata, Yokohama (JP);
Yoshiaki Asao, Yokohama (JP);
Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 641 days.

(21) Appl. No.: 10/465,616

(22) Filed: Jun. 20, 2003

(65) Prior Publication Data

US 2004/0042297 A1    Mar. 4, 2004

(30) Foreign Application Priority Data

Jun. 20, 2002    (JP)    ............ 2002-179914

(51) Int. Cl.
*G11C 11/00*   (2006.01)
(52) U.S. Cl. .......... 365/158; 365/157; 365/189.04
(58) Field of Classification Search ........... 365/158, 365/157, 189.04
See application file for complete search history.

(56) References Cited

U.S. PATENT DOCUMENTS

| | | | |
|---|---|---|---|
| 6,097,626 A | 8/2000 | Brug et al. | |
| 6,111,783 A | 8/2000 | Tran et al. | |
| 6,147,922 A * | 11/2000 | Hurst et al. | 365/225.5 |
| 6,163,477 A | 12/2000 | Tran | |
| 6,269,027 B1 * | 7/2001 | Hurst et al. | 365/189.05 |
| 6,324,093 B1 | 11/2001 | Perner et al. | |
| 6,788,568 B2 * | 9/2004 | Hidaka | 365/158 |
| 2002/0141232 A1 * | 10/2002 | Saito et al. | 365/158 |
| 2003/0099130 A1 * | 5/2003 | Hidaka | 365/158 |
| 2004/0042297 A1 | 3/2004 | Iwata et al. | |

FOREIGN PATENT DOCUMENTS

| | | |
|---|---|---|
| JP | 2001-519582 | 10/2001 |
| JP | 2002-526910 | 8/2002 |
| JP | 2003-272375 | 9/2003 |
| JP | 2003-275175 | 9/2003 |

OTHER PUBLICATIONS

Roy Scheuerlein, et al., "A 10ns Read and Write Non-Volatile Memory Array Using a Magnetic Tunnel Junction and FET Switch in Each Cell", ISSCC 2000, Digest of Technical Papers, Session 7, Paper TA 7.2, Feb. 8, 2000, (-4- pages).

M. Durlam, et al., "Nonvolatile RAM Based on Magnetic Tunnel Junction Elements", ISSCC 2000, Digest of Technical Papers, Session 7, Paper TA 7.3, Feb. 8, 2000, (-4- pages).

(Continued)

*Primary Examiner*—Thong Q. Le
(74) *Attorney, Agent, or Firm*—Oblon, Spivak, McClelland, Maier & Neustadt, P.C.

(57) ABSTRACT

A magnetic field H1 in the hard-axis direction and a magnetic field H2 in the easy-axis direction are caused to simultaneously act on a MTJ element having an ideal asteroid curve, thereby reversing the magnetizing direction of the storing layer of the MTJ element. When the actual asteroid curve shifts in the hard-axis direction by Ho, a corrected synthesized magnetic field ($\vec{H1}+\vec{H2}+\vec{Ho}$) is generated in write operation to reliably reverse the magnetizing direction. The corrected synthesized magnetic field can easily be generated by individually controlling a write word/bit line current on the basis of programmed setting data.

44 Claims, 36 Drawing Sheets

OTHER PUBLICATIONS

P. R. Gray, et al., John Wiley & Sons, Inc., pp. 270-279, "Analysis and Design of Analog Integrated Circuits", 1984 (submitting English version only: pp. 288-289, Second Edition).
U.S. Appl. No. 11/037,108, filed Jan. 19, 2005, Iwata.
U.S. Appl. No. 10/465,616, filed Jun. 20, 2003, Iwata et al.
U.S. Appl. No. 10/807,454, filed Mar. 24, 2004, Iwata et al.
U.S. Appl. No. 09/987,979, filed Nov. 16, 2001, Ito.
U.S. Appl. No. 10/025,753, filed Dec. 26, 2001, Asao et al.
U.S. Appl. No. 10/101,702, filed Mar. 21, 2002, Asao et al.
U.S. Appl. No. 10/160,184, filed Jun. 4, 2002, Iwata.
U.S. Appl. No. 10/162,605, filed Jun. 6, 2002, Iwata.
U.S. Appl. No. 10/180,024, filed Jun. 27, 2002, Iwata et al.
U.S. Appl. No. 10/369,886, filed Feb. 21, 2003, Iwata et al.

* cited by examiner

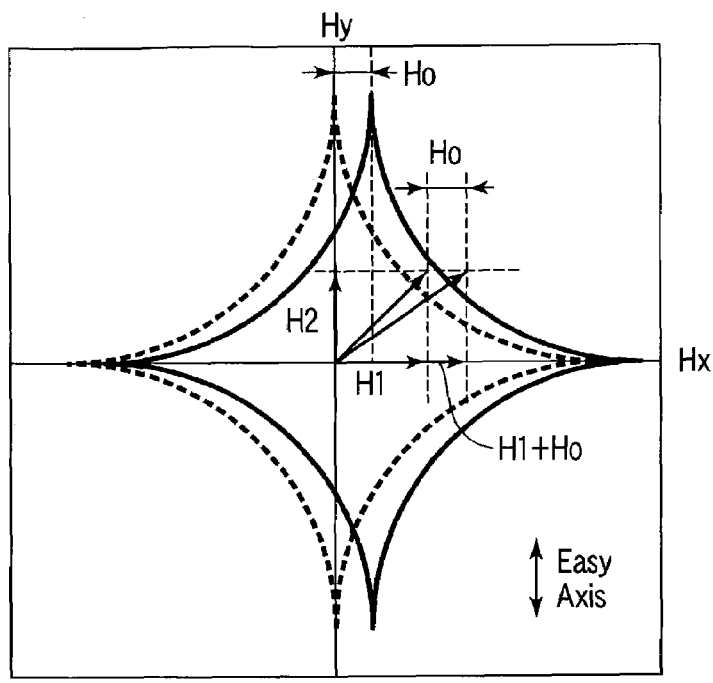
Asteroid curve
(when asteroid curve shifts in hard-axis direction by Ho)
F I G. 1
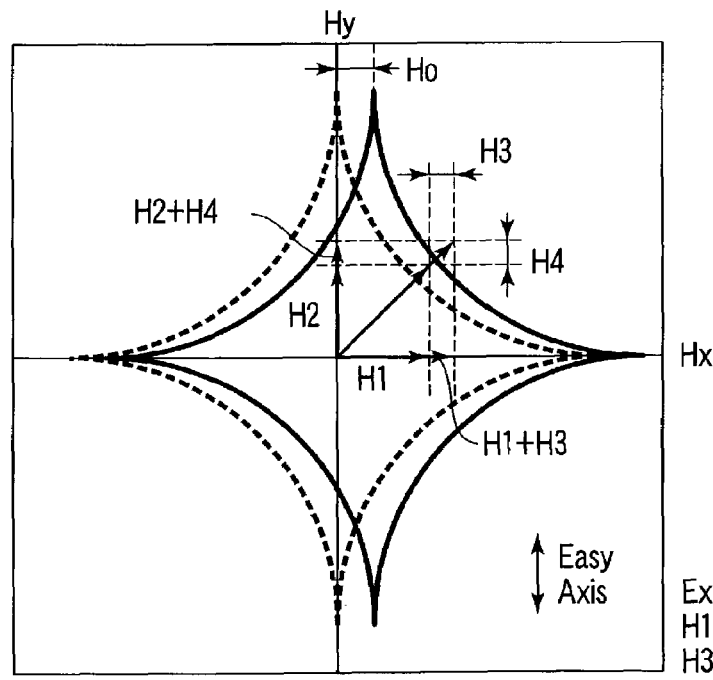
Example:
H1=H2
H3=H4=Ho/2
Asteroid curve
(when asteroid curve shifts in hard-axis direction by Ho)
F I G. 2

Asteroid curve
(when asteroid curve shifts in easy-axis direction by Ho)

Example:
H1=H2
H3=H4=Ho/2

Asteroid curve
(when asteroid curve shifts in easy-axis direction by Ho)

Asteroid curve
(when asteroid curve shifts in easy-axis direction by Ho)

Asteroid curve
(when asteroid curve shifts in easy-axis direction by Ho)

Example:
H1=H2
H3=H4=Ho/2

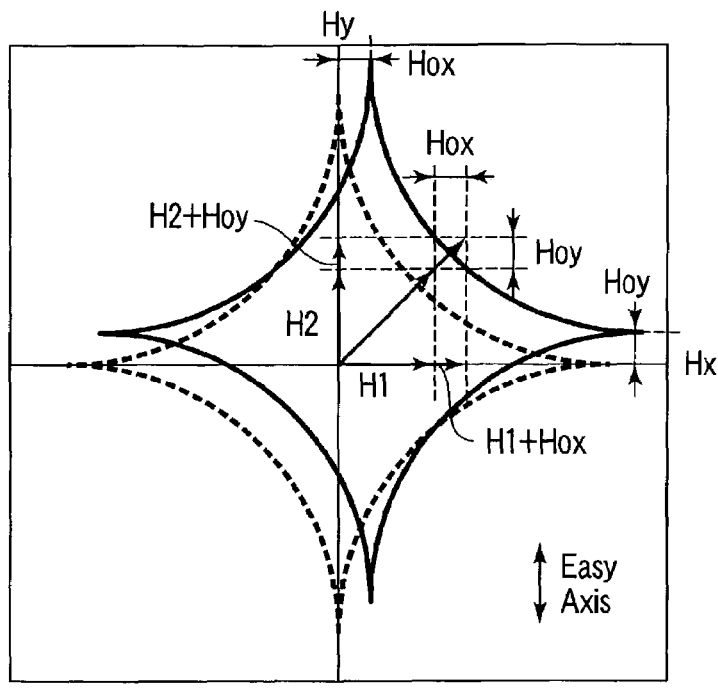
F I G. 9   Asteroid curve
(when asteroid curve shifts in hard-axis direction by Hox and in easy-axis direction by Hoy)
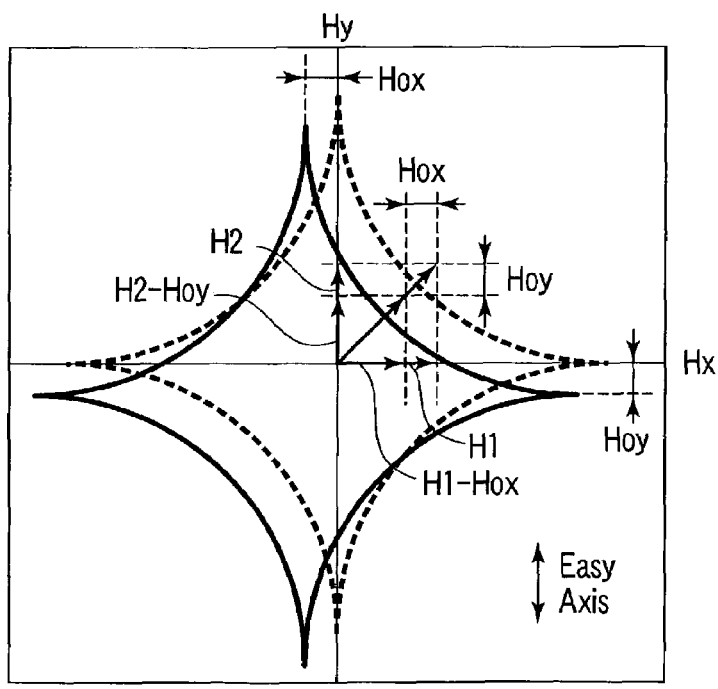
F I G. 10   Asteroid curve
(when asteroid curve shifts in hard-axis direction by Hox and in easy-axis direction by Hoy)

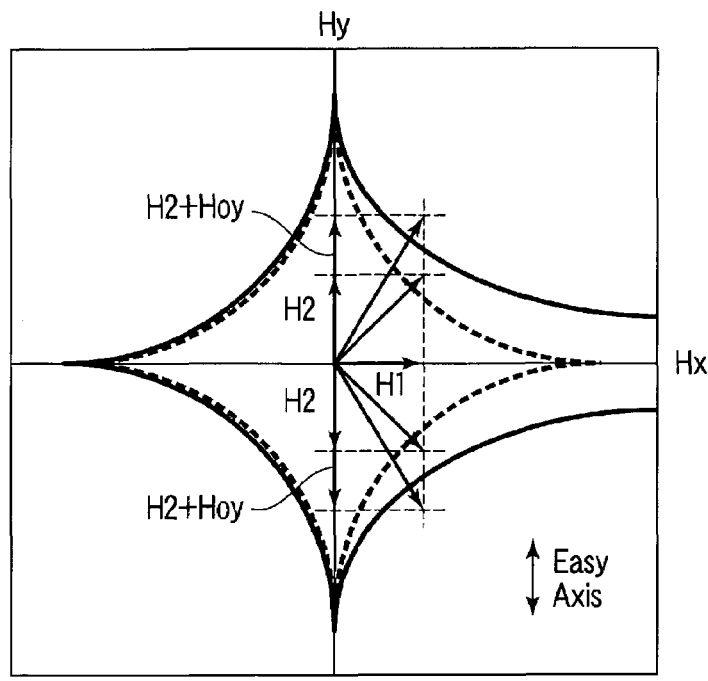
Asteroid curve
(when asteroid curve is asymmetrical)
F I G. 11
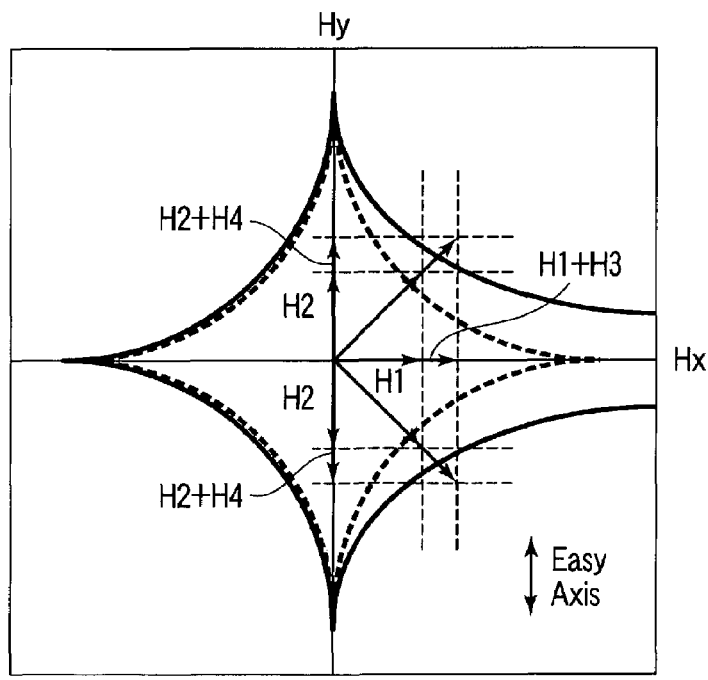
Asteroid curve
(when asteroid curve is asymmetrical)
F I G. 12

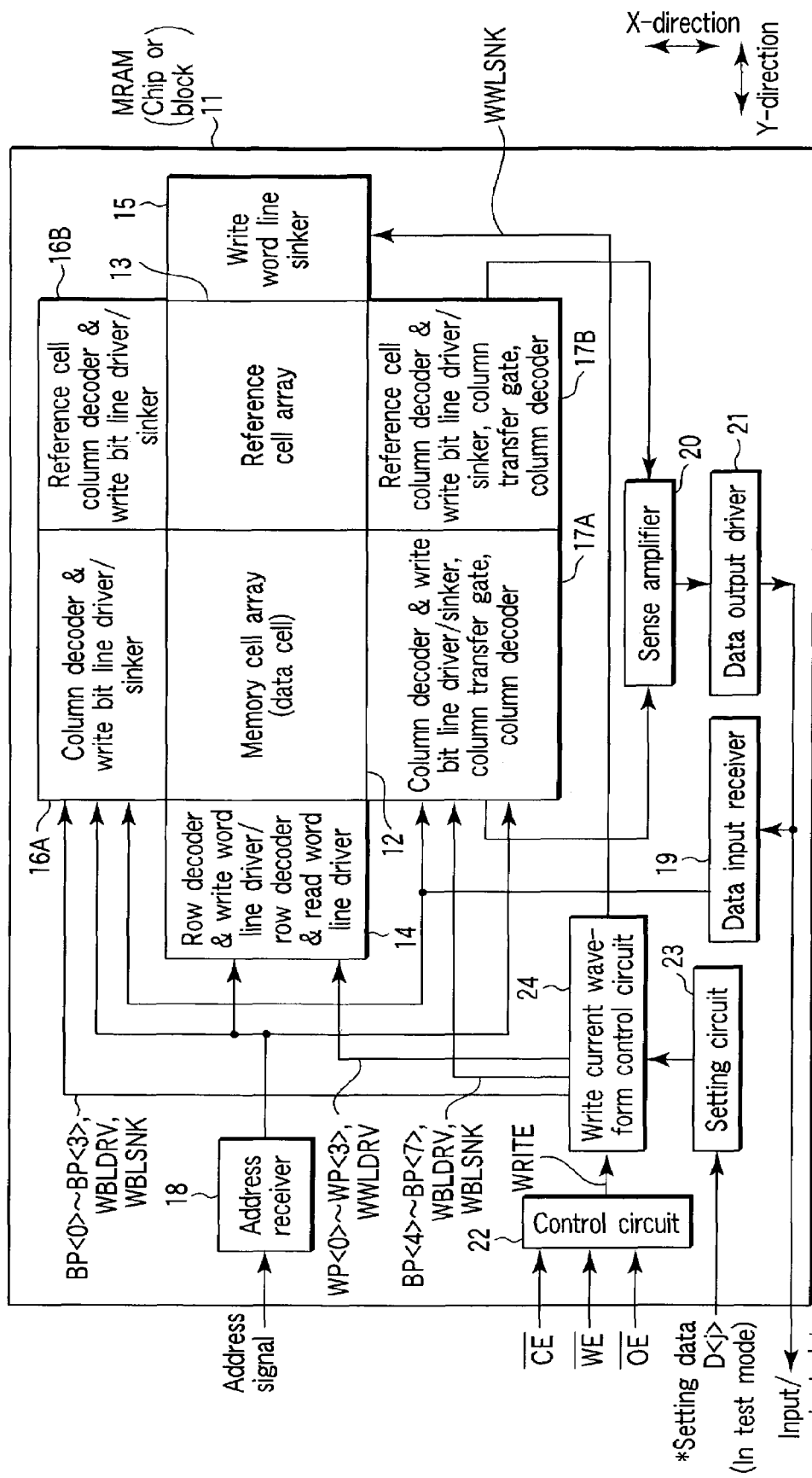
F I G. 16

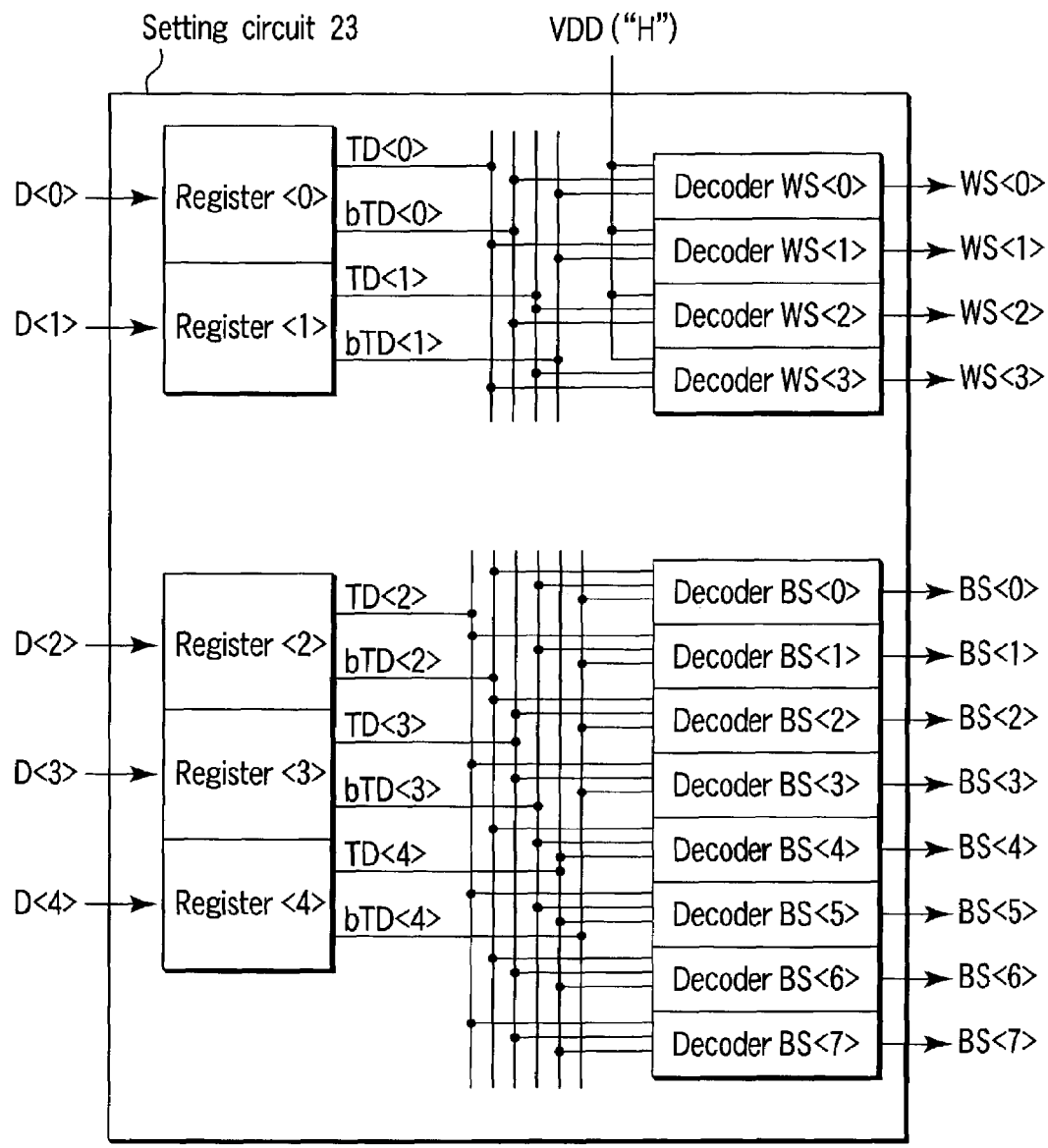
F I G. 20

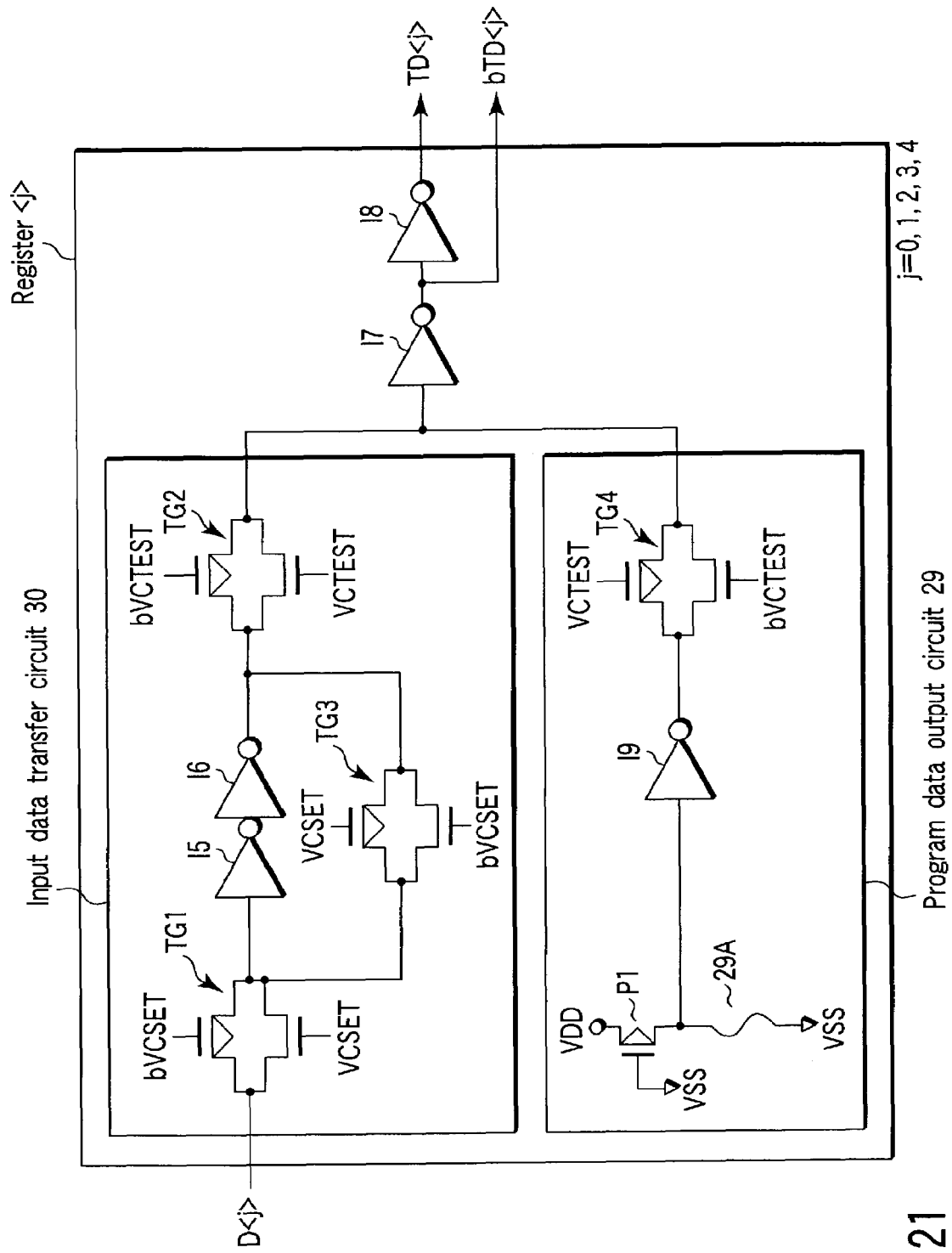
F I G. 21

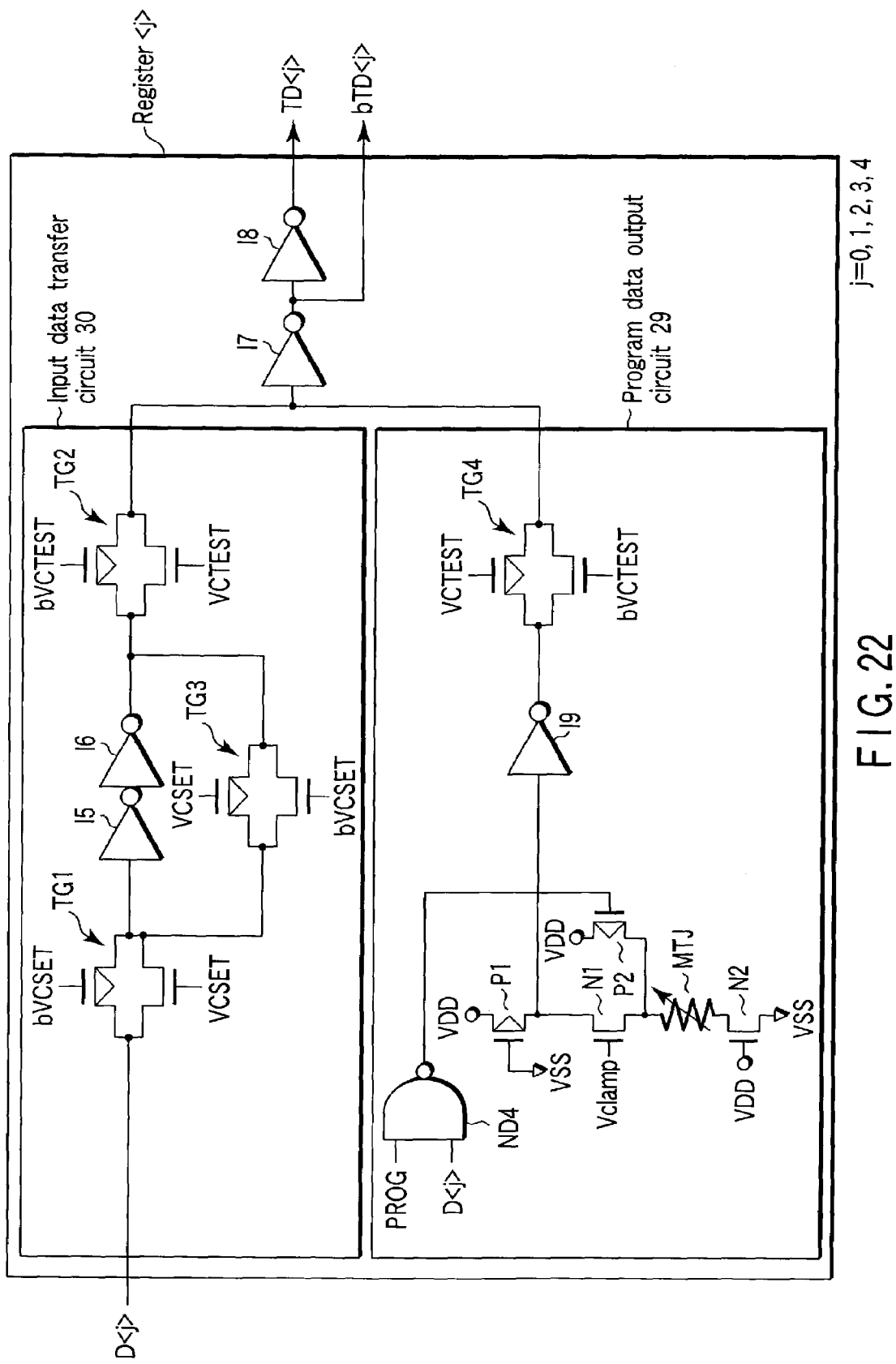
F I G. 22

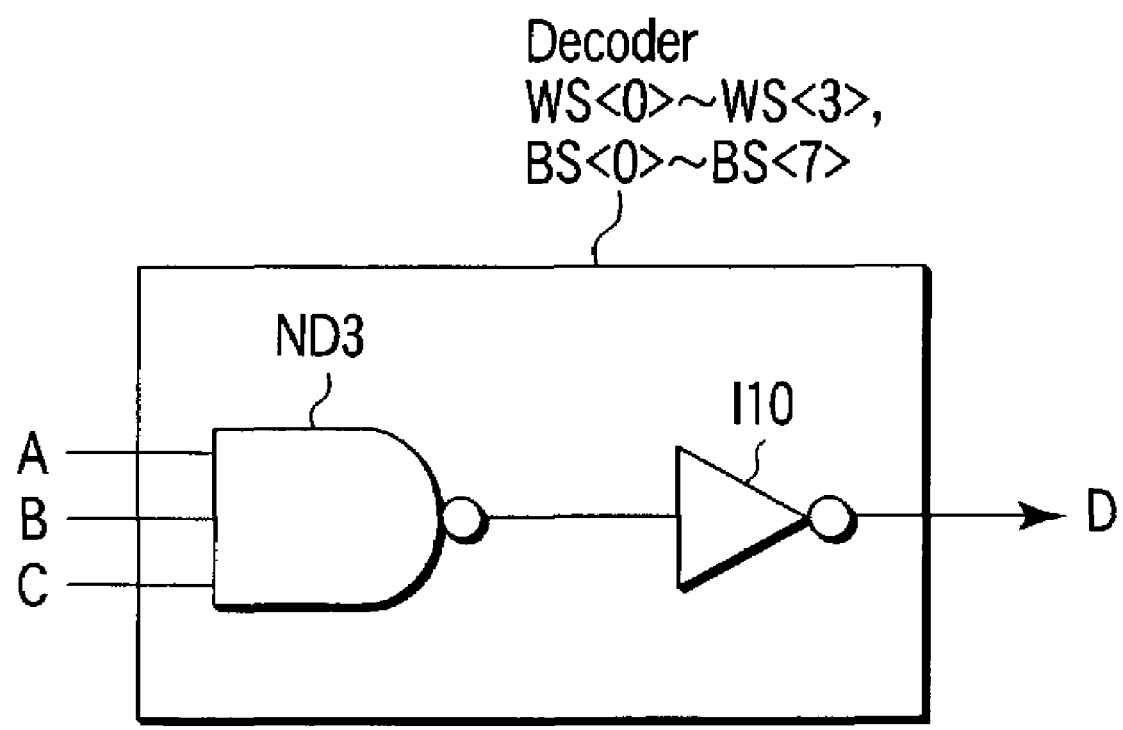
F I G. 24

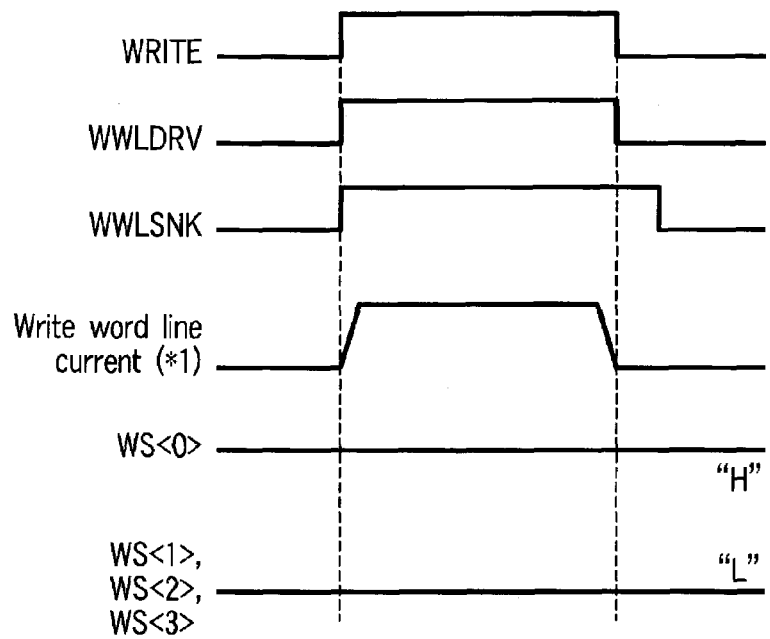
FIG. 25    (*1): Current value changes depending on values of WS<0> to WS<3>
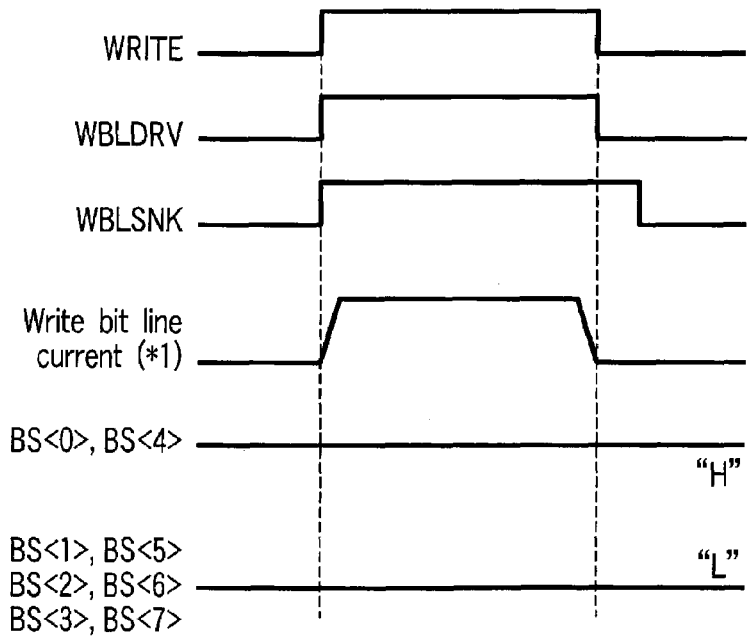
FIG. 26    (*1): Current value changes depending on values of BS<0> to BS<3> ("0"-write) or BS<4> to BS<7> ("1"-write)

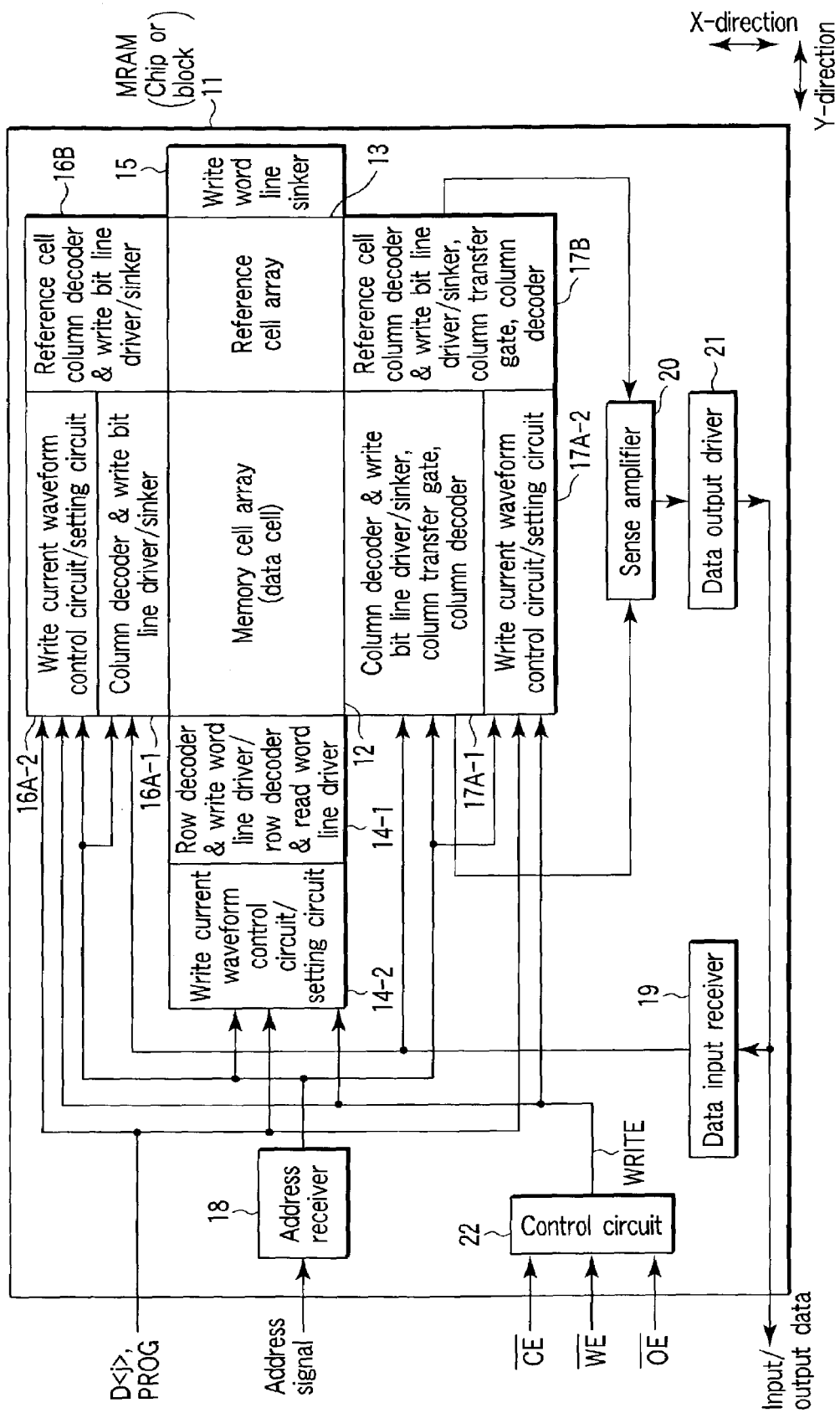
F I G. 27

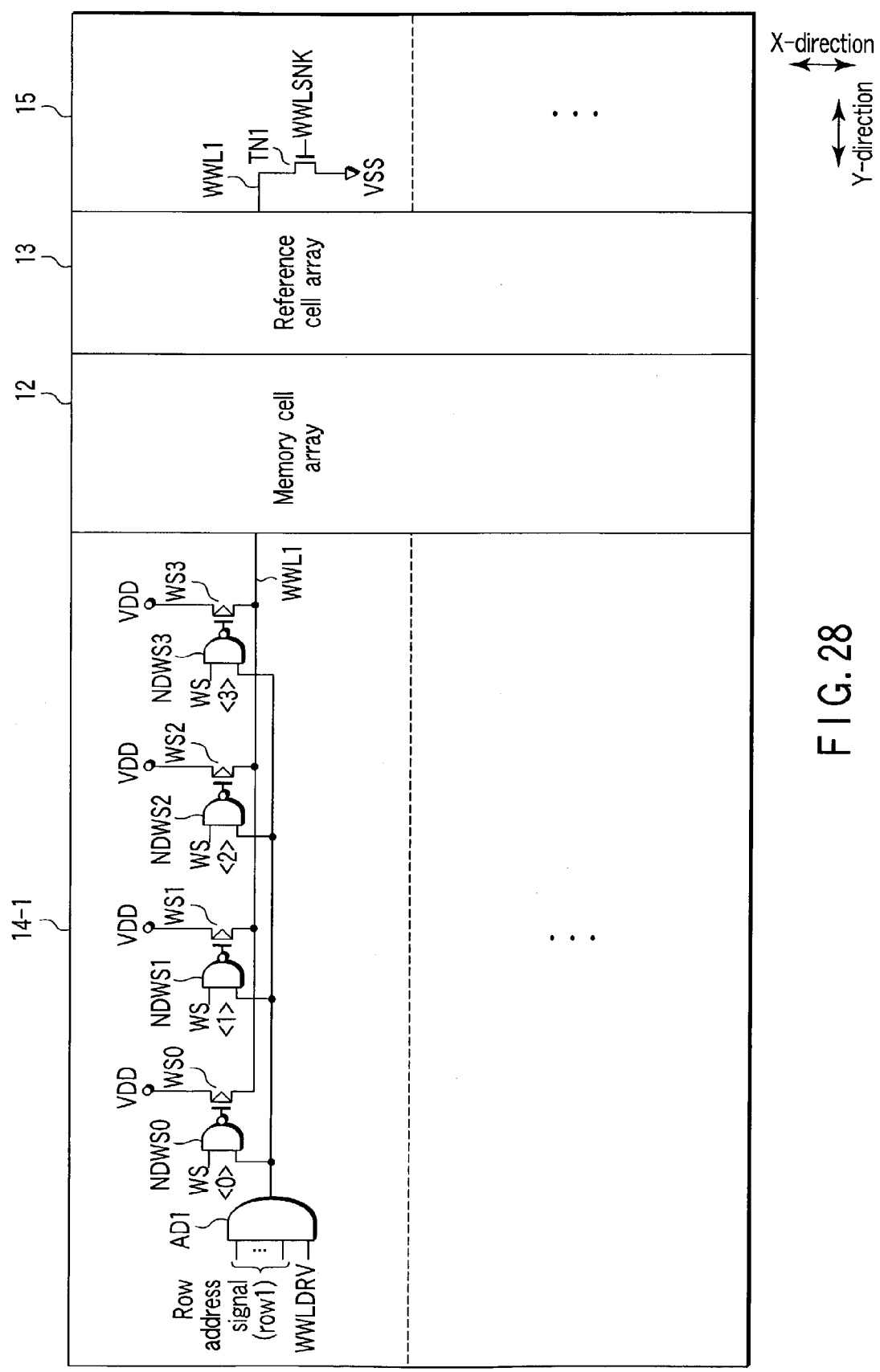
F I G. 28

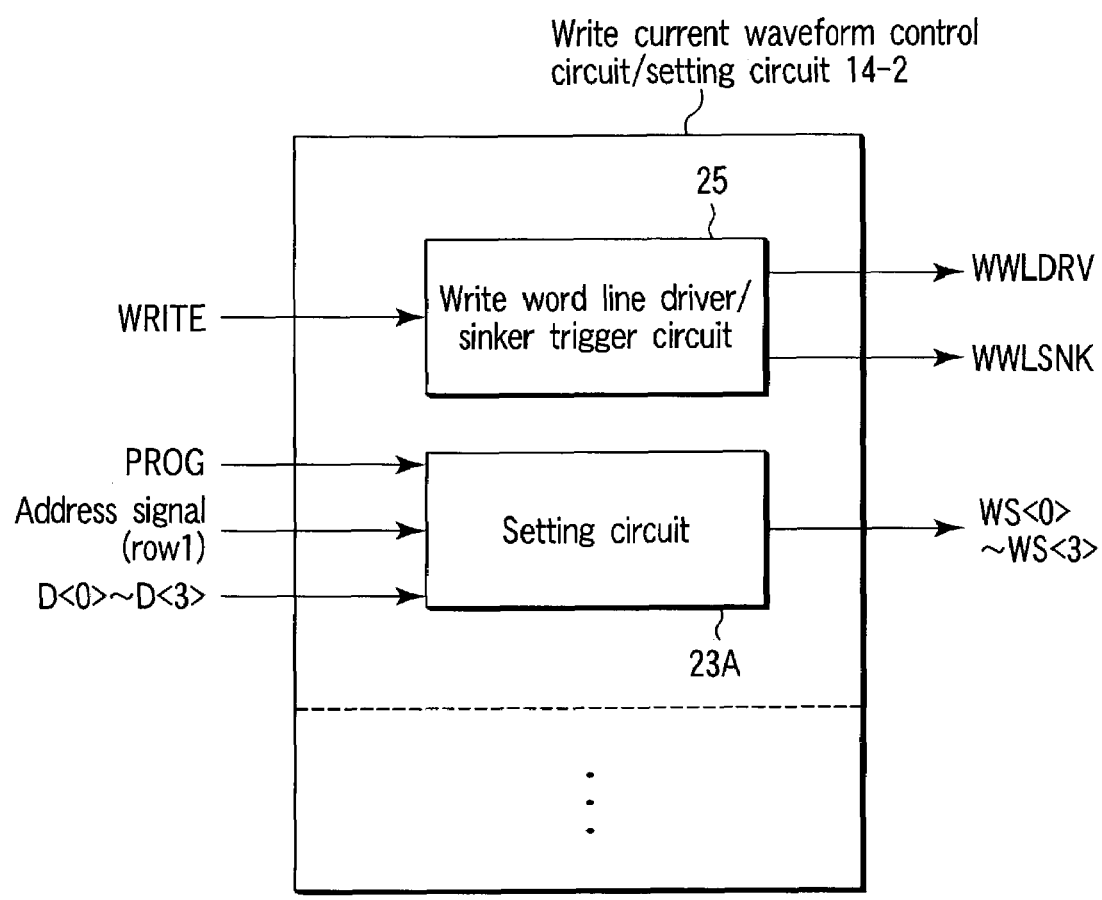
F I G. 30

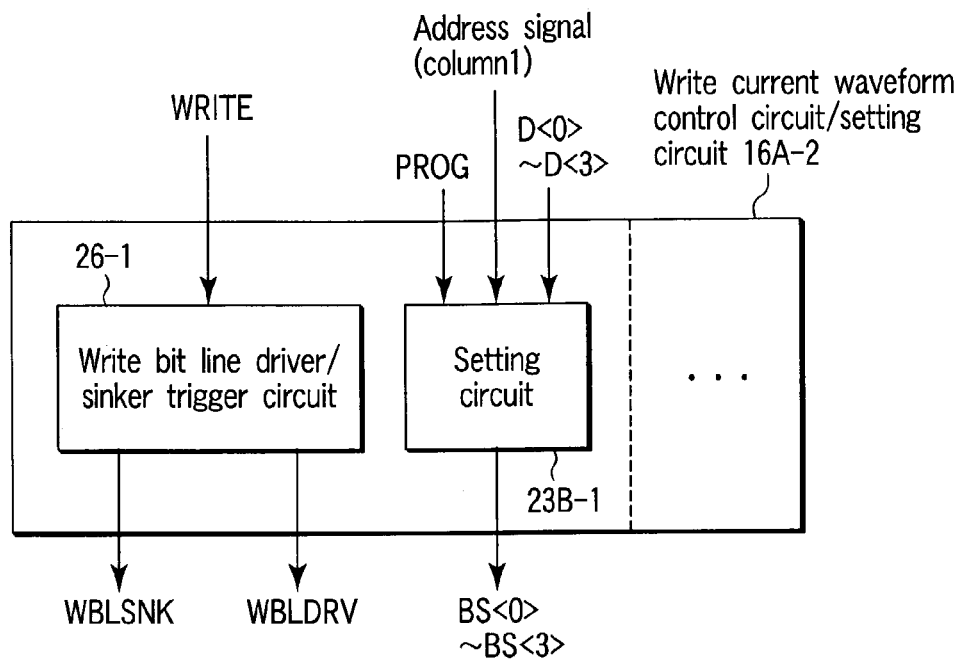
F I G. 31
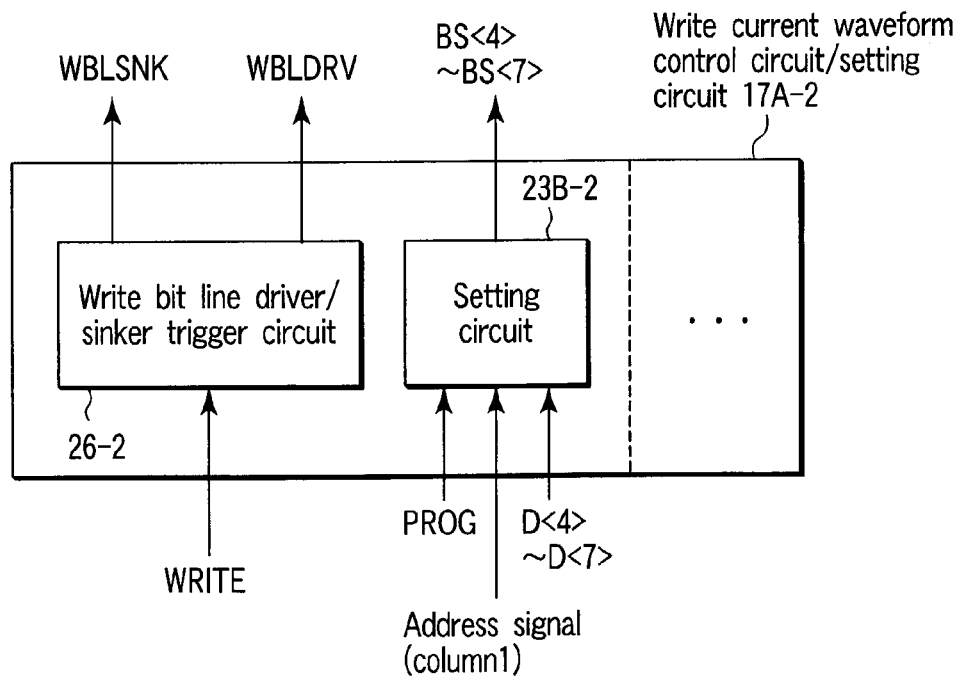
F I G. 32

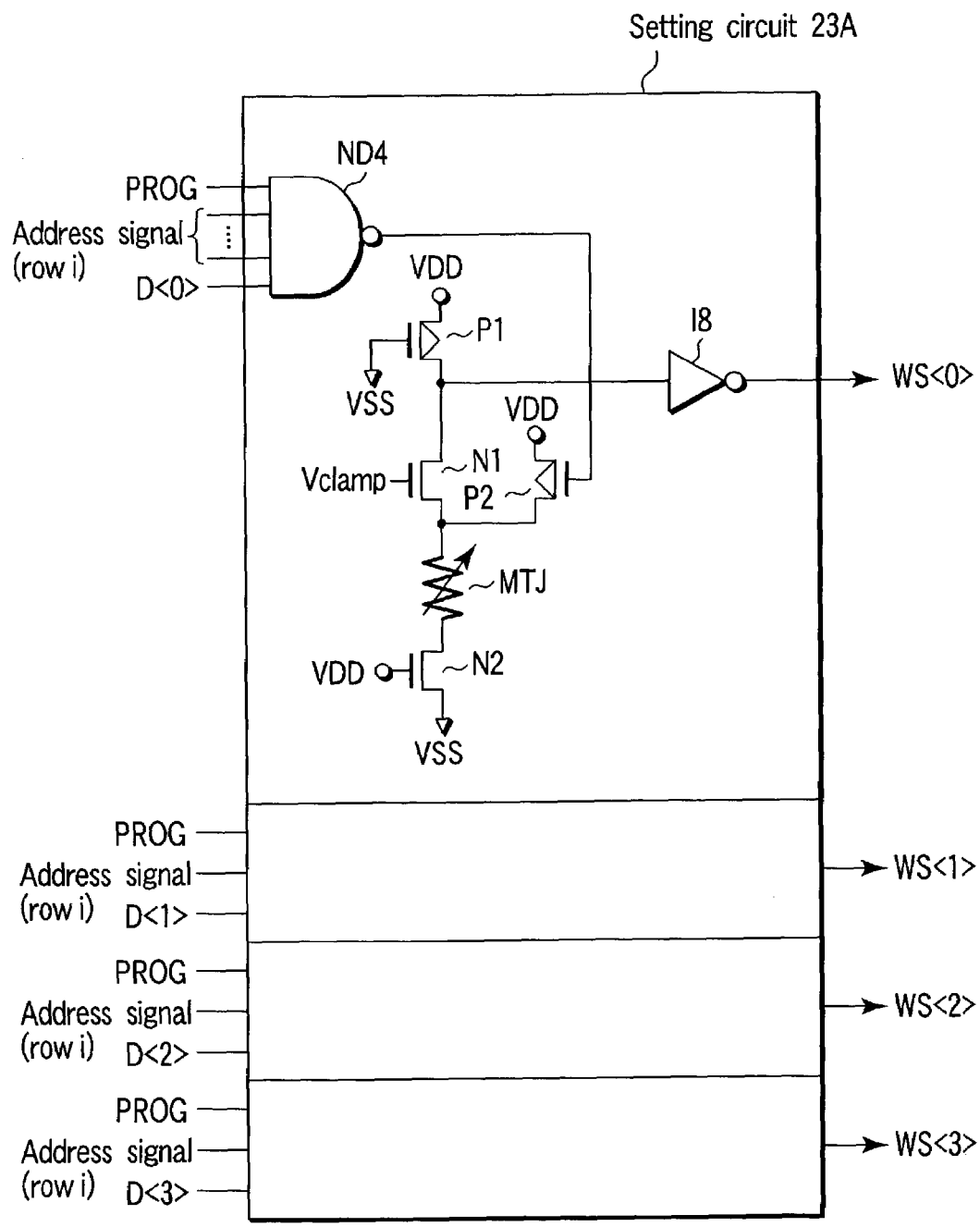
F I G. 36

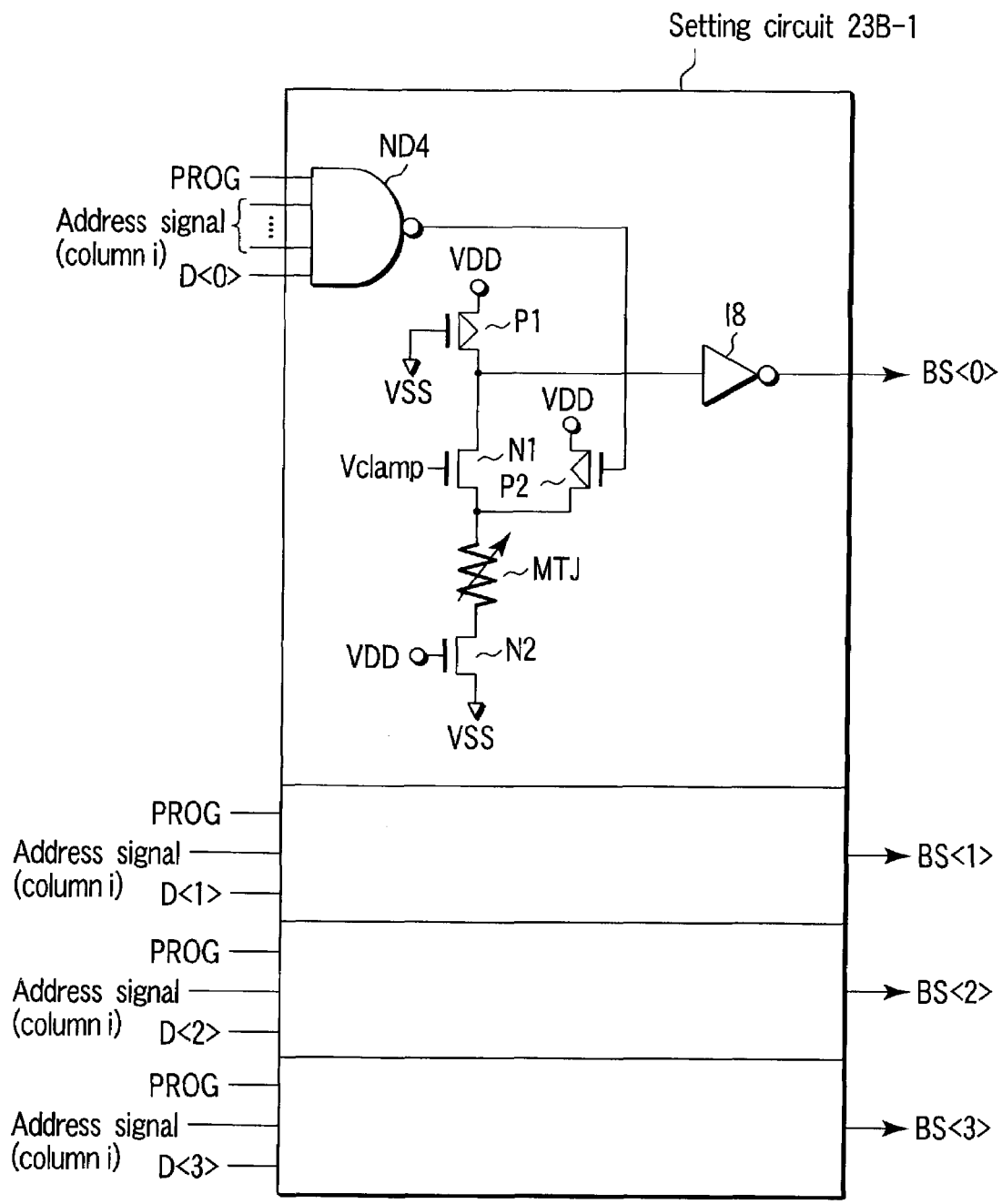
F I G. 37

*PROG is input when circuit in FIG. 22 is used

TMR (Tunnel Magneto-Resistance) element

TMR effect

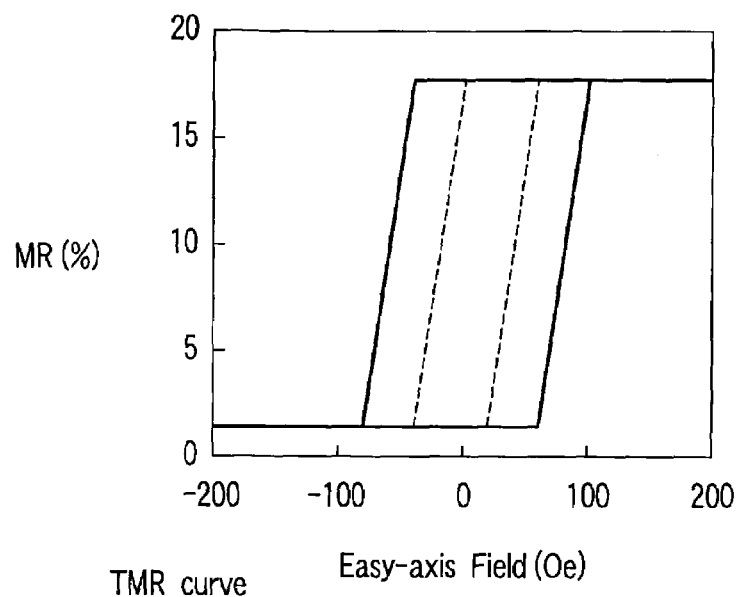
TMR curve
F I G. 44
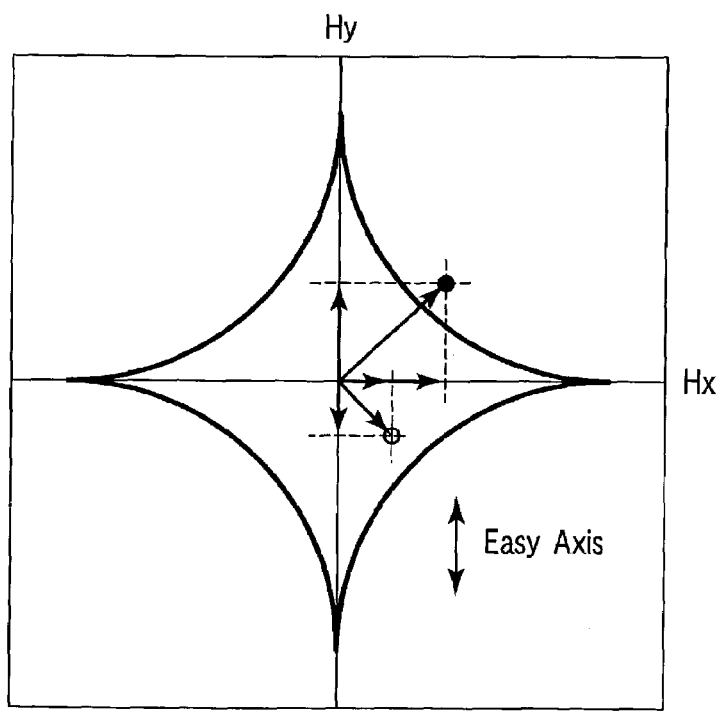
Asteroid curve
F I G. 45

Asteroid curve

Asteroid curve

MAGNETIC RANDOM ACCESS MEMORY

CROSS-REFERENCE TO RELATED APPLICATIONS

This application is based upon and claims the benefit of priority from the prior Japanese Patent Application No. 2002-179914, filed Jun. 20, 2002, the entire contents of which are incorporated herein by reference.

BACKGROUND OF THE INVENTION

1. Field of the Invention

The present invention relates to a magnetic random access memory (MRAM) which constitutes a memory cell using a MTJ (Magnetic Tunnel Junction) element which stores "1"- and "0"-information using a tunneling magnetoresistive effect.

2. Description of the Related Art

In recent years, many memories which store information by new principles have been proposed. One of them is a memory using the tunneling magneto-resistive (to be referred to as TMR hereinafter) effect proposed by Roy Scheuerlein et al. (e.g., "A 10 ns Read and Write Non-Volatile Memory Array Using a Magnetic Tunnel Junction and FET Switch in each Cell", ISSCC2000 Technical Digest, p. 128).

A magnetic random access memory stores "1"- and "0"-information using MTJ elements. A MTJ element has a structure in which an insulating layer (tunneling barrier) is sandwiched between two magnetic layers (ferromagnetic layers), as shown in FIG. 41. Information to be stored in the MTJ element is determined on the basis of whether the magnetizing directions of the two magnetic layers are parallel or antiparallel.

As shown in FIG. 42, "parallel" means that the two magnetic layers have the same magnetizing direction. "Antiparallel" means that the two magnetic layers have opposite magnetizing directions (the arrows indicate the magnetizing directions).

Normally, an antiferromagnetic layer is arranged on the side of one of the two magnetic layers. The antiferromagnetic layer serves as a member which fixes the magnetizing direction of one magnetic layer and changes only the magnetizing direction of the other magnetic layer, thereby easily rewriting information.

The magnetic layer whose magnetizing direction is fixed is called a fixed layer or pinning layer. The magnetic layer whose magnetizing direction can freely be changed is called a free layer or storing layer.

As shown in FIG. 42, when the magnetizing directions of the two magnetic layers are parallel, the tunneling resistance of the insulating layer (tunneling barrier) sandwiched between the two magnetic layers is minimized. This state is a "1"-state. When the magnetizing directions of the two magnetic layers are antiparallel, the tunneling resistance of the insulating layer (tunneling barrier) sandwiched between the two magnetic layers of the MTJ element is maximized. This state is a "0"-state.

The write operation principle for a MTJ element will be briefly described next with reference to FIG. 43.

MTJ elements are arranged at the intersections between write word lines and write bit lines which cross each other. A write is done by supplying a current to each of a write word line and a write bit line and setting the magnetizing direction of a MTJ element in the parallel or antiparallel state using a magnetic field generated by the currents flowing through the two lines.

For example, assume that the easy-axis (axis of easy magnetization or easy magnetization axis) of an MTJ element corresponds to the X-direction, a write word line runs in the X-direction, and a write bit line runs in the Y-direction perpendicular to the X-direction. In the write mode, a current that flows in one direction is supplied to the write word line, and a current that flows in one or the other direction is supplied to the write bit line in accordance with write data.

When a current that flows in one direction is supplied to the write bit line, the magnetizing direction of the MTJ element is set in the parallel state ("1"-state). On the other hand, when a current that flows in the other direction is supplied to the write bit line, the magnetizing direction of the MTJ element is set in the antiparallel state ("0"-state).

The magnetizing direction of the MTJ element changes in accordance with the following mechanism.

As is indicated by the TMR curve in FIG. 44, when a magnetic field Hy is applied in the longitudinal (easy-axis) direction of a MTJ element, the resistance value of the MTJ element changes by, e.g., about 17%. The change ratio, i.e., the ratio of the resistance difference between the antiparallel state and the parallel state and the resistance of the parallel state is called "MR ratio".

Note that the MR ratio changes depending on the structure, composition and morphology of the MTJ element. Currently, even a MTJ element with an MR ratio of about 50% is available.

The synthesized magnetic field of the magnetic field Hy in the easy-axis direction and a magnetic field Hx in the hard-axis (axis of hard magnetization or hard magnetization axis) direction is applied to the MTJ element. As indicated by the solid line in FIG. 45, the intensity of the magnetic field Hy in the easy-axis direction, which is necessary for changing the resistance value of the MTJ element, changes depending on the intensity of the magnetic field Hx in the hard-axis direction. When this phenomenon is used, data can be written in only a MTJ element that is present at the intersection between a selected write word line and a selected data line in memory cells arranged in an array.

This mechanism will be described in more detail using the asteroid curve shown in FIG. 45.

A MTJ element has an asteroid curve indicated by, e.g., the solid line in FIG. 45. The direction of the magnetic field Hx in the write mode is constant. Write data is determined by the direction of the magnetic field Hy.

For example, when the free layer of the MTJ element is magnetized downward in FIG. 45, and a point that indicates the intensity of the synthesized magnetic field of the magnetic field (upward) Hy in the easy-axis direction and the magnetic field Hx in the hard-axis direction is present outside (e.g., at the position indicated by the filled circle) the asteroid curve (solid line), the magnetizing direction of the free layer of the MTJ element can be reversed (downward→upward).

Conversely, for example, when the free layer of the MTJ element is magnetized upward in FIG. 45, and a point that indicates the intensity of the synthesized magnetic field of the magnetic field (downward) Hy in the easy-axis direction and the magnetic field Hx in the hard-axis direction is present inside (e.g., at the position indicated by the open circle) the asteroid curve (solid line), the magnetizing direction of the free layer of the MTJ element cannot be reversed.

In other words, when the intensity of the magnetic field Hy in the easy-axis direction and that of the magnetic field Hx in the hard-axis direction are changed to change the position of the intensity of the synthesized magnetic field in the Hx–Hy plane, the data write for the MTJ element can be controlled.

A read can easily be performed by supplying a current to a selected MTJ element and detecting the resistance value of the MTJ element.

For example, switch elements are connected in series to the MTJ elements. Only the switch element connected to a selected read word line is turned on to form a current path. Consequently, a current flows to only the selected MTJ element. Hence, data of the MTJ element can be read.

In the magnetic random access memory, as described above, the data write is executed by, e.g., supplying write currents to a write word line and a write bit line and causing a thus generated synthesized magnetic field to act on a MTJ element.

In the write operation, it is necessary to always accurately write data in a MTJ element. That is, stable write characteristics are necessary. Stabilizing the write characteristics is especially important when data (the state of a MTJ element) stored in a MTJ element and write data are different. In such a case, the magnetized state (magnetizing direction) of the storing layer of the MTJ element must be stably inverted.

As shown in FIG. 45, when the asteroid curve has a symmetrical shape with respect to the X- and Y-axes, the magnetizing direction of the free layer (storing layer) of the MTJ element can be reversed by a predetermined synthesized magnetic field necessary for magnetization inversion independently of the reversing direction (upward or downward).

However, it is impossible in reality to cause, e.g., all chips (formed from a single or different wafers) manufactured, all memory cell arrays (blocks) in one chip, or all MTJ elements in a memory cell array to have the same MTJ element asteroid curve, i.e., a symmetrical shape with respect to the X- and Y-axes.

In fact, chips, memory cell arrays, word lines/bit lines, or MTJ elements have different MTJ element asteroid curves (asymmetrical shapes with respect to the X- and Y-axes), as shown in, e.g., FIGS. 46 to 49.

In this case, if it is assumed that the synthesized magnetic field Hx+Hy to be used for magnetization inversion has a predetermined intensity, the intensity of the synthesized magnetic field Hx+Hy may sometimes not be able to reach outside the asteroid curve depending on the magnetization reversing direction, and the magnetizing direction of the MTJ element cannot be reversed.

The asteroid curve of the MTJ element becomes asymmetrical with respect to the X- and Y-axes because of various variations in the manufacturing process. Detailed examples are as follows.

① Shape of TMR Element

Although all MTJ elements are designed to have the same shape, the MTJ elements have actually a subtle shape difference due to manufacturing variations.

The shape of a MTJ element determines the magnitude of a magnetic domain or the intensity of an antimagnetic field (a magnetic field which is generated in a magnetic material and has a direction reverse to the external magnetic field). For this reason, that the MTJ elements have different shapes means that they have different magnetic domain magnitudes or antimagnetic field intensities. That is, the magnetic field intensity necessary for reversing the magnetizing direction of the MTJ element changes between the MTJ elements.

Hence, the asteroid curve of the MTJ element becomes asymmetrical with respect to the X- and Y-axes.

② Thickness/Composition of Magnetic Layer of TMR Element

When the thickness of the magnetic layer (free layer and fixed layer) of a MTJ element increases, the magnetic field intensity necessary for reversing the magnetizing direction also increases. That is, a variation in magnetic layer thickness between MTJ elements makes the asteroid curve of a MTJ element asymmetrical with respect to the X- and Y-axes.

As a magnetic material for the free layer (storing layer) of a MTJ element, an alloy made of iron group elements (Fe, Ni, Co, and the like) is generally used. However, an alloy can have a variation in composition.

If an alloy that forms the free layer of each MTJ element has a variation in composition, saturation magnetization changes between the MTJ elements. In addition, an alloy that forms the free layer of each MTJ element generally has a polycrystalline structure. However, if the magnetic anisotropy of the crystal axis increases, it becomes very difficult to make the asteroid curves of all MTJ elements symmetrical with respect to the X- and Y-axes.

Even if the asteroid curves of all MTJ elements are same and symmetrical with respect to the X- and Y-axes, the write operation may be impossible when the positional relationship between a write line and a MTJ element shifts. That is, even when a necessary synthesized magnetic field is applied to the MTJ element, the magnetizing direction of the free layer of the MTJ element may not reverse.

More specifically, even if the minimum value of a write current that generates a magnetic field necessary for reversing the magnetizing direction is obtained at the time of design on the basis of the ideal MTJ element shape and the ideal positional relationship between the write line and the MTJ element, the write operation may be impossible when the positional relationship between the write line and the MTJ element shifts due to mask misalignment at the time of manufacturing.

As described above, in the conventional magnetic random access memory, some MTJ elements have asteroid curves asymmetrical with respect to the X- and Y-axes because of a variation in shape between the MTJ elements or a variation in thickness/composition between the MTJ elements at the time of manufacturing. Even when the asteroid curve is symmetrical with respect to the X- and Y-axes, the write operation may be impossible when the positional relationship between the write line and the MTJ element shifts. Such phenomena often occur at the early stage of development of magnetic random access memories.

It is therefore necessary to develop an inexpensive reliable magnetic random access memory with a high yield, which can eliminate the phenomenon of disabled write operation due to the variation in write characteristics between MTJ elements for each chip, each memory cell array, each word line/bit line, or each MTJ element by controlling the magnitude of the write current (the intensity of the write magnetic field).

BRIEF SUMMARY OF THE INVENTION

A writing method of a magnetic random access memory according to an aspect of the present invention comprises a series of steps of testing write characteristics of a magnetoresistive element having a hard-axis and an easy-axis, independently determining a value of a first write current which generates a magnetic field in the hard-axis direction and a value of a second write current which generates a magnetic field in the easy-axis direction on the basis of the write characteristics, which is necessary for magnetization inversion of the magnetoresistive element, programming the values of the first and second write currents as setting data, and generating the first and second write currents on the basis of the setting data to write data in the magnetoresistive element.

A magnetic random access memory according to an aspect of the present invention comprises first and second write lines which cross each other, a magnetoresistive element which is arranged at an intersection between the first and second write lines, a first driver which supplies a first write current to the first write line, a second driver which supplies a second write current to the second write line, and a setting circuit in which first setting data to control a current waveform of the first write current and second setting data to control a current waveform of the second write current are registered.

BRIEF DESCRIPTION OF THE SEVERAL VIEWS OF THE DRAWING

FIG. 1 is a view showing Example 1 of Write Principle 1 according to the present invention;

FIG. 2 is a view showing Example 2 of Write Principle 1 according to the present invention;

FIG. 9 is a view showing Example 1 of Write Principle 3 according to the present invention;

FIG. 10 is a view showing Example 2 of Write Principle 3 according to the present invention;

FIG. 11 is a view showing Example 1 of Write Principle 4 according to the present invention;

FIG. 12 is a view showing Example 2 of Write Principle 4 according to the present invention;

FIG. 16 is a view showing the overall arrangement of an MRAM according to an embodiment of the present invention;

FIG. 20 is a view showing an example of a setting circuit;

FIG. 21 is a view showing an example of a register in the setting circuit;

FIG. 22 is a view showing another example of the register in the setting circuit;

FIG. 24 is a view showing an example of a decoder in the setting circuit;

FIG. 25 is a waveform chart showing an example of the current waveform of a write word line current;

FIG. 26 is a waveform chart showing an example of the current waveform of a write bit line current;

FIG. 27 is a view showing the overall arrangement of an MRAM according to another example of the present invention;

FIG. 28 is a view showing an example of a write word line driver/sinker;

FIG. 30 is a view showing an example of a write current waveform control circuit/setting circuit;

FIG. 31 is a view showing another example of a write current waveform control circuit/setting circuit;

FIG. 32 is a view showing still another example of a write current waveform control circuit/setting circuit;

FIG. 36 is a view showing an example of the setting circuit;

FIG. 37 is a view showing another example of the setting circuit;

FIG. 44 is a view showing a TMR curve;

FIG. 45 is a view showing an asteroid curve;

DETAILED DESCRIPTION OF THE INVENTION

Figure 3:
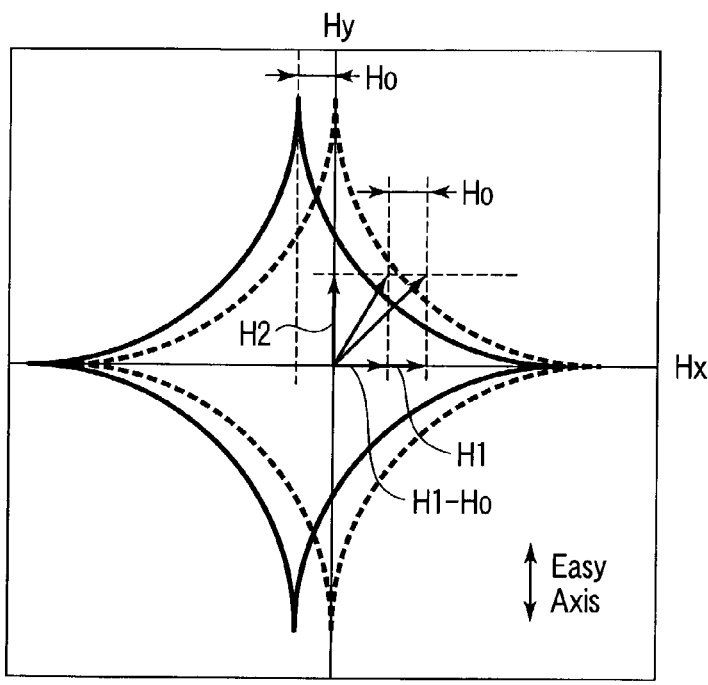
FIG. 3 is a view showing Example 3 of Write Principle 1 according to the present invention.

A magnetic random access memory according to an embodiment of the present invention will be described below in detail with reference to the accompanying drawing.

1. Write Principle (Method of Applying Magnetic Field to TMR Element)

The write principle for the magnetic random access memory according to the embodiment of the present invention, i.e., a method of applying magnetic fields Hx and Hy to a MTJ element (MTJ) will be described first.

In the write principle according to the embodiment the present invention, the pattern of the shift (asymmetry with respect to the X- or Y-axis) of the asteroid curve of a MTJ element is recognized. Then, the magnitude of a write current to be supplied to a write word/bit line (i.e., the intensities of the magnetic fields Hx and Hy) is determined in accordance with the pattern of shift of the asteroid curve (write characteristics).

(1) Principle 1

The write principle of this example is based on the premise that the asteroid curve of a MTJ element shifts in the hard-axis direction.

① EXAMPLE 1

As shown in FIG. 1, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

Note that the ideal asteroid curve means an asteroid curve having a symmetrical shape with respect to the X- and Y-axes (this also applies to all examples to be described below).

In Example 1, assume that the asteroid curve (solid line) of a MTJ element of an actually manufactured magnetic random access memory shifts to the same side as the direction of the magnetic field in the hard-axis direction with respect to the ideal asteroid curve, as shown in FIG. 1. The shift amount (offset amount) which is converted into a magnetic field intensity is Ho.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse. As a consequence, the write operation is impossible.

To prevent this, in Example 1, the offset amount Ho generated due to the shift of the asteroid curve is added to the magnetic field H1 in the hard-axis direction in the write mode. A magnetic field $(\vec{H1}+\vec{Ho})$ is caused to act on the MTJ element as the magnetic field in the hard-axis direction.

In this case, the point that indicates the intensity of the synthesized magnetic field $(\vec{H1}+\vec{Ho})+\vec{H2}$ is located outside the actual asteroid curve (solid line). For this reason, the magnetizing direction of the free layer (storing layer) of the MTJ element can be reversed.

The magnetic field $(\vec{H1}+\vec{Ho})$ in the hard-axis direction can easily be generated by increasing, by a predetermined amount, the value of the write current (having a predetermine direction) to be supplied to a write word line that runs in the easy-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), the intensity of the magnetic field in the shift direction (hard-axis direction in this example) is controlled to cancel the offset between the ideal asteroid curve and the actual asteroid curve.

As a result, the disabled write operation in the write mode can be avoided, and the reliability of the write operation can be increased.

② EXAMPLE 2

In Example 1, only the intensity of the magnetic field in the direction (hard-axis direction) of the shift of the asteroid curve is controlled in accordance with the offset amount. In Example 2, a technique will be proposed in which each of the intensities of the magnetic fields in the hard- and easy-axis directions is controlled in accordance with the offset amount independently of the direction (hard-axis direction) of the shift of the asteroid curve, thereby increasing the reliability of write operation.

As shown in FIG. 2, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 2, assume that the asteroid curve (solid line) of a MTJ element of an actually manufactured magnetic random access memory shifts to the same side as the direction of the magnetic field in the hard-axis direction with respect to the ideal asteroid curve, as shown in FIG. 2. The shift amount (offset amount) which is converted into a magnetic field intensity is Ho.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse, and the write operation is impossible.

To prevent this, in Example 2, part H3 (e.g., Ho/2) of the offset amount Ho generated due to the shift of the asteroid curve is added to the magnetic field H1 in the hard-axis direction in the write mode. A magnetic field $(\vec{H1}+\vec{H3})$ is caused to act on the MTJ element as the magnetic field in the hard-axis direction. In addition, part H4 (e.g., Ho/2) of the offset amount Ho is added to the magnetic field H2 in the easy-axis direction. A magnetic field $(\vec{H2}+\vec{H4})$ is caused to act on the MTJ element as the magnetic field in the easy-axis direction.

In this case, the point that indicates the intensity of the synthesized magnetic field $(\vec{H1}+\vec{H3})+(\vec{H2}+\vec{H4})$ is located outside the actual asteroid curve (solid line). For this reason, the magnetizing direction of the free layer (storing layer) of the MTJ element can be reversed.

The magnetic field $(\vec{H1}+\vec{H3})$ in the hard-axis direction can easily be generated by increasing by a predetermined amount, the value of the write current (having a predetermine direction) to be supplied to a write word line that runs in the easy-axis direction.

The magnetic field ($\vec{H2}+\vec{H4}$) in the easy-axis direction can easily be generated by increasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), each of the intensities of the magnetic fields in the hard- and easy-axis directions is controlled independently of the shift direction (hard-axis direction in this example), thereby increasing the reliability of the write operation.

Hence, the risk of write errors for unselected MTJ elements arranged along a selected write word line can be reduced.

More specifically, in the memory cell array of a magnetic random access memory, not only a selected MTJ element but also a plurality of unselected MTJ elements are arranged along a selected write word line.

In this case, if only the write current to be supplied to the write word line is increased to cancel the offset between the ideal asteroid curve and the actual asteroid curve, the increase amount is large. This may cause write errors for the unselected MTJ elements arranged along the selected write word line.

When each of the intensities of the magnetic fields in the hard- and easy-axis directions is controlled independently of the shift direction (hard-axis direction) of the asteroid curve, the increase amount of the write current to be supplied to the write word line can be decreased by an amount corresponding to the increase in write current to be supplied to the write bit line.

That is, the risk of write errors for the unselected MTJ elements arranged along the selected write word line can be reduced.

To reduce the risk of write errors for unselected MTJ elements arranged along a selected write word line and the risk of write errors for unselected MTJ elements arranged along a selected write bit line as much as possible, H3=H4 (e.g., H1=H2, and H3=H4=Ho/2) is preferably satisfied.

③ EXAMPLE 3

Example 3 is different from Example 1 in that the asteroid curve of a MTJ element shifts to the opposite side of the direction of the magnetic field in the hard-axis direction with respect to an ideal asteroid curve.

As shown in FIG. 3, a synthesized magnetic field necessary for magnetization inversion, which is determined on the basis of an ideal asteroid curve (broken line), is defined as $\vec{H1}+\vec{H1}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 3, assume that the asteroid curve (solid line) of a MTJ element of an actually manufactured magnetic random access memory shifts to the opposite side of the direction of the magnetic field in the hard-axis direction with respect to the ideal asteroid curve, as shown in FIG. 3. The shift amount (offset amount) which is converted into a magnetic field intensity is Ho.

In this case, the point that indicates the intensity of the synthesized magnetic field $\vec{H1}+\vec{H2}$ is largely separated outward from the actual asteroid curve (solid line). That is, since the value of the synthesized magnetic field $\vec{H1}+\vec{H2}$ necessary for reversing the magnetizing direction of the free layer (storing layer) of the MTJ element is too large, write errors for unselected MTJ elements may occur.

To prevent this, in Example 3, the offset amount Ho generated due to the shift of the asteroid curve is subtracted from the magnetic field H1 in the hard-axis direction in the write mode. A magnetic field ($\vec{H1}-\vec{Ho}$) is caused to act on the MTJ element as the magnetic field in the hard-axis direction.

In this case, the point that indicates the intensity of the synthesized magnetic field ($\vec{H1}-\vec{Ho}$)+$\vec{H2}$ is located near and outside the actual asteroid curve (solid line). For this reason, only the magnetizing direction of the free layer (storing layer) of the selected MTJ element can be reversed without any write errors for unselected MTJ elements.

The magnetic field ($\vec{H1}-\vec{Ho}$) in the hard-axis direction can easily be generated by decreasing, by a predetermined amount, the value of the write current (having a predetermine direction) to be supplied to a write word line that runs in the easy-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), the intensity of the magnetic field in the shift direction (hard-axis direction in this example) is controlled to cancel the offset between the ideal asteroid curve and the actual asteroid curve.

As a result, the disabled write operation in the write mode can be avoided, and the reliability of the write operation can be increased.

④ EXAMPLE 4

Like Examples 1 and 3, Example 4 will be proposed in correspondence with Example 2.

In Example 4, each of the intensities of the magnetic fields in the hard- and easy-axis directions is controlled in accordance with the offset amount independently of the direction (hard-axis direction) of the shift of an asteroid curve, thereby increasing the reliability of write operation.

Figure 4:
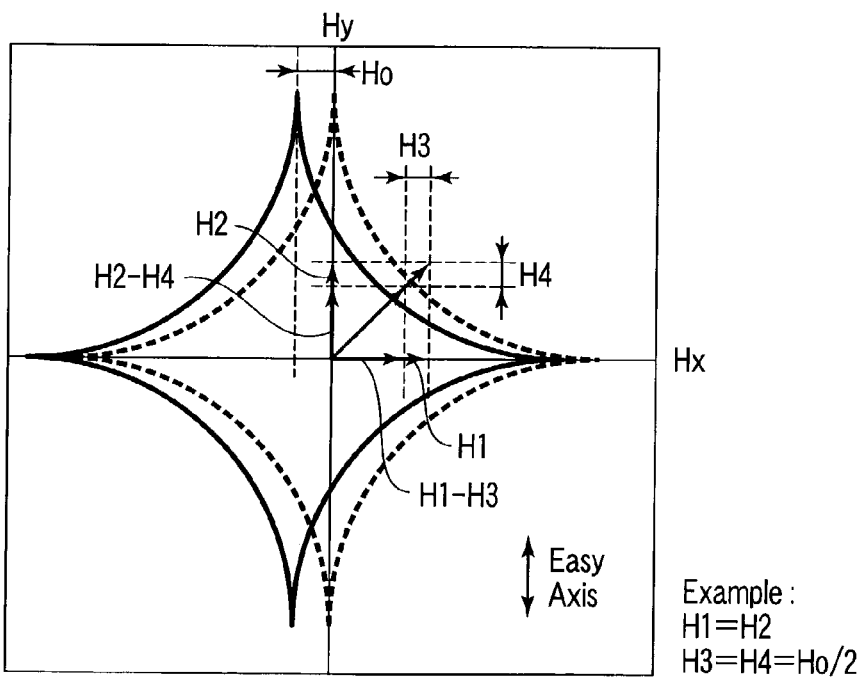
FIG. 4 is a view showing Example 4 of Write Principle 1 according to the present invention.

As shown in FIG. 4, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 4, assume that the asteroid curve (solid line) of a MTJ element of an actually manufactured magnetic random access memory shifts to the opposite side of the direction of the magnetic field in the hard-axis direction with respect to the ideal asteroid curve, as shown in FIG. 4. The shift amount (offset amount) which is converted into a magnetic field intensity is Ho.

In this case, the point that indicates the intensity of the synthesized magnetic field $\vec{H1}+\vec{H2}$ is largely separated outward from the actual asteroid curve (solid line). That is, since the value of the synthesized magnetic field $\vec{H1}+\vec{H2}$ necessary for reversing the magnetizing direction of the free layer (storing layer) of the MTJ element is too large, write errors for unselected MTJ elements may occur.

To prevent this, in Example 4, part H3 (e.g., Ho/2) of the offset amount Ho generated due to the shift of the asteroid curve is subtracted from the magnetic field H1 in the hard-axis direction in the write mode. A magnetic field $(\vec{H1}-\vec{H3})$ is caused to act on the MTJ element as the magnetic field in the hard-axis direction. In addition, part H4 (e.g., Ho/2) of the offset amount Ho is subtracted from the magnetic field H2 in the easy-axis direction. A magnetic field $(\vec{H2}-\vec{H4})$ is caused to act on the MTJ element as the magnetic field in the easy-axis direction.

In this case, the point that indicates the intensity of the synthesized magnetic field $(\vec{H1}-\vec{H3})+(\vec{H2}-\vec{H4})$ is located near and outside the actual asteroid curve (solid line). For this reason, only the magnetizing direction of the free layer (storing layer) of the selected MTJ element can be reversed without any write errors for unselected MTJ elements.

The magnetic field $(\vec{H1}-\vec{H3})$ in the hard-axis direction can easily be generated by decreasing, by a predetermined amount, the value of the write current (having a predetermine direction) to be supplied to a write word line that runs in the easy-axis direction.

The magnetic field $(\vec{H2}-\vec{H4})$ in the easy-axis direction can easily be generated by decreasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), each of the intensities of the magnetic fields in the hard- and easy-axis directions is controlled independently of the shift direction (hard-axis direction in this example), thereby increasing the reliability of the write operation.

Hence, the risk of write errors for unselected MTJ elements arranged along a selected write word line can be reduced.

The relationship between H1, H2, H3, and H4 is preferably H1=H2 and H3=H4=Ho/2.

(2) Principle 2

The write principle of this example is based on the premise that the asteroid curve of a MTJ element shifts in the easy-axis direction.

① EXAMPLE 1

Figure 5:
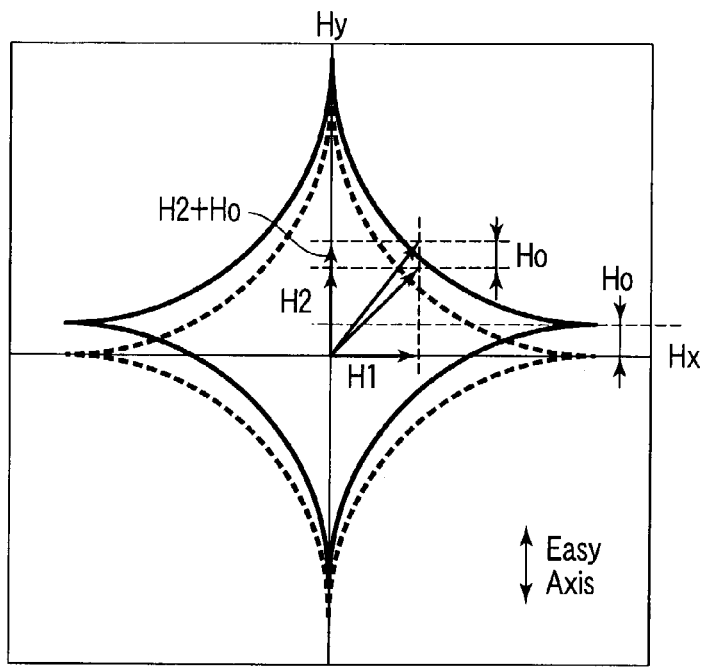
FIG. 5 is a view showing Example 1 of Write Principle 2 according to the present invention.

As shown in FIG. 5, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

Note that the ideal asteroid curve means an asteroid curve having a symmetrical shape with respect to the X- and Y-axes (this also applies to all examples to be described below).

In Example 1, assume that the asteroid curve (solid line) of a MTJ element of an actually manufactured magnetic random access memory shifts to the same side as the direction of the magnetic field (its direction changes in accordance with write data) in the easy-axis direction with respect to the ideal asteroid curve, as shown in FIG. 5. The shift amount (offset amount) which is converted into a magnetic field intensity is Ho.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse. As a consequence, the write operation is impossible.

To prevent this, in Example 1, the offset amount Ho generated due to the shift of the asteroid curve is added to the magnetic field H2 in the easy-axis direction in the write mode. A magnetic field $(\vec{H2}+\vec{Ho})$ is caused to act on the MTJ element as the magnetic field in the easy-axis direction.

In this case, the point that indicates the intensity of the synthesized magnetic field $\vec{H1}+(\vec{H2}+\vec{Ho})$ is located outside the actual asteroid curve (solid line). For this reason, the magnetizing direction of the free layer (storing layer) of the MTJ element can be reversed.

The magnetic field $(\vec{H2}+\vec{Ho})$ in the easy-axis direction can easily be generated by increasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), the intensity of the magnetic field in the shift direction (easy-axis direction in this example) is controlled to cancel the offset between the ideal asteroid curve and the actual asteroid curve.

As a result, the disabled write operation in the write mode can be avoided, and the reliability of the write operation can be increased.

② EXAMPLE 2

In Example 1, only the intensity of the magnetic field in the direction (easy-axis direction) of the shift of the asteroid curve is controlled in accordance with the offset amount. In Example 2, each of the intensities of the magnetic fields in the hard- and easy-axis directions is controlled in accordance with the offset amount independently of the direction (easy-axis direction) of the shift of the asteroid curve, thereby increasing the reliability of write operation.

Figure 6:
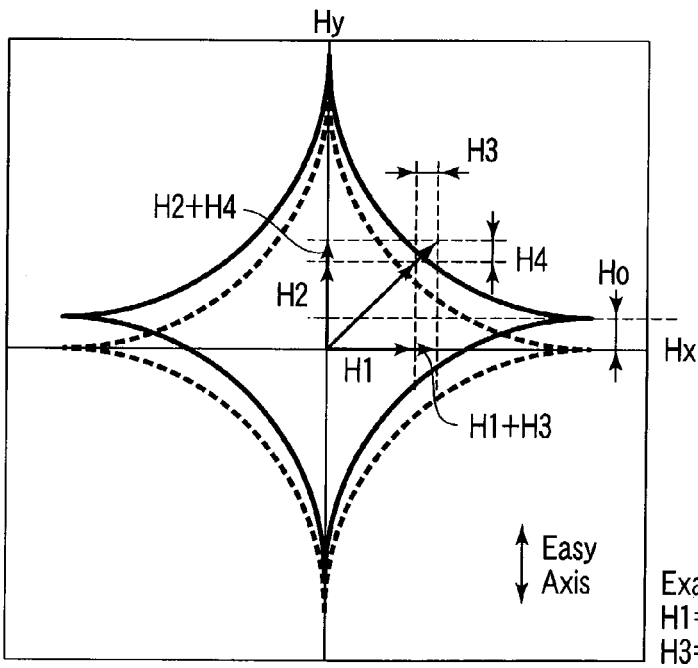
FIG. 6 is a view showing Example 2 of Write Principle 2 according to the present invention.

As shown in FIG. 6, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 2, assume that the asteroid curve (solid line) of a MTJ element of an actually manufactured magnetic random access memory shifts to the same side as the direction of the magnetic field (its direction changes in accordance with write data) in the easy-axis direction with respect to the ideal asteroid curve, as shown in FIG. 6. The shift amount (offset amount) which is converted into a magnetic field intensity is Ho.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse. As a consequence, the write operation is impossible.

To prevent this, in Example 2, part H4 (e.g., Ho/2) of the offset amount Ho generated due to the shift of the asteroid curve is added to the magnetic field H2 in the easy-axis direction in the write mode. A magnetic field $(\vec{H2}+\vec{H4})$ is caused to act on the MTJ element as the magnetic field in the easy-axis direction. In addition, part H3 (e.g., Ho/2) of the offset amount Ho is added to the magnetic field H1 in the hard-axis direction. A magnetic field $(\vec{H1}+\vec{H3})$ is caused to act on the MTJ element as the magnetic field in the hard-axis direction.

In this case, the point that indicates the intensity of the synthesized magnetic field $(\vec{H1}+\vec{H3})+(\vec{H2}+\vec{H4})$ is located outside the actual asteroid curve (solid line). For this reason, the magnetizing direction of the free layer (storing layer) of the MTJ element can be reversed.

The magnetic field $(\vec{H1}+\vec{H3})$ in the hard-axis direction can easily be generated by increasing, by a predetermined amount, the value of the write current (having a predetermine direction) to be supplied to a write word line that runs in the easy-axis direction.

The magnetic field $(\vec{H2}+\vec{H4})$ in the easy-axis direction can easily be generated by increasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), each of the intensities of the magnetic fields in the hard- and easy-axis directions is controlled independently of the shift direction (easy-axis direction in this example), thereby increasing the reliability of the write operation.

Hence, the risk of write errors for unselected MTJ elements arranged along a selected write bit line can be reduced.

To reduce the risk of write errors for unselected MTJ elements arranged along a selected write bit line and the risk of write errors for unselected MTJ elements arranged along a selected write word line as much as possible, H3=H4 (e.g., H1=H2, and H3=H4=Ho/2) is preferably satisfied.

③ EXAMPLE 3

Example 3 is different from Example 1 in that the asteroid curve of a MTJ element shifts to the opposite side of the direction of the magnetic field (its direction changes in accordance with write data) in the easy-axis direction with respect to an ideal asteroid curve.

Figure 7:
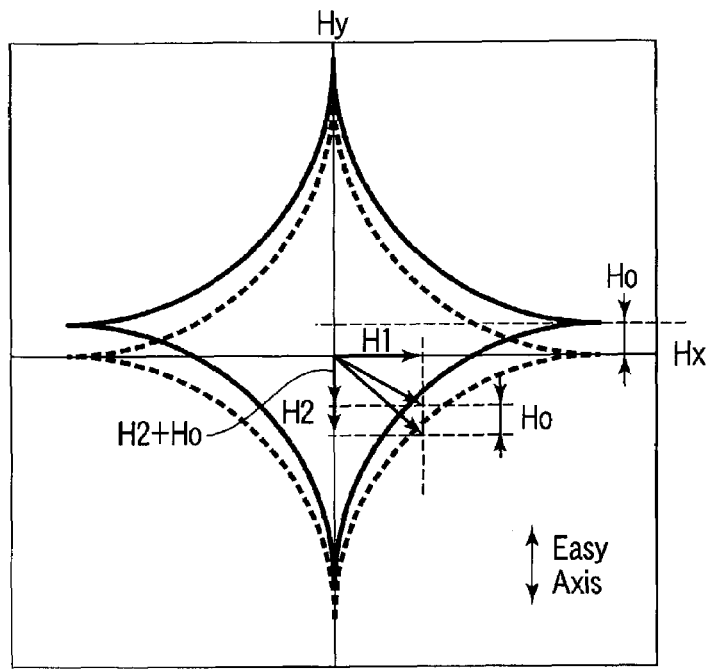
FIG. 7 is a view showing Example 3 of Write Principle 2 according to the present invention.

As shown in FIG. 7, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 3, assume that the asteroid curve (solid line) of a MTJ element of an actually manufactured magnetic random access memory shifts to the opposite side of the direction of the magnetic field in the easy-axis direction with respect to the ideal asteroid curve, as shown in FIG. 7. The shift amount (offset amount) which is converted into a magnetic field intensity is Ho.

In this case, the point that indicates the intensity of the synthesized magnetic field $\vec{H1}+\vec{H2}$ is largely separated outward from the actual asteroid curve (solid line). That is, since the value of the synthesized magnetic field $\vec{H1}+\vec{H2}$ necessary for reversing the magnetizing direction of the free layer (storing layer) of the MTJ element is too large, write errors for unselected MTJ elements may occur.

To prevent this, in Example 3, the offset amount Ho generated due to the shift of the asteroid curve is subtracted from the magnetic field H2 in the easy-axis direction in the write mode. A magnetic field $(\vec{H2}-\vec{Ho})$ is caused to act on the MTJ element as the magnetic field in the easy-axis direction.

In this case, the point that indicates the intensity of the synthesized magnetic field $\vec{H1}+(\vec{H2}-\vec{Ho})$ is located near and outside the actual asteroid curve (solid line). For this reason, the magnetizing direction of the free layer (storing layer) of the MTJ element can be reversed.

The magnetic field $(\vec{H2}-\vec{Ho})$ in the easy-axis direction can easily be generated by decreasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), the intensity of the magnetic field in the shift direction (hard-axis direction in this example) is controlled to cancel the offset between the ideal asteroid curve and the actual asteroid curve.

As a result, the disabled write operation in the write mode can be avoided, and the reliability of the write operation can be increased.

(4) EXAMPLE 4

Like Examples 1 and 3, Example 4 will be proposed in correspondence with Example 2.

In Example 4, each of the intensities of the magnetic fields in the hard- and easy-axis directions is controlled in accordance with the offset amount independently of the direction (easy-axis direction) of the shift of an asteroid curve, thereby increasing the reliability of write operation.

Figure 8:
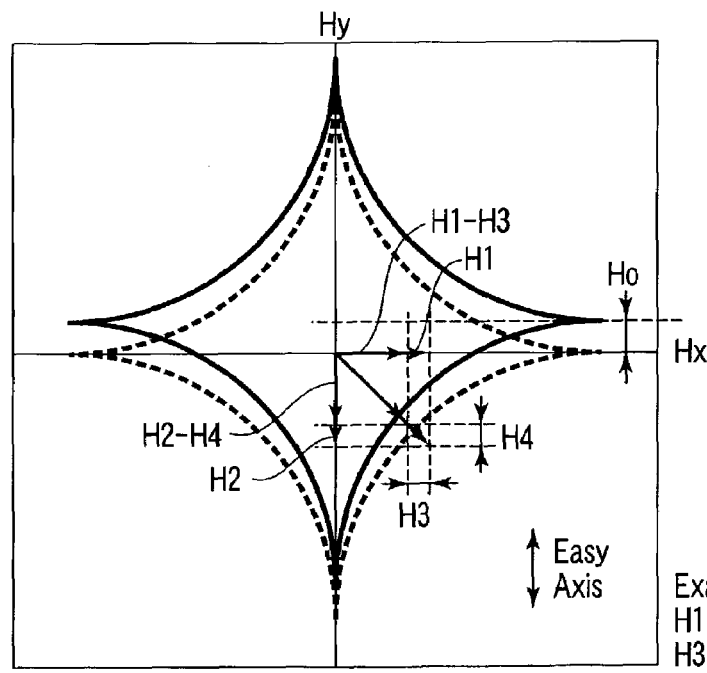
FIG. 8 is a view showing Example 4 of Write Principle 2 according to the present invention.

As shown in FIG. 8, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 4, assume that the asteroid curve (solid line) of a MTJ element of an actually manufactured magnetic random access memory shifts to the opposite side of the direction of the magnetic field in the easy-axis direction with respect to the ideal asteroid curve, as shown in FIG. 8. The shift amount (offset amount) which is converted into a magnetic field intensity is Ho.

In this case, the point that indicates the intensity of the synthesized magnetic field $\vec{H1}+\vec{H2}$ is largely separated outward from the actual asteroid curve (solid line). That is, since the value of the synthesized magnetic field $\vec{H1}+\vec{H2}$ necessary for reversing the magnetizing direction of the free layer (storing layer) of the MTJ element is too large, write errors for unselected MTJ elements may occur.

To prevent this, in Example 4, part H4 (e.g., Ho/2) of the offset amount Ho generated due to the shift of the asteroid curve is subtracted from the magnetic field H2 in the easy-axis direction in the write mode. A magnetic field ($\vec{H2}-\vec{H4}$) is caused to act on the MTJ element as the magnetic field in the easy-axis direction. In addition, part H3 (e.g., Ho/2) of the offset amount Ho generated due to the shift of the asteroid curve is subtracted from the magnetic field H1 in the hard-axis direction. A magnetic field ($\vec{H1}-\vec{H3}$) is caused to act on the MTJ element as the magnetic field in the hard-axis direction.

In this case, the point that indicates the intensity of the synthesized magnetic field ($\vec{H1}-\vec{H3}$)+($\vec{H2}-\vec{H4}$) is located near and outside the actual asteroid curve (solid line). For this reason, the magnetizing direction of the free layer (storing layer) of the MTJ element can be reversed.

The magnetic field ($\vec{H1}-\vec{H3}$) in the hard-axis direction can easily be generated by decreasing, by a predetermined amount, the value of the write current (having a predetermine direction) to be supplied to a write word line that runs in the easy-axis direction.

The magnetic field ($\vec{H2}-\vec{H4}$) in the easy-axis direction can easily be generated by decreasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), each of the intensities of the magnetic fields in the hard- and easy-axis directions is controlled independently of the shift direction (hard-axis direction in this example), thereby increasing the reliability of the write operation.

Hence, the risk of write errors for unselected MTJ elements arranged along a selected write bit line can be reduced.

The relationship between H1, H2, H3, and H4 is preferably H1=H2 and H3=H4=Ho/2.

(5) EXAMPLE 5

Principle 2 is based on an example in which the asteroid curve shifts in the easy-axis direction. The data value of a MTJ element is determined by the magnetizing direction in the easy-axis direction.

That is, in Principle 2, when the situation described in Example 1 (or Example 2) occurs in a specific MTJ element, the situation described in Example 3 (or Example 4) also occurs in the specific MTJ element. For example, assume that the situation described in Example 1 (or Example 2) occurs when data "1" is to be written in a specific MTJ element. At this time, the situation described in Example 3 (or Example 4) occurs when data "0" is to be written in the specific MTJ element.

Hence, Examples 1 and 3 (or Examples 2 and 4) may be combined.

More specifically, when, e.g., data "1" is to be written, the magnitude of the write current for the write word/bit line is controlled such that the synthesized magnetic field has an intensity given by $\vec{H1}+(\vec{H2}+\vec{Ho})$ or $(\vec{H1}+\vec{H3})+(\vec{H2}+\vec{H4})$. When data "0" is to be written, the magnitude of the write current for the write word/bit line is controlled such that the synthesized magnetic field has an intensity given by $\vec{H1}+(\vec{H2}-\vec{Ho})$ or $(\vec{H1}-\vec{H3})+(\vec{H2}-\vec{H4})$

(3) Principle 3

The write principle of this example is based on the premise that the asteroid curve of a MTJ element shifts in the hard- and easy-axis directions.

① EXAMPLE 1

As shown in FIG. 9, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

Note that the ideal asteroid curve means an asteroid curve having a symmetrical shape with respect to the X- and Y-axes (this also applies to all examples to be described below).

In Example 1, assume that the asteroid curve (solid line) of a MTJ element of an actually manufactured magnetic random access memory shifts to the same side as the direction of the magnetic field in the hard-axis direction and also to the same side as the direction of the magnetic field in the easy-axis direction with respect to the ideal asteroid curve, as shown in FIG. 9. The shift amounts (offset amounts) are Hox in the hard-axis direction and Hoy in the easy-axis direction.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse. As a consequence, the write operation is impossible.

To prevent this, in Example 1, the offset amount Hox generated due to the shift of the asteroid curve is added to the magnetic field H1 in the hard-axis direction in the write mode. A magnetic field $(\vec{H1}+\vec{Hox})$ is caused to act on the MTJ element as the magnetic field in the hard-axis direction. In addition, the offset amount Hoy generated due to the shift of the asteroid curve is added to the magnetic field H2 in the easy-axis direction. A magnetic field $(\vec{H2}+\vec{Hoy})$ is caused to act on the MTJ element as the magnetic field in the easy-axis direction.

In this case, the point that indicates the intensity of the synthesized magnetic field $(\vec{H1}+\vec{Hox})+(\vec{H2}+\vec{Hoy})$ is located outside the actual asteroid curve (solid line). For this reason, the magnetizing direction of the free layer (storing layer) of the MTJ element can be reversed.

The magnetic field $(\vec{H1}+\vec{Hox})$ in the hard-axis direction can easily be generated by increasing, by a predetermined amount, the value of the write current (having a predetermine direction) to be supplied to a write word line that runs in the easy-axis direction.

The magnetic field $(\vec{H2}+\vec{Hoy})$ in the easy-axis direction can easily be generated by increasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), the intensities of the magnetic fields in the shift directions (hard- and easy-axis directions) are controlled to cancel the offset between the ideal asteroid curve and the actual asteroid curve.

As a result, the disabled write operation in the write mode can be avoided, and the reliability of the write operation can be increased.

② EXAMPLE 2

Example 2 is different from Example 1 in that the asteroid curve of a MTJ element shifts to the opposite side of the direction of the magnetic field in the hard-axis direction and also to the opposite side of the direction of the magnetic field in the easy-axis direction with respect to an ideal asteroid curve.

As shown in FIG. 10, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ located outside the ideal asteroid curve.

In Example 2, assume that the asteroid curve (solid line) of a MTJ element of an actually manufactured magnetic random access memory shifts to the opposite side of the direction of the magnetic field in the hard-axis direction and also to the opposite side of the direction of the magnetic field in the easy-axis direction with respect to the ideal asteroid curve, as shown in FIG. 10. The shift amounts (offset amounts) are Hox in the hard-axis direction and Hoy in the easy-axis direction.

In this case, the point that indicates the intensity of the synthesized magnetic field $\vec{H1}+\vec{H2}$ is largely separated outward from the actual asteroid curve (solid line). That is, since the value of the synthesized magnetic field $\vec{H1}+\vec{H2}$ necessary for reversing the magnetizing direction of the free layer (storing layer) of the MTJ element is too large, write errors for unselected MTJ elements may occur.

To prevent this, in Example 2, the offset amount Hox generated due to the shift of the asteroid curve is subtracted from the magnetic field H1 in the hard-axis direction in the write mode. A magnetic field $(\vec{H1}-\vec{Hox})$ is caused to act on the MTJ element as the magnetic field in the hard-axis direction.

In addition, the offset amount Hoy generated due to the shift of the asteroid curve is subtracted from the magnetic field H2 in the easy-axis direction in the write mode. A magnetic field $(\vec{H2}-\vec{Hoy})$ is caused to act on the MTJ element as the magnetic field in the easy-axis direction.

In this case, the point that indicates the intensity of the synthesized magnetic field $(\vec{H1}-\vec{Hox})+(\vec{H2}-\vec{Hoy})$ is located near and outside the actual asteroid curve (solid line). For this reason, only the magnetizing direction of the free layer (storing layer) of the selected MTJ element can be reversed without any write errors for unselected MTJ elements.

The magnetic field $(\vec{H1}-\vec{Hox})$ in the hard-axis direction can easily be generated by decreasing, by a predetermined amount, the value of the write current (having a predetermine direction) to be supplied to a write word line that runs in the easy-axis direction.

The magnetic field $(\vec{H2}-\vec{Hoy})$ in the easy-axis direction can easily be generated by decreasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element shifts from the ideal position and is not symmetrical with respect to the X-axis (hard-axis) or Y-axis (easy-axis), the intensities of the magnetic fields in the shift directions (hard- and easy-axis directions) are controlled to cancel the offset between the ideal asteroid curve and the actual asteroid curve.

As a result, the disabled write operation in the write mode can be avoided, and the reliability of the write operation can be increased.

(4) Principle 4

The write principle of this example is based on the premise that the asteroid curve of a MTJ element partially spreads in the hard-axis direction, and consequently, the asteroid curve becomes asymmetrical with respect to the Y-axis (easy-axis).

This distortion in asteroid curve readily occurs due to the influences of the magnetic domain structure of a MTJ element and impurities.

① EXAMPLE 1

As shown in FIG. 11, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

Note that the ideal asteroid curve means an asteroid curve having a symmetrical shape with respect to the X- and Y-axes (this also applies to all examples to be described below).

In Example 1, assume that the asteroid curve (solid line) of a MTJ element of an actually manufactured magnetic random access memory partially spreads in the easy-axis direction with respect to the ideal asteroid curve, as shown in FIG. 11.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse. As a consequence, the write operation is impossible.

To prevent this, in Example 1, an offset amount Hoy generated due to the shift of the asteroid curve is added to the magnetic field H2 in the easy-axis direction in the write mode. A magnetic field $(\vec{H2}+\vec{Hoy})$ is caused to act on the MTJ element as the magnetic field in the easy-axis direction.

In this case, the point that indicates the intensity of the synthesized magnetic field $\vec{H1}+(\vec{H2}+\vec{Hoy})$ is located outside the actual asteroid curve (solid line). For this reason, the magnetizing direction of the free layer (storing layer) of the MTJ element can be reversed.

The magnetic field $(\vec{H2}+\vec{Hoy})$ in the easy-axis direction can easily be generated by increasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element partially spreads in the X-axis (hard-axis) direction or Y-axis (easy-axis) direction, and the asteroid curve is not symmetrical with respect to the X- or Y-axis, the intensity of the magnetic field in the spreading direction (easy-axis direction in this example) is controlled.

As a result, the disabled write operation in the write mode can be avoided, and the reliability of the write operation can be increased.

② EXAMPLE 2

In Example 2, each of the intensities of the magnetic fields in the hard- and easy-axis directions is controlled in accordance with the offset amount independently of the deformation pattern of an asteroid curve, thereby increasing the reliability of write operation.

As shown in FIG. 12, a synthesized magnetic field necessary for magnetization inversion, which is determined on the basis of an ideal asteroid curve (broken line), is defined as $\vec{H1}+\vec{H2}$. H1 is a magnetic field in the X-axis (hard-axis) direction, and H2 is a magnetic field in the Y-axis (easy-axis) direction. In this case, a point that indicates the intensity of the synthesized magnetic field $\vec{H1}+\vec{H2}$ is located outside the ideal asteroid curve.

In Example 2, assume that the asteroid curve (solid line) of a MTJ element of an actually manufactured magnetic random access memory partially spreads in the easy-axis direction with respect to the ideal asteroid curve, as shown in FIG. 12.

In this case, the point that indicates the intensity of the synthesized magnetic field $\vec{H1}+\vec{H2}$ is located inside the actual asteroid curve (solid line). For this reason, in the write mode, even when the synthesized magnetic field $\vec{H1}+\vec{H2}$ is applied to the MTJ element, the magnetizing direction of the free layer (storing layer) of the MTJ element does not reverse. As a consequence, the write operation is impossible.

To prevent this, in Example 2, $(\vec{H1}+\vec{H3})$ is defined as a magnetic field in the hard-axis direction. The magnetic field $(\vec{H1}+\vec{H3})$ is caused to act on the MTJ element as the magnetic field in the hard-axis direction. In addition, $(\vec{H2}+\vec{H4})$ is defined as a magnetic field in the easy-axis direction. The magnetic field $(\vec{H2}+\vec{H4})$ is caused to act on the MTJ element as the magnetic field in the easy-axis direction.

In this case, the point that indicates the intensity of the synthesized magnetic field $(\vec{H1}+\vec{H3})+(\vec{H2}+\vec{H4})$ is located outside the actual asteroid curve (solid line). For this reason, the magnetizing direction of the free layer (storing layer) of the MTJ element can be reversed.

The magnetic field $(\vec{H1}+\vec{H3})$ in the hard-axis direction can easily be generated by increasing, by a predetermined amount, the value of the write current (having a predetermine direction) to be supplied to a write word line that runs in the easy-axis direction.

The magnetic field $(\vec{H2}+\vec{H4})$ in the easy-axis direction can easily be generated by increasing, by a predetermined amount, the value of the write current (having a direction which changes in accordance with write data) to be supplied to a write bit line that runs in the hard-axis direction.

A circuit scheme used to execute this operation principle will be described later in detail.

As described above, in the write principle of this example, when the asteroid curve of the MTJ element is deformed, each of the intensities of the magnetic fields in the hard- and easy-axis directions is controlled independently of the deformation pattern, thereby increasing the reliability of the write operation.

Hence, the risk of write errors for unselected MTJ elements arranged along a selected write word line can be reduced.

(5) Principle 5

Principles 1 to 4 are based on the premises that the asteroid curve of a MTJ element shifts or deforms. The techniques for canceling the offset of the asteroid curve due to the shift or deformation have been described above.

Although the asteroid curve of the MTJ element is actually symmetrical with respect to the X- and Y-axes, if the write characteristics of a MTJ element may change from the ideal value (design value), and for example, the positional relationship between the write word/bit line and the MTJ element changes, the examples of the present invention can also be used as a means for correcting the positional relationship.

More specifically, the distance between the write word/bit line and the MTJ element may be smaller or larger than the ideal value due to mask misalignment or the like. When the distance between the write word/bit line and the MTJ element decreases, the magnetic field applied to the MTJ element becomes strong. Conversely, when the distance increases, the magnetic field applied to the MTJ element becomes weak.

To prevent any disabled write operation or write error due to the above phenomenon, control of the intensity of the magnetic field (the magnitude of the write current) according to the examples of the present invention is very effective.

(6) Others

The write principles described in Principles 1 to 5 are implemented by hardware in the magnetic random access memory (chip or cell array block). These write principles are set for each chip, each cell array block, each write word/bit line, or each MTJ element.

Figure 13:
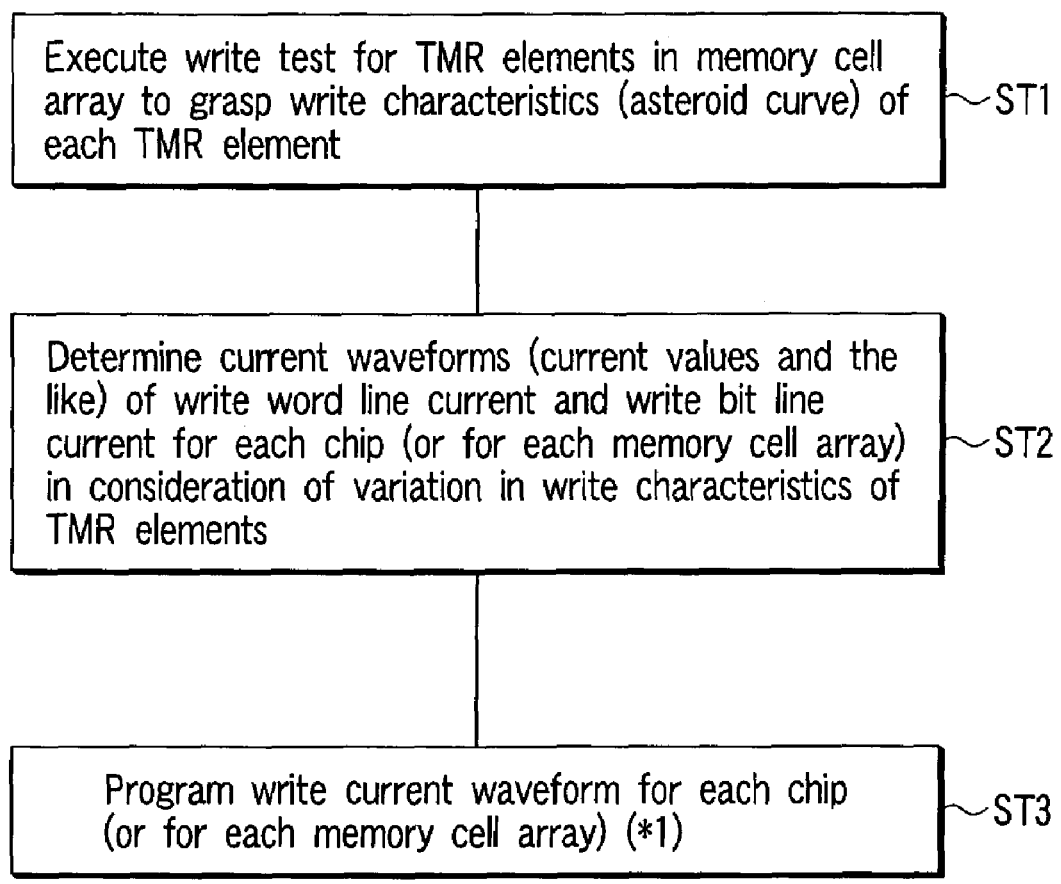
FIG. 13 is a flow chart showing write method I according to the present invention.
Figure 14:
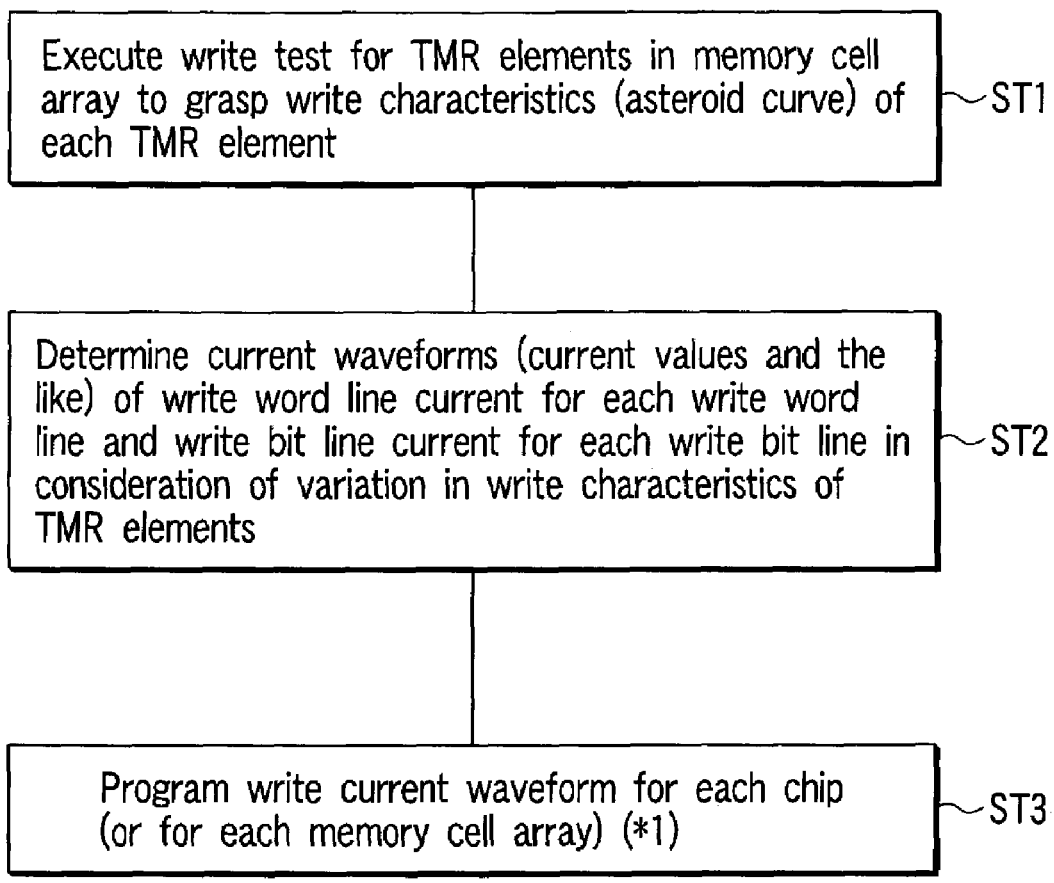
FIG. 14 is a flow chart showing write method II according to the present invention.

To set a write principle, as shown in FIGS. 13 and 14, a write test is executed for MTJ elements in the memory cell array to grasp the write characteristics (e.g., asteroid curve) of each MTJ element (step ST1).

After that, the current waveforms (current values or the like) of the write word line current and write bit line current are determined for each chip, each cell array block, each write word/bit line, or each MTJ element in consideration of the variation in write characteristics between the MTJ elements (step ST2).

Figure 15:
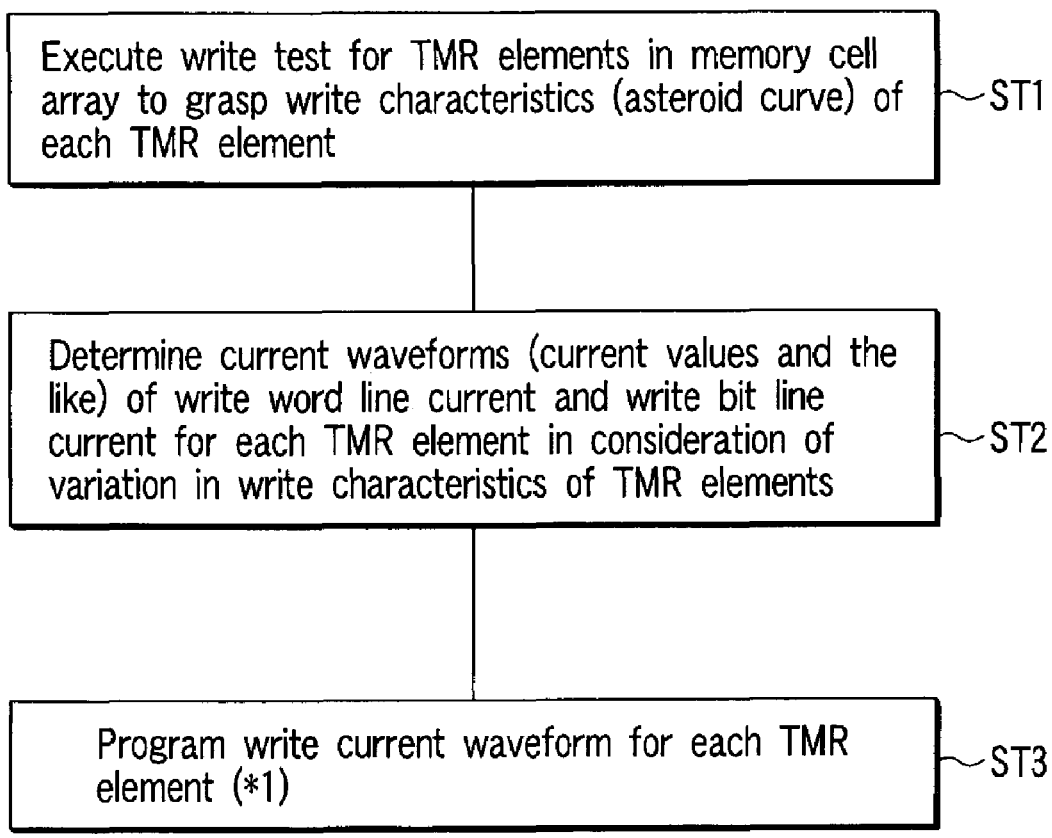
FIG. 15 is a flow chart showing write method III according to the present invention.

FIG. 13 shows an example in which the current waveform of the write word/bit line current is determined for each chip (or for each cell array block). FIG. 14 shows an example in which the current waveform of the write word/bit line current is determined for each write word/bit line. FIG. 15 shows an example in which the current waveform of the write word/bit line current is determined for each MTJ element.

Finally, the write principle (i.e., the current waveforms of the write word line current and write bit line current which are determined for each chip, each cell array block, each write word/bit line, or each MTJ element) is programmed (step ST3).

Programming is performed for a setting circuit arranged at a predetermined portion in a chip. As will be described later in the "circuit scheme" section, programming can be executed for, e.g., a laser blow fuse, a MTJ element (MTJ), or an antifuse which breaks the tunneling barrier of a MTJ element.

In the test mode, the current waveforms of the write word line current and write bit line current may be programmed in a programming element in the setting circuit. Alternatively, in the test mode, the write principle according to an example of the present invention may be tested.

In the actual write operation, the current waveforms of the write word line current and write bit line current are determined on the basis of programming data stored in the setting circuit.

The write current is supplied from a driver connected to one end of a write word/bit line and absorbed by a sinker connected to the other end. In cutting off the write current, the function of the driver is stopped first. Then, after a predetermined time, the function of the sinker is stopped. With this arrangement, the potential of the write word/bit line can be completely set to 0 V.

The operation related to the programming, the operation related to the test, and the operation of the driver/sinker will be described in detail in the following "circuit scheme" section.

2. Circuit Scheme

Examples of the circuit scheme of the magnetic random access memory to implement the write principles according to Principles 1 to 5 described above will be described below.

(1) Setting for Each Chip or Cell Array

Write characteristics or asteroid curves of MTJ elements may change between chips or cell arrays (blocks) due to manufacturing variations.

A circuit (including a function capable of setting the magnetic field intensity individually for each magnetizing reversing direction) which sets the magnitude of a write current, i.e., the intensity of a write magnetic field necessary for reversing the magnetizing direction of the free layer (storing layer) of a MTJ element for each chip or cell array in consideration of such a variation in write characteristics (e.g., a shift of an asteroid curve) will be described first.

① Overall Arrangement

FIG. 16 shows the arrangement of main part of a magnetic random access memory according to an embodiment of the present invention.

A magnetic random access memory (MRAM) 11 may construct one memory chip by itself or one block in a chip having a specific function. A memory cell array (data cell) 12 has a function of actually storing data. A reference cell array 13 has a function of setting a criterion to be used to determine the value of read data in read operation.

A row decoder & driver (row decoder & write word line driver and row decoder & read word line driver) 14 is arranged at one of two Y-direction (easy-axis direction) ends of a cell array formed from the memory cell array 12 and reference cell array 13. A write word line sinker 15 is arranged at the other end.

The row decoder & driver 14 has a function of, e.g., selecting one of a plurality of write word lines on the basis of a row address signal and supplying a write current to the selected write word line in the write operation. The write word line sinker 15 has a function of, e.g., absorbing the write current supplied to the selected write word line in the write operation.

The row decoder & driver 14 has a function of, e.g., selecting one of a plurality of read word lines (the read word lines may be integrated with the write word lines) on the basis of a row address signal and supplying a read current to the selected read word line in the read operation. A sense amplifier 20 detects, e.g., the read current and determines read data.

A column decoder & write bit line driver/sinker 16A is arranged at one of two X-direction (hard-axis direction) ends of the memory cell array 12. A column decoder & write bit line driver/sinker (including a column transfer gate and column decoder) 17A is arranged at the other end.

The column decoders & write bit line drivers/sinkers 16A and 17A have a function of, e.g., selecting one of a plurality of write bit lines (or data lines) on the basis of a column address signal and supplying a write current having a direction corresponding to write data to the selected write bit line in the write operation. The column transfer gate and column decoder have a function of electrically connecting the data line selected by the column address signal to the sense amplifier 20 in the read operation.

A reference cell column decoder & write bit line driver/sinker 16B is arranged at one of two X-direction ends of the reference cell array 13. A reference cell column decoder & write bit line driver/sinker (including a column transfer gate and column decoder) 17B is arranged at the other end.

The reference cell column decoders & write bit line drivers/sinkers 16B and 17B have a function of storing reference data in the reference cell array 13. The column transfer gate and column decoder have a function of reading out the reference data and transferring it to the sense amplifier 20 in the read operation.

An address receiver 18 receives an address signal and transfers, e.g., a row address signal to the row decoder & driver 14 and a column address signal to the column decoders & write bit line drivers/sinkers 16A and 17A. A data input receiver 19 transfers the write data to the column decoders & write bit line drivers/sinkers 16A and 17A. An output driver 21 outputs the read data detected by the sense amplifier 20 from the magnetic random access memory 11.

A control circuit 22 receives a /CE (Chip Enable) signal, /WE (Write Enable) signal, and /OE (Output Enable) signal and controls the operation of the magnetic random access memory 11.

For example, in the write operation, the control circuit 22 supplies a write signal WRITE to a write current waveform control circuit 24. Upon receiving the write signal WRITE, the write current waveform control circuit 24 generates a write word line drive signal WWLDRV, write word line sink signal WWLSNK, write bit line drive signal WBLDRV, and write bit line sink signal WBLSNK.

The write word line drive signal WWLDRV is supplied to the row decoder & driver 14. The write word line sink signal WWLSNK is supplied to the write word line sinker 15. The write bit line drive signal WBLDRV and write bit line sink signal WBLSNK are supplied to the column decoders & write bit line drivers/sinkers 16A and 17A.

A setting circuit 23 has a programming element. Setting data which determines the current waveform of the write word/bit line current is programmed in the programming element. As a programming element, for example, a laser blow fuse, a MTJ element (MTJ), or an antifuse which breaks the tunneling barrier of a MTJ element can be used.

In the write operation, the setting circuit 23 generates write word line current waveform signals WS<0> to WS<3> and write bit line current waveform signals BS<0> to BS<7> on the basis of the setting data.

The write word line current waveform signals WS<0> to WS<3> are supplied to the row decoder & driver 14 through the write current waveform control circuit 24 (or without intervening the write current waveform control circuit 24).

The write bit line current waveform signals BS<0> to BS<3>are supplied to the column decoder & write bit line driver/sinker 16A through or without intervening the write current waveform control circuit 24. The write bit line current waveform signals BS<4> to BS<7> are supplied to the column decoder & write bit line driver/sinker 17A through or without intervening the write current waveform control circuit 24.

When the write word line drive signal WWLDRV is "H", and the write word line sink signal WWLSNK is "H", the row decoder & driver 14 determines the value (magnitude) of the write current to be supplied to a write word line selected by a row address signal, on the basis of the write word line current waveform signals WS<0> to WS<3>.

Similarly, when the write bit line drive signal WBLDRV is "H", and the write bit line sink signal WBLSNK is "H", the write word line sinker 15 and column decoders & write bit line drivers/sinkers 16A and 17A determine the value (magnitude) of the write current to be supplied to a write bit line selected by a column address signal, on the basis of the write bit line current waveform signals BS<0> to BS<7>.

When a write current is to be supplied from the column decoder & write bit line driver/sinker 16A to the column decoder & write bit line driver/sinker 17A, the write bit line current waveform signals BS<0> to BS<3> determine the value of the write bit line current.

When a write current is to be supplied from the column decoder & write bit line driver/sinker 17A to the column decoder & write bit line driver/sinker 16A, the write bit line current waveform signals BS<4> to BS<7> determine the value of the write bit line current.

As for the absorption timing of the write current, for example, when the timings to change the sink signals WWLSNK and WBLSNK from "H" to "L" are set after the timings to change the drive signals WWLDRV and WBLDRV from "H" to "L", the potential of the write word/bit line can be completely set to 0 V.

In the test mode of the magnetic random access memory, a write test for the MTJ element can be executed on the basis of, e.g., setting data D<j> input from a data input/output terminal. With this write test, the write characteristics of the MTJ elements in the memory cell array 12 are grasped, and the value of the write word/bit line current (the intensity of the synthesized magnetic field Hx+Hy) in the normal write operation is determined.

In the test mode, the setting data D<j> may be input from an address terminal.

After that, the programming operation of setting data is performed in accordance with the result of the test mode. The programming operation is operation of programming the result of the test mode, i.e., the value of the write word/bit line current in the programming element in the setting circuit 23.

In the programming operation, a program signal PROG changes to "H". The value of the write word/bit line current in the normal write operation is programmed in the programming element in the setting circuit 23 by controlling the value of the setting data D<j> input from the data input/output terminal or address terminal.

② Row Decoder & Write Word Line Driver/Sinker

Figure 17:
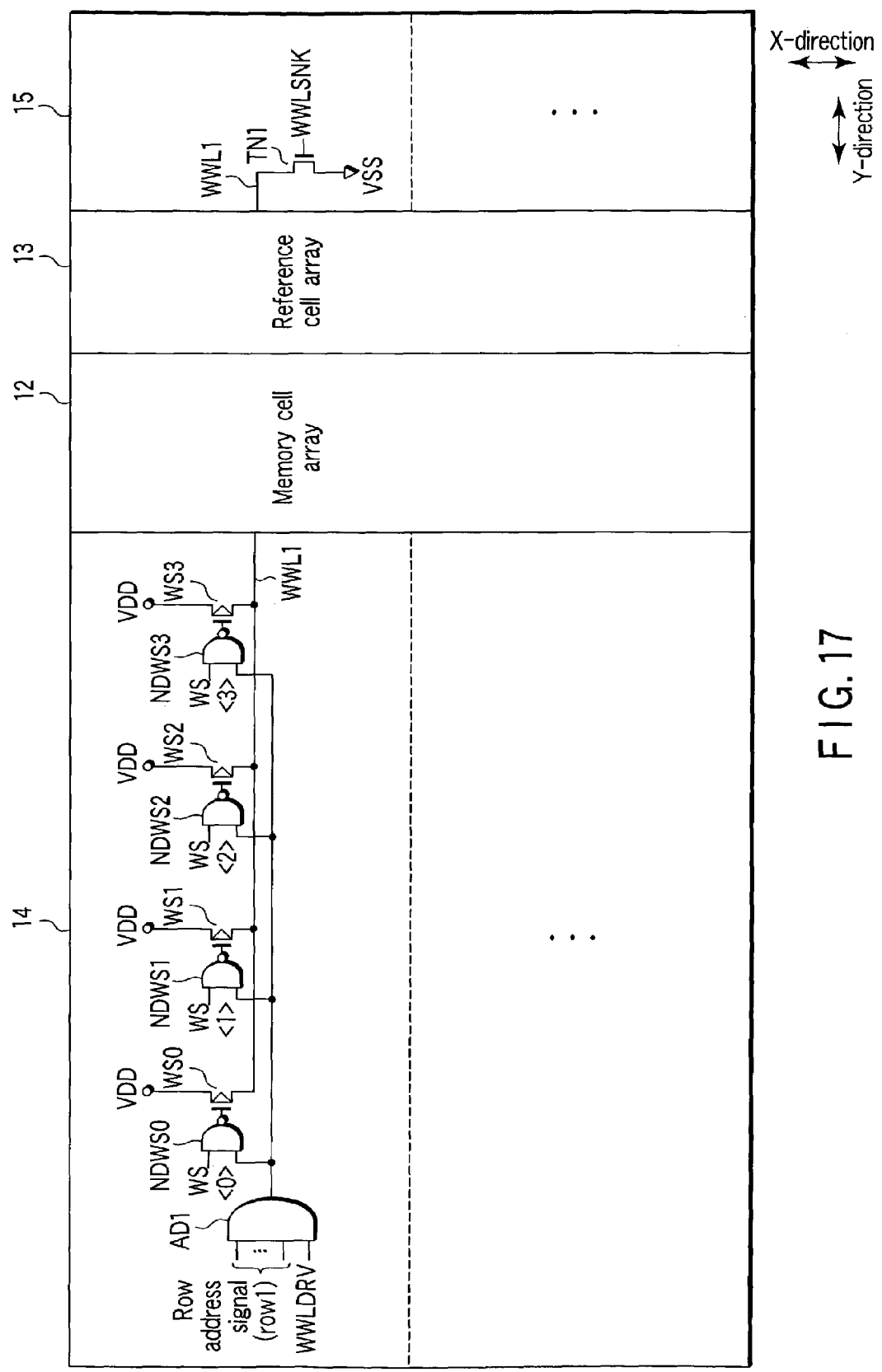
FIG. 17 is a view showing an example of a write word line driver/sinker.

FIG. 17 shows a circuit example of the row decoder & write word line driver/sinker.

The row decoder & write word line driver (for one row) 14 is formed from an AND gate circuit AD1, NAND gate circuits NDWS0 to NDWS3, and PMOS transistors WS0 to WS3. The gate of a PMOS transistor WSi (i=0, 1, 2, 3) is connected to the output terminal of a NAND gate circuit NDWSi, the source is connected to a power supply terminal VDD, and the drain is connected to one end of a write word line WWLi (i=1, ... )

A write word line current waveform signal WS<i> is input to one of the two input terminals of the NAND gate circuit NDWSi. The output signal from the AND gate circuit AD1 is input to the other input terminal. The write word line drive signal WWLDRV and a row address signal (changes for each row i) formed from a plurality of bits are input to the AND gate circuit AD1.

The write word line sinker (for one row) 15 is formed from an NMOS transistor TN1. The source of the NMOS transistor TN1 is connected to a ground terminal VSS, and the drain is connected to the other end of the write word line WWLi. The write word line sink signal WWLSNK is input to the gate of the NMOS transistor TN1.

In the write operation, the write word line drive signal WWLDRV changes to "H". At the same time, in the selected row i, all bits of the row address signal change to "H". That is, in the selected row i, since the output signal from the AND circuit AD1 changes to "H", a write word line current having a predetermined value (magnitude) is supplied to the write word line WWLi in accordance with the values of the write word line current waveform signals WS<0> to WS<3>.

When the write word line sink signal WWLSNK changes to "H", the NMOS transistor TN1 is turned on. For this reason, the write current flowing to the write word line WWLi is absorbed by the ground point VSS through the NMOS transistor TN1.

According to this row decoder & write word line driver/sinker, when the values of the write word line current waveform signals WS<0> to WS<3> are controlled, the magnitude (current waveform) of the write current for the write word line WWLi in the selected row i can be controlled.

When the write word line drive signal WWLDRV is set to "L", and then, the write word line sink signal WWLSNK is set to "L", the potential of the write word line WWLi after the write operation can be completely set to 0 V. It is convenient for initialization.

To control the value (magnitude) of the write word line current, the following control methods can be used. As the first method, the sizes (channel widths), i.e., the driving capabilities of the plurality of PMOS transistors WS0 to WS3 are set to the same value. Then, the number of PMOS transistors WS0 to WS3 in the ON state is changed using the write word line current waveform signals WS<0> to WS<3>.

As the second method, the sizes (channel widths), i.e., the driving capabilities of the plurality of PMOS transistors WS0 to WS3 are set to different values. Then, one of the plurality of PMOS transistors WS0 to WS3 is selectively turned on using write word line current waveform signals WS<0> to WS<3>.

The third method is a combination of the first and second methods. That is, the sizes of the PMOS transistors WS0 to WS3 are set to different values, and the number of PMOS transistors WS0 to WS3 in the ON state is changed, thereby controlling the value (magnitude) of the write current.

③ Column Decoder & Write Bit Line Driver/Sinker

Figure 18:
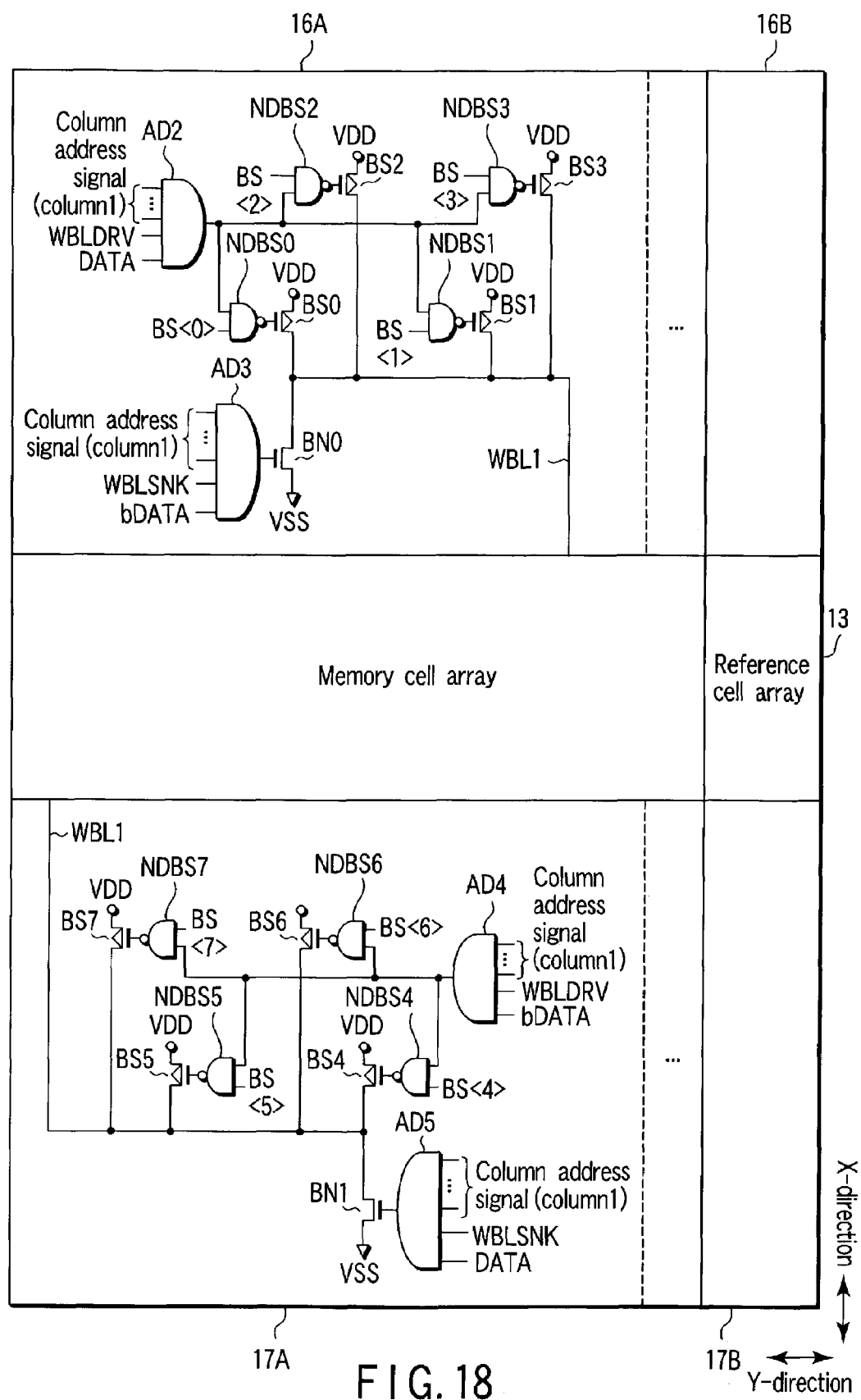
FIG. 18 is a view showing an example of a write bit line driver/sinker.

FIG. 18 shows a circuit example of the column decoder & write bit line driver/sinker.

The column decoder & write bit line driver/sinker (for one column) 16A is formed from NAND gate circuits NDBS0 to NDBS3, AND gate circuits AD2 and AD3, PMOS transistors BS0 to BS3, and NMOS transistor BN0.

The gate of a PMOS transistor BSi (i=0, 1, 2, 3) is connected to the output terminal of a NAND gate circuit NDBSi, the source is connected to the power supply terminal VDD, and the drain is commonly connected to one end of a write bit line WBLi (i=1, ... )

A write word line current waveform signal BS<i> is input to one of the two input terminals of the NAND gate circuit NDBSi (i=0, 1, 2, 3). The output signal from the AND gate circuit AD2 is input to the other input terminal. The write bit line drive signal WBLDRV, a column address signal (changes for each column i) formed from a plurality of bits, and write data DATA are input to the AND gate circuit AD2.

The gate of the NMOS transistor BN0 is connected to the output terminal of the AND gate circuit AD3, the source is connected to the ground terminal VSS, and the drain is connected to one end of the write bit line WBLi (i=1, ... ) The write bit line sink signal WBLSNK, a column address signal (changes for each column i) formed from a plurality of bits, and an inverted signal bDATA of the write data are input to the AND gate circuit AD3.

The column decoder & write bit line driver/sinker (for one column) 17A is formed from NAND gate circuits NDBS4 to NDBS7, AND gate circuits AD4 and AD5, PMOS transistors BS4 to BS7, and NMOS transistor BN1.

The gate of the PMOS transistor BSi (i=4, 5, 6, 7) is connected to the output terminal of the NAND gate circuit NDBSi, the source is connected to the power supply terminal VDD, and the drain is commonly connected to the other end of the write bit line WBLi (i=1, ... )

The write word line current waveform signal BS<i> is input to one of the two input terminals of the NAND gate circuit NDBSi (i=4, 5, 6, 7). The output signal from the AND gate circuit AD4 is input to the other input terminal. The write bit line drive signal WBLDRV, a column address signal (changes for each column i) formed from a plurality of bits, and the inverted signal bDATA of the write data are input to the AND gate circuit AD4.

The gate of the NMOS transistor BN1 is connected to the output terminal of the AND gate circuit AD5, the source is connected to the ground terminal VSS, and the drain is connected to the other end of the write bit line WBLi (i=1, ... ) The write bit line sink signal WBLSNK, column address signal (changes for each column i) formed from a plurality of bits, and write data DATA are input to the AND gate circuit AD5.

In the write operation, both the write bit line drive signal WBLDRV and the write bit line sink signal WBLSNK change to "H". In addition, in the selected column i, all the bits of the column address signal change to "H".

Hence, in the selected column i, the value (magnitude) of the write current flowing from the column decoder & write bit line driver/sinker 16A to the column decoder & write bit line driver/sinker 17A is determined by the write bit line current waveform signals BS<0> to BS<3>.

In addition, the value (magnitude) of the write current flowing from the column decoder & write bit line driver/sinker 17A to the column decoder & write bit line driver/ sinker 16A is determined by the write bit line current waveform signals BS<4> to BS<7>.

The direction of the write current flowing to the write bit line WBLi is determined by the value of the write data DATA.

For example, when the write data DATA is "1" (="H"), at least one of the PMOS transistors BS0 to BS3 is turned on by the write bit line current waveform signals BS<0> to BS<3>. The NMOS transistor BN1 is also turned on. For this reason, the write current flows from the column decoder & write bit line driver/sinker 16A to the column decoder & write bit line driver/sinker 17A.

When the write data DATA is "0" (="L"), at least one of the PMOS transistors BS4 to BS7 is turned on by the write bit line current waveform signals BS<4> to BS<7>. The NMOS transistor BN0 is also turned on. For this reason, the write current flows from the column decoder & write bit line driver/sinker 17A to the column decoder & write bit line driver/sinker 16A.

According to this column decoder & write bit line driver/sinker, when the values of the write bit line current waveform signals BS<0> to BS<7> are controlled, the magnitude (current waveform) of the write current for the write bit line WBLi in the selected column i can be controlled.

When the write bit line drive signal WBLDRV is set to "L", and then, the write bit line sink signal WBLSNK is set to "L", the potential of the write bit line WBLi after the write operation can be completely set to 0 V. It is convenient for initialization.

To control the value (magnitude) of the write bit line current, the following control methods can be used. As the first method, the sizes (channel widths), i.e., the driving capabilities of the plurality of PMOS transistors BS0 to BS7 are set to the same value. Then, the number of PMOS transistors BS0 to BS7 in the ON state is changed using the write bit line current waveform signals BS<0> to BS<7>.

As the second method, the sizes (channel widths), i.e., the driving capabilities of the plurality of PMOS transistors BS0 to BS7 are set to different values. Then, one of the plurality of PMOS transistors BS0 to BS7 is selectively turned on using write bit line current waveform signals BS<0> to BS<7>.

The third method is a combination of the first and second methods. That is, the sizes of the PMOS transistors BS0 to BS7 are set to different values, and the number of PMOS transistors BS0 to BS7 in the ON state is changed, thereby controlling the value (magnitude) of the write current.

④ Write Current Waveform Control Circuit

An example of the write current waveform control circuit which generates the write word line drive signal WWLDRV, write word line sink signal WWLSNK, write bit line drive signal WBLDRV, and write bit line sink signal WBLSNK will be described next.

Figure 19:
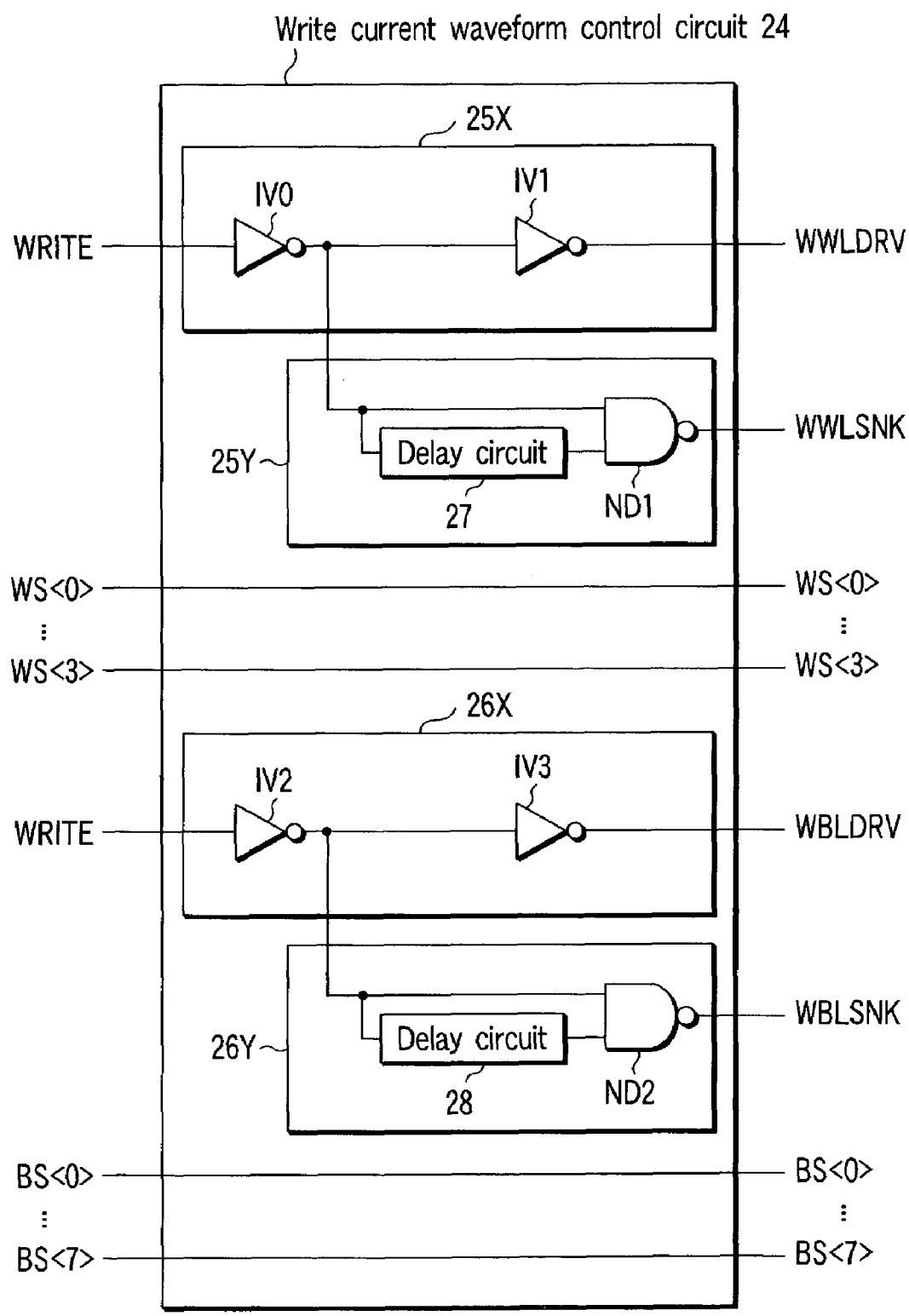
FIG. 19 is a view showing an example of a write current waveform control circuit.

FIG. 19 shows an example of the write current waveform control circuit.

The write current waveform control circuit 24 is constituted by a WWLDRV generation circuit 25X, WWLSNK generation circuit 25Y, WBLDRV generation circuit 26X, and WBLSNK generation circuit 26Y.

The WWLDRV generation circuit 25X is formed from inverters IV0 and IV1. The WWLDRV generation circuit 25X generates the write word line drive signal WWLDRV on the basis of the write signal WRITE. The WWLSNK generation circuit 25Y is formed from a NAND gate circuit ND1 and delay circuit 27. The WWLSNK generation circuit 25Y generates the write word line sink signal WWLSNK on the basis of the write signal WRITE.

The WBLDRV generation circuit 26X is formed from inverters IV2 and IV3. The WBLDRV generation circuit 26X generates the write bit line drive signal WBLDRV on the basis of the write signal WRITE. The WBLSNK generation circuit 26Y is formed from a NAND gate circuit ND2 and delay circuit 28. The WBLSNK generation circuit 26Y generates the write bit line sink signal WBLSNK on the basis of the write signal WRITE.

In the write operation, the write signal WRITE changes to "H". When the write signal WRITE changes from "L" to "H", the write word/bit line drive signals WWLDRV and WBLDRV and write word/bit line sink signals WWLSNK and WBLSNK almost simultaneously change from "L" to "H".

The delay circuits 27 and 28 determine the time (interval) from the change of the write signal WRITE from "H" to "L" and the change of the write word/bit line drive signals WWLDRV and WBLDRV from "H" to "L" to the change of the write word/bit line sink signals WWLSNK and WBLSNK from "H" to "L".

⑤ Setting Circuit

The setting circuit which generates the write word line current waveform signals WS<0> to WS<3> and write bit line current waveform signals BS<0> to BS<3> will be described next.

FIG. 20 shows an example of the setting circuit.

The setting circuit 23 is formed from a first portion which generates the write word line current waveform signals WS<0> to WS<3> and a second portion which generates the write bit line current waveform signals BS<0> to BS<3>.

The first portion has registers <0> and <1> in which setting data that determine the current waveform (magnitude) of the write word line current are programmed, and decoders WS<0> to WS<3> which decode output signals TD<0>, TD<1>, bTD<0>, and bTD<1> from the registers <0> and <1> and output the write word line current waveform signals WS<0> to WS<3>.

The second portion has registers <2> to <4> in which setting data that determine the current waveform (magnitude) of the write bit line current are programmed, and decoders BS<0> to BS<7> which decode output signals TD<2> to TD<4> and bTD<2> to bTD<4> from the registers <2> to <4> and output the write bit line current waveform signals BS<0> to BS<7>.

In this example, the write word/bit line current is set for each chip or cell array. When the write word/bit line current is to be set for each chip, only one setting circuit 23 is arranged in the chip. When a chip has a plurality of cell arrays, and the write word/bit line current is to be set for each cell array, the setting circuits 23 equal in number to that of the cell arrays are arranged.

Setting data which determine the current waveform of the write word line current are programmed in the registers <0> and <1>. The current waveform of the write word line current is controlled by the write word line current waveform signals WS<0> to WS<3>, as shown in FIG. 17. In this example, one of the write word line current waveform signals WS<0> to WS<3> changes to "H" in accordance with 2-bit setting data registered in the registers <0> and <1>.

That is, when the sizes of the PMOS transistors WS0 to WS3 shown in FIG. 17 are set to different values, four current waveforms can be implemented.

The number of write word line current waveform signals WS<0> to WS<3> to be changed to "H" may be controlled by the 2-bit setting data registered in the registers <0> and <1>. In this case, even when the PMOS transistors WS0 to WS3 shown in FIG. 17 have the same size, four current waveforms can be implemented.

D<0> and D<1> are setting data which are input from the outside of the magnetic random access memory (chip) in the test mode. In the test mode, the current waveform of the write word line current can be determined on the basis of these setting data, and the characteristics of the MTJ element can be tested.

D<0> and D<1> are also setting data which are input from the outside of the magnetic random access memory (chip) in the setting data registration mode. In the setting data registration mode, the setting data can electrically be programmed in the storage elements in the registers <0> and <1> on the basis of these setting data.

Setting data which determine the current waveform of the write bit line current are programmed in the registers <2> to <4>. The current waveform of the write bit line current is controlled by the write bit line current waveform signals BS<0> to BS<3>, as shown in FIG. 18. In this example, one of the write bit line current waveform signals BS<0> to BS<3> changes to "H" in accordance with 3-bit setting data registered in the registers <2> to <4>.

That is, when the sizes of the PMOS transistors BS0 to BS3 shown in FIG. 18 are set to different values, four current waveforms of the write bit line current from the write bit line driver 16A to the write bit line sinker 17A can be prepared. In addition, when the sizes of the PMOS transistors BS4 to BS7 are set to different values, four current waveforms of the write bit line current from the write bit line driver 17A to the write bit line sinker 16A can be prepared.

The number of write bit line current waveform signals BS<0> to BS<7> to be changed to "H" may be controlled by the 3-bit setting data registered in the registers <2> to <4>. In this case, even when the PMOS transistors BS0 to BS7 shown in FIG. 18 have the same size, four current waveforms can be implemented for each direction of the write bit line current.

D<2> to D<4> are setting data which are input from the outside of the magnetic random access memory (chip) in the test mode. In the test mode, the current waveform of the write bit line current can be determined on the basis of these setting data, and the characteristics of the MTJ element can be tested.

D<2> to D<4> are also setting data which are input from the outside of the magnetic random access memory (chip) in the setting data registration mode. In the setting data registration mode, the setting data can electrically be programmed in the storage elements in the registers <2> to <4> on the basis of these setting data.

⑥ Register <j>

A circuit example of a register <j> in the setting circuit 23 shown in FIG. 20 will be described.

I. CIRCUIT EXAMPLE 1

FIG. 21 shows a circuit example of the register.

The register <j> (j=0, 1, 2, 3, 4) is formed from a program data output circuit 29 which outputs programmed setting data as output signals TD<j> and bTD<j>, and an input data transfer circuit 30 which outputs setting data input from the outside of the magnetic random access memory as the output signals TD<j> and bTD<j>.

The program data output circuit 29 has a laser blow fuse 29A to store setting data. One-bit data is stored in accordance with whether the laser blow fuse 29A is cut. A PMOS transistor P1 and laser blow fuse 29A are connected in series between the power supply terminal VDD and the ground terminal VSS. Since the gate of the PMOS transistor P1 is connected to the ground terminal VSS, the PMOS transistor P1 is always ON.

The connection point between the PMOS transistor P1 and the laser blow fuse 29A is connected to the input terminal of an inverter I7 through an inverter I9 and transfer gate TG4. The output signal from the inverter I7 is bTD<j>, and the output signal from an inverter I8 is TD<j>.

The input data transfer circuit 30 is formed from transfer gates TG1 to TG3 and inverters I5 and I6. The inverters I5 and I6 and transfer gate TG3 constitute a latch circuit.

In the write operation of the normal operation mode, a test signal VCTEST changes to "L", and a test signal bVCTEST changes to "H". For this reason, the transfer gate TG4 is turned on, and the transfer gates TG1 and TG2 are turned off.

Hence, the setting data programmed in the laser blow fuse 29A is output as the output signals TD<j> and bTD<j> through the transfer gate TG4 and inverters I7 to I9.

In the write operation of the test mode, the test signal VCTEST changes to "H", and the test signal bVCTEST changes to "L". For this reason, the transfer gates TG1 and TG2 are turned on, and the transfer gates TG3 and TG4 are turned off.

Hence, the setting data D<j> input from an external terminal (data input terminal, address terminal, or the like) is output as the output signals TD<j> and bTD<j> through the transfer gates TG1 and TG2 and inverters I5 to I8.

In the standby state of the test mode, the test signal VCTEST changes to "L", and the test signal bVCTEST changes to "H". For this reason, the transfer gates TG1 and TG2 are turned off, and the transfer gates TG3 and TG4 are turned on.

Hence, the setting data D<j> input from the external terminal is latched by the latch circuit formed from the transfer gate TG3 and inverters I5 and I6. After that, a write test can be performed on the basis of the setting data latched by the latch circuit.

As the storage element which stores the setting data, in addition to the laser blow fuse, for example, a MTJ element (MTJ) which stores data in accordance with the magnetized state, or a MTJ element which stores data on the basis of whether the tunneling barrier is broken can be used.

II. CIRCUIT EXAMPLE 2

FIG. 22 shows another circuit example of the register.

The register <j> of this example has its characteristic feature in the structure of the program data output circuit 29, as compared to the register <j> shown in FIG. 21. More specifically, the register <j> shown in FIG. 21 uses the laser blow fuse 29A as an element for storing setting data. The register <j> of this example uses a MTJ element (MTJ) as an element for storing setting data.

The program data output circuit 29 has a MTJ element MTJ which stores setting data. Setting data can be stored in the MTJ element MTJ in accordance with the magnetized state of the MTJ element, i.e., the relationship (parallel or antiparallel) between the magnetizing direction of the fixed layer and that of the storing layer. However, this example does not use the above method.

This is because the value of setting data that is written in the MTJ element MTJ once is not rewritten again.

When it is taken into consideration that the MR ratio of the MTJ element MTJ is 20% to 40%, in the setting circuit which outputs the data of the MTJ element MTJ simultaneously with power-on, a high voltage may be applied across the MTJ element MTJ in reading the setting data, and a read error may occur.

As a characteristic of the MTJ element MTJ, as the bias voltage applied across the MTJ element MTJ becomes high, the MR ratio decreases. For this reason, when setting data is stored in accordance with the magnetized state of the MTJ element, and a high bias voltage is used to obtain a large read signal amount, the MR ratio (the difference in read signal amount between "1" data and "0" data) becomes low, and a read error occurs at a high probability.

Hence, for the MTJ element MTJ which stores setting data, the setting data is programmed on the basis of not the relationship between the magnetizing direction of the fixed layer and that of the storing layer but whether dielectric breakdown occurs in the tunneling barrier.

In the setting data programming method using the breakdown of the MTJ element MTJ, the setting data can be kept stored semipermanently.

One terminal of the MTJ element MTJ is connected to the power supply terminal VDD through the PMOS transistor P1 and an NMOS transistor N1. The other terminal is connected to the ground terminal VSS through an NMOS transistor N2.

The gate of the PMOS transistor P1 is connected to the ground terminal VSS, and the gate of the NMOS transistor N2 is connected to the ground terminal VSS. For this reason, the MOS transistors P1 and N2 are always ON.

A clamp potential Vclamp is input to the gate of the NMOS transistor N1. When the clamp potential Vclamp is set to an appropriate value, any high voltage application between the electrodes of the MTJ element MTJ can be prevented in reading the setting data.

Figure 23:
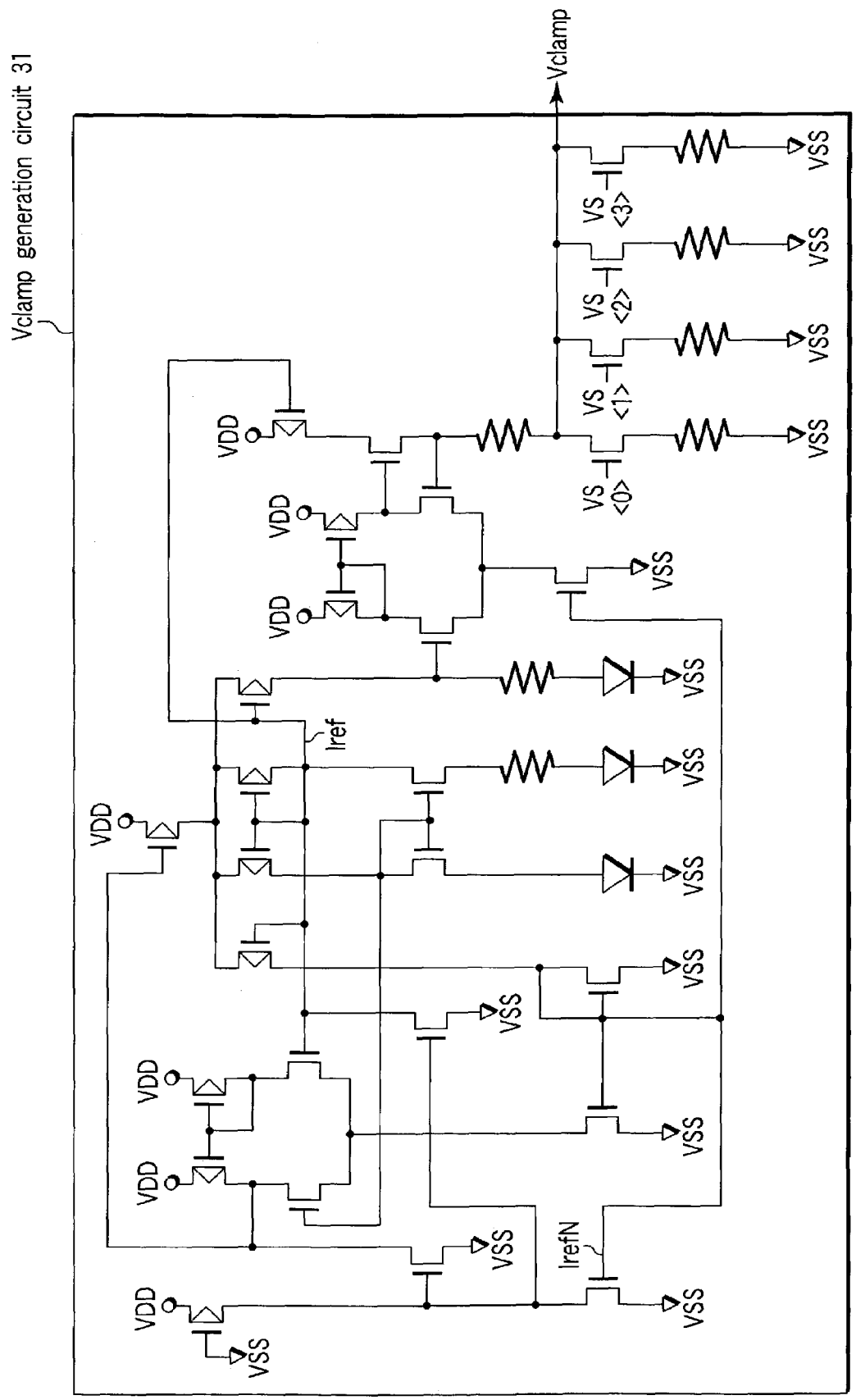
FIG. 23 is a view showing an example of a Vclamp generation circuit.

FIG. 23 shows an example of a Vclamp generation circuit which generates the clamp potential Vclamp. A Vclamp generation circuit 31 of this example obtains the clamp potential Vclamp by resistance-dividing the output voltage from a BGR circuit. The clamp potential Vclamp is 0.3 to 0.5 V.

A NAND gate circuit ND4 and PMOS transistor P2 are elements which are necessary when the setting data programming method using dielectric breakdown of the MTJ element MTJ should be employed.

In programming setting data, a program signal PROG changes to "H". For example, to write setting data "1" in the MTJ element MTJ, "1" (="H") is input from the external terminal (data input terminal, address terminal, dedicated terminal, or the like) as setting data D<j>.

At this time, the output signal from the NAND gate circuit ND4 changes to "L", and the PMOS transistor P2 is turned on. Hence, a high voltage is applied across the MTJ element MTJ to break the tunneling barrier of the MTJ element MTJ. As a result, the setting data "1" is programmed in the MTJ element MTJ. In this case, TD<j> is "L", and bTD<j> is "H".

On the other hand, to write setting data "0" in the MTJ element MTJ, "0" (="L") is input from the external terminal (data input terminal, address terminal, dedicated terminal, or the like) as setting data D<j>.

At this time, the output signal from the NAND gate circuit ND4 changes to "H", and the PMOS transistor P2 is turned off. Since no high voltage is applied across the MTJ element MTJ, the tunneling barrier of the MTJ element MTJ is not broken. As a result, the setting data "0" is programmed in the MTJ element MTJ. In this case, TD<j> is "H", and bTD<j> is "L".

The connection point between the PMOS transistor P1 and the NMOS transistor N1 is connected to the input terminal of the inverter I7 through the inverter I9 and transfer gate TG4. The output signal from the inverter I7 is bTD<j>, and the output signal from the inverter I8 is TD<j>.

⑦ Decoders WS<0> to WS<3> and BS<0> to BS<7>

A circuit example of the decoders WS<0> to WS<3> and BS<0> to BS<7> in the setting circuit 23 shown in FIG. 20 will be described.

FIG. 24 shows a circuit example of the decoder.

Each of the decoders WS<0> to WS<3> and BS<0> to BS<7> is formed from a NAND gate circuit ND3 and inverter I10.

Three input signals A, B, and C are input to the NAND gate circuit ND3. The output signal from the NAND gate circuit ND3 is input to the inverter I10. An output signal D from the inverter I10 is one of the write word/bit line current waveform signals WS<0> to WS<3> and BS<0> to BS<7>.

Table 1 is the decoding table (the relationship between the input signals and the output signals) of the decoders WS<0> to WS<3> and BS<0> to BS<7>.

TABLE 1

| INPUT | | | OUTPUT |
|---|---|---|---|
| A | B | C | D |
| bTD<0> | bTD<1> | VDD | WS<0> |
| TD<0> | bTD<1> | VDD | WS<1> |
| bTD<0> | TD<1> | VDD | WS<2> |
| TD<0 > | TD<1> | VDD | WS<3> |
| bTD<2> | bTD<3> | bTD<4> | BS<0> |
| TD<2> | bTD<3> | bTD<4> | BS<1> |
| bTD<2> | TD<3> | bTD<4> | BS<2> |
| TD<2> | TD<3> | bTD<4> | BS<3> |
| bTD<2> | bTD<3> | TD<4> | BS<4> |
| TD<2> | bTD<3> | TD<4> | BS<5> |
| bTD<2> | TD<3> | TD<4> | BS<6> |
| TD<2> | TD<3> | TD<4> | BS<7> |

⑧ Operation Waveform Example

FIG. 25 shows an example of the operation waveforms of the write word line driver/sinker shown in FIG. 17.

When the write signal WRITE changes to "H", the write word line drive signal WWLDRV and write word line sink signal WWLSNK change to "H". At this time, a write word line current having a current waveform corresponding to the values of the write word line current waveform signals WS<0> to WS<3> flows to the write word line WWLi.

When the write signal WRITE changes to "L", the write word line drive signal WWLDRV changes to "L" first. After a predetermined time determined by the delay time of the delay circuit 27 shown in FIG. 19 elapses, the write word line sink signal WWLSNK changes to "L". This predetermined time is prepared to set the potential of the write word line WWLi to 0 V after the end of write operation.

FIG. 26 shows an example of the operation waveforms of the write bit line driver/sinker shown in FIG. 18.

When the write signal WRITE changes to "H", the write bit line drive signal WBLDRV and write bit line sink signal WBLSNK change to "H". At this time, a write bit line current having a direction corresponding to the value of the write data DATA and a current waveform corresponding to the values of the write bit line current waveform signals BS<0> to BS<3> and BS<4> to BS<7> flows to the write bit line WBLi.

When the write signal WRITE changes to "L", the write bit line drive signal WBLDRV changes to "L" first. After a predetermined time determined by the delay time of the delay circuit 28 shown in FIG. 19 elapses, the write bit line sink signal WBLSNK changes to "L". This predetermined time is prepared to set the potential of the write bit line WBLi to 0 V after the end of write operation.

⑧ Conclusion

As described above, according to the magnetic random access memory of this embodiment, the current waveform (magnitude) of the write current for the write word/bit line can be set for each chip or memory cell array by programming. In addition, the current waveform of the write word line current and that of the write bit line current can independently be determined. Furthermore, for the write bit line current, the current waveform of the write bit line current can be determined individually for each write data value (direction of the write current).

With this arrangement, for example, Write Principles 1 to 5 described above can be implemented, the magnetizing direction of the storing layer of the MTJ element can reliably be reversed, and the write characteristics can be improved.

(2) Setting for Each Write Word/Bit Line

Write characteristics or asteroid curves of MTJ elements may change between write word/bit lines due to manufacturing variations.

A circuit (including a function capable of setting the magnetic field intensity individually for each magnetizing reversing direction) which sets the magnitude of a write current, i.e., the intensity of a write magnetic field necessary for reversing the magnetizing direction of the free layer (storing layer) of a MTJ element for each write word/bit line in consideration of such a variation in write characteristics (e.g., a shift of an asteroid curve) will be described.

① Overall Arrangement

FIG. 27 shows the arrangement of main part of a magnetic random access memory according to another embodiment of the present invention.

A magnetic random access memory (MRAM) 11 may construct one memory chip by itself or one block in a chip having a specific function. A memory cell array (data cell) 12 has a function of actually storing data. A reference cell array 13 has a function of setting a criterion to be used to determine the value of read data in read operation.

A row decoder & driver (row decoder & write word line driver and row decoder & read word line driver) 14-1 is arranged at one of two X-direction ends of a cell array formed from the memory cell array 12 and reference cell array 13. A write word line sinker 15 is arranged at the other end.

The row decoder & driver 14-1 has a function of, e.g., selecting one of a plurality of write word lines on the basis of a row address signal and supplying a write current to the selected write word line in the write operation. The write word line sinker 15 has a function of, e.g., absorbing the write current supplied to the selected write word line in the write operation.

The row decoder & driver 14-1 has a function of, e.g., selecting one of a plurality of read word lines (the read word lines may be integrated with the write word lines) on the basis of a row address signal and supplying a read current to the selected read word line in the read operation. A sense amplifier 20 detects, e.g., the read current and determines read data.

A column decoder & write bit line driver/sinker 16A-1 is arranged at one of two Y-direction ends of the memory cell array 12. A column decoder & write bit line driver/sinker (including a column transfer gate and column decoder) 17A-1 is arranged at the other end.

The column decoders & write bit line drivers/sinkers 16A-1 and 17A-1 have a function of, e.g., selecting one of a plurality of write bit lines (or data lines) on the basis of a column address signal and supplying a write current having a direction corresponding to write data to the selected write bit line in the write operation. The column transfer gate and column decoder have a function of electrically connecting the data line selected by the column address signal to the sense amplifier 20 in the read operation.

A reference cell column decoder & write bit line driver/sinker 16B is arranged at one of two Y-direction ends of the reference cell array 13. A reference cell column decoder & write bit line driver/sinker (including a column transfer gate and column decoder) 17B is arranged at the other end.

The reference cell column decoders & write bit line drivers/sinkers 16B and 17B have a function of storing reference data in the reference cell array 13. The column transfer gate and column decoder have a function of reading out the reference data and transferring it to the sense amplifier 20 in the read operation.

An address receiver 18 receives an address signal and transfers, e.g., a row address signal to the row decoder & driver 14-1 and a column address signal to the column decoders & write bit line drivers/sinkers 16A-1 and 17A-1. A data input receiver 19 transfers the write data to the column decoders & write bit line drivers/sinkers 16A-1 and 17A-1. An output driver 21 outputs the read data detected by the sense amplifier 20 from the magnetic random access memory 11.

A control circuit 22 receives a /CE (Chip Enable) signal, /WE (Write Enable) signal, and /OE (Output Enable) signal and controls the operation of the magnetic random access memory 11. For example, in the write operation, the control circuit 22 supplies a write signal WRITE to write current waveform control circuits/setting circuits 14-2, 16A-2, and 17A-2.

Upon receiving the write signal WRITE, each of the write current waveform control circuits/setting circuits 14-2, 16A-2, and 17A-2 determines the current waveforms (magnitudes and the like) of write currents on the basis of, e.g., setting data that are programmed in the setting circuit in advance.

More specifically, in the write operation, the write current waveform control circuit/setting circuit 14-2 supplies a write word line drive signal WWLDRV and write word line current waveform signals WS<0> to WS<3> to the row decoder & driver 14-1 and a write word line sink signal WWLSNK to the write word line sinker 15. The write current waveform control circuits/setting circuits 16A-2 and 17A-2 supply a write bit line drive signal WBLDRV, write bit line current waveform signals BS<0> to BS<7>, and write bit line sink signal WBLSNK to the column decoders & write bit line drivers/sinkers 16A-1 and 17A-1.

The write word line current waveform signals WS<0> to WS<3> are supplied, individually for each write word line, to the row decoders & write word line drivers arranged in correspondence with the write word lines. With this arrangement, the current waveform of the write current can be controlled for each write word line.

The write bit line current waveform signals BS<0> to BS<7> are supplied, individually for each write bit line, to the column decoders & write bit line drivers arranged in correspondence with the write bit lines. With this arrangement, the current waveform of the write current can be controlled for each write bit line.

The write bit line current waveform signals BS<0> to BS<3> determine the current waveforms of the write bit line currents that flow in one direction. The write bit line current waveform signals BS<4> to BS<7> determine the current waveforms of the write bit line currents that flow in the other direction reverse to one direction. Hence, the current waveform of the write current can be controlled for each write word/bit line and each write data.

As for the write current absorption timing, for example, when the timings to change the sink signals WWLSNK and WBLSNK from "H" to "L" are set after the timings to change the drive signals WWLDRV and WBLDRV from "H" to "L", the potential of the write word/bit line can be completely set to 0 V.

The values of the write word line drive signals WS<0> to WS<3> are determined on the basis of, e.g., setting data programmed in the setting circuit in advance. The values of the write bit line current waveform signals BS<0> to BS<7> are also determined on the basis of, e.g., setting data programmed in the setting circuit.

As a programming element which stores setting data, for example, a laser blow fuse, a MTJ element (MTJ), or an antifuse which breaks the tunneling barrier of a MTJ element can be used.

In the test mode of the magnetic random access memory, a write test for the MTJ element may be executed on the basis of setting data D<j> input from, e.g., a data input/output terminal.

With this write test, the write characteristics of the MTJ elements in the memory cell array 12 are grasped, and the value of the write word/bit line current (the intensity of the synthesized magnetic field Hx+Hy) in the normal write operation is determined. The setting data may be input from an address terminal.

After that, the programming operation of setting data is performed in accordance with the result of the test mode. The programming operation is operation of programming the result of the test mode, i.e., the value of the write word/bit line current in the programming element in the setting circuit.

In the programming operation, a program signal PROG changes to "H". The value of the write word/bit line current in the normal write operation is programmed in, e.g., the programming element in the setting circuit 23 by controlling the value of the setting data D<j> input from the data input/output terminal or address terminal.

② Row Decoder & Write Word Line Driver/Sinker

FIG. 28 shows a circuit example of the row decoder & write word line driver/sinker.

The row decoder & write word line driver (for one row) 14-1 is formed from an AND gate circuit AD1, NAND gate circuits NDWS0 to NDWS3, and PMOS transistors WS0 to WS3. The gate of a PMOS transistor WSi (i=0, 1, 2, 3) is connected to the output terminal of a NAND gate circuit NDWSi, the source is connected to a power supply terminal VDD, and the drain is connected to one end of a write word line WWLi (i=1, . . . )

A write word line current waveform signal WS<i> is input to one of the two input terminals of the NAND gate circuit NDWSi. The output signal from the AND gate circuit AD1 is input to the other input terminal. The write word line drive signal WWLDRV and a row address signal (changes for each row i) formed from a plurality of bits are input to the AND gate circuit AD1.

The write word line sinker (for one row) 15 is formed from an NMOS transistor TN1. The source of the NMOS transistor TN1 is connected to a ground terminal VSS, and the drain is connected to the other end of the write word line WWLi. The write word line sink signal WWLSNK is input to the gate of the NMOS transistor TN1.

In the write operation, the write word line drive signal WWLDRV changes to "H". At the same time, in the selected row i, all bits of the row address signal change to "H". That is, in the selected row i, since the output signal from the AND circuit AD1 changes to "H", a write word line current having a predetermined value (magnitude) is supplied to the write word line WWLi in accordance with the values of the write word line current waveform signals WS<0> to WS<3>.

When the write word line sink signal WWLSNK changes to "H", the NMOS transistor TN1 is turned on. For this reason, the write current flowing to the write word line WWLi is absorbed by the ground point VSS through the NMOS transistor TN1.

According to this row decoder & write word line driver/sinker, when the values of the write word line current waveform signals WS<0> to WS<3> are controlled, the magnitude (current waveform) of the write current for the write word line WWLi in the selected row i can be controlled.

When the write word line drive signal WWLDRV is set to "L", and then, the write word line sink signal WWLSNK is set to "L", the potential of the write word line WWLi after the write operation can be completely set to 0 V. It is convenient for initialization.

To control the value (magnitude) of the write word line current, the following control methods can be used. As the first method, the sizes (channel widths), i.e., the driving capabilities of the plurality of PMOS transistors WS0 to WS3 are set to the same value. Then, the number of PMOS transistors WS0 to WS3 in the ON state is changed using the write word line current waveform signals WS<0> to WS<3>.

As the second method, the sizes (channel widths), i.e., the driving capabilities of the plurality of PMOS transistors WS0 to WS3 are set to different values. Then, one of the plurality of PMOS transistors WS0 to WS3 is selectively turned on using write word line current waveform signals WS<0> to WS<3>.

The third method is a combination of the first and second methods. That is, the sizes of the PMOS transistors WS0 to WS3 are set to different values, and the number of PMOS transistors WS0 to WS3 in the ON state is changed, thereby controlling the value (magnitude) of the write current.

③ Column Decoder & Write Bit Line Driver/Sinker

Figure 29:
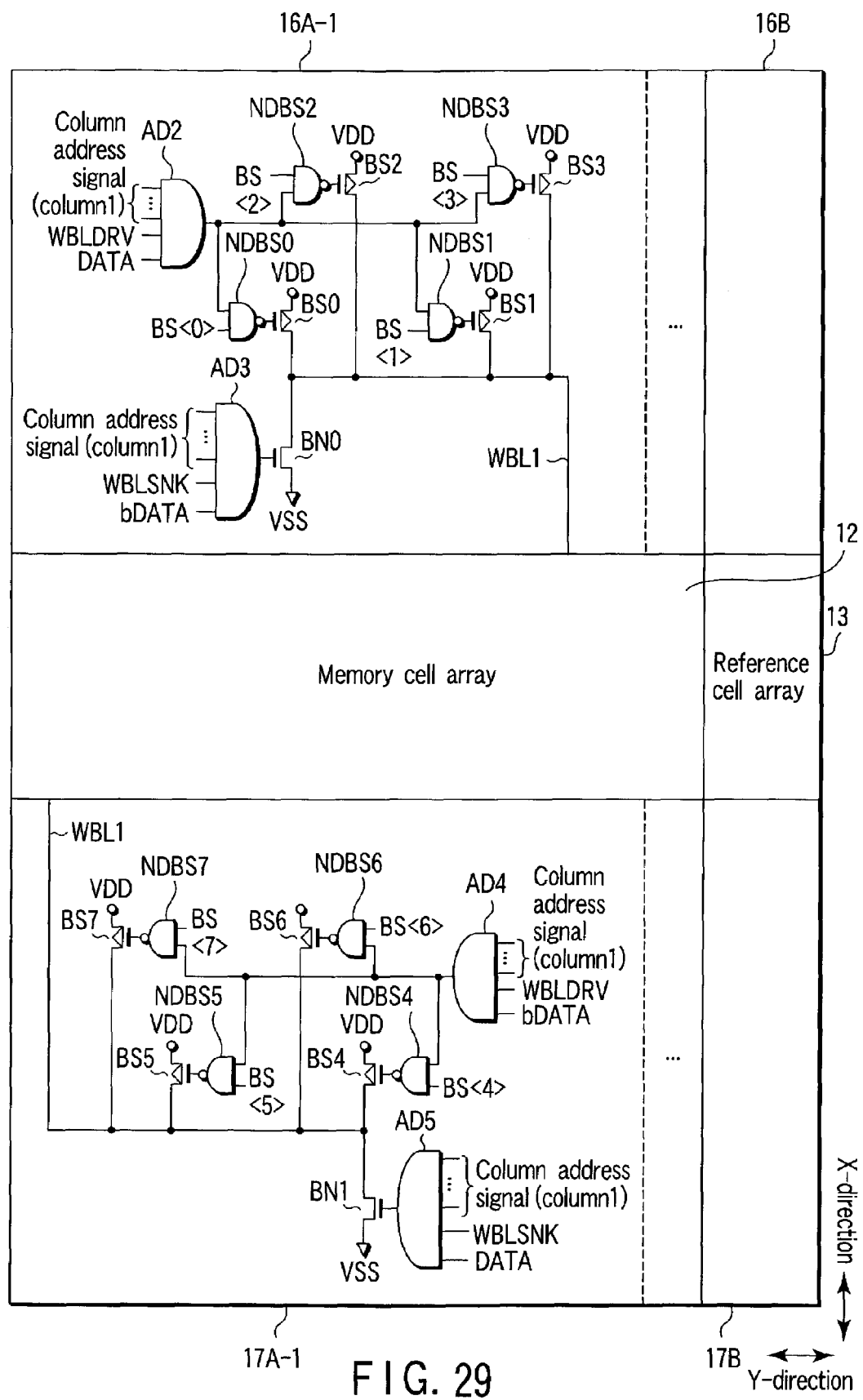
FIG. 29 is a view showing an example of a write bit line driver/sinker.

FIG. 29 shows a circuit example of the column decoder & write bit line driver/sinker.

The column decoder & write bit line driver/sinker (for one column) 16A-1 is formed from NAND gate circuits NDBS0 to NDBS3, AND gate circuits AD2 and AD3, PMOS transistors BS0 to BS3, and NMOS transistor BN0.

The gate of a PMOS transistor BSi (i=0, 1, 2, 3) is connected to the output terminal of a NAND gate circuit NDBSi, the source is connected to the power supply terminal VDD, and the drain is commonly connected to one end of a write bit line WBLi (i=1, . . . )

A write word line current waveform signal BS<i> is input to one of the two input terminals of the NAND gate circuit NDBSi (i=0, 1, 2, 3). The output signal from the AND gate circuit AD2 is input to the other input terminal. The write bit line drive signal WBLDRV, a column address signal (changes for each column i) formed from a plurality of bits, and write data DATA are input to the AND gate circuit AD2.

The gate of the NMOS transistor BN0 is connected to the output terminal of the AND gate circuit AD3, the source is connected to the ground terminal VSS, and the drain is connected to one end of the write bit line WBLi (i=1, . . . ) The write bit line sink signal WBLSNK, a column address signal (changes for each column i) formed from a plurality of bits, and an inverted signal bDATA of the write data are input to the AND gate circuit AD3.

The column decoder & write bit line driver/sinker (for one column) 17A-1 is formed from NAND gate circuits NDBS4 to NDBS7, AND gate circuits AD4 and AD5, PMOS transistors BS4 to BS7, and NMOS transistor BN1.

The gate of the PMOS transistor BSi (i=4, 5, 6, 7) is connected to the output terminal of the NAND gate circuit NDBSi, the source is connected to the power supply terminal VDD, and the drain is commonly connected to the other end of the write bit line WBLi (i=1, . . . )

The write word line current waveform signal BS<i> is input to one of the two input terminals of the NAND gate circuit NDBSi (i=4, 5, 6, 7). The output signal from the AND gate circuit AD4 is input to the other input terminal. The write bit line drive signal WBLDRV, a column address signal (changes for each column i) formed from a plurality of bits, and the inverted signal bDATA of the write data are input to the AND gate circuit AD4.

The gate of the NMOS transistor BN1 is connected to the output terminal of the AND gate circuit AD5, the source is connected to the ground terminal VSS, and the drain is connected to the other end of the write bit line WBLi (i=1, . . . ) The write bit line sink signal WBLSNK, column address signal (changes for each column i) formed from a plurality of bits, and write data DATA are input to the AND gate circuit AD5.

In the write operation, both the write bit line drive signal WBLDRV and the write bit line sink signal WBLSNK change to "H". In addition, in the selected column i, all the bits of the column address signal change to "H".

Hence, in the selected column i, the value (magnitude) of the write current flowing from the column decoder & write bit line driver/sinker 16A-1 to the column decoder & write bit line driver/sinker 17A-1 is determined by the write bit line current waveform signals BS<0> to BS<3>.

In addition, the value (magnitude) of the write current flowing from the column decoder & write bit line driver/sinker 17A-1 to the column decoder & write bit line driver/sinker 16A-1 is determined by the write bit line current waveform signals BS<4> to BS<7>.

The direction of the write current flowing to the write bit line WBLi is determined by the value of the write data DATA.

For example, when the write data DATA is "1" (="H"), at least one of the PMOS transistors BS0 to BS3 is turned on by the write bit line current waveform signals BS<0> to BS<3>. The NMOS transistor BN1 is also turned on. For this reason, the write current flows from the column decoder & write bit line driver/sinker 16A-1 to the column decoder & write bit line driver/sinker 17A-1.

When the write data DATA is "0" (="L"), at least one of the PMOS transistors BS4 to BS7 is turned on by the write bit line current waveform signals BS<4> to BS<7>. The NMOS transistor BN0 is also turned on. For this reason, the write current flows from the column decoder & write bit line driver/sinker 17A-1 to the column decoder & write bit line driver/sinker 16A-1.

According to this column decoder & write bit line driver/sinker, when the values of the write bit line current waveform signals BS<0> to BS<7> are controlled, the magnitude (current waveform) of the write current for the write bit line WBLi in the selected column i can be controlled.

When the write bit line drive signal WBLDRV is set to "L", and then, the write bit line sink signal WBLSNK is set to "L", the potential of the write bit line WBLi after the write operation can be completely set to 0 V. It is convenient for initialization.

To control the value (magnitude) of the write bit line current, the following control methods can be used. As the first method, the sizes (channel widths), i.e., the driving capabilities of the plurality of PMOS transistors BS0 to BS7 are set to the same value. Then, the number of PMOS transistors BS0 to BS7 in the ON state is changed using the write bit line current waveform signals BS<0> to BS<7>.

As the second method, the sizes (channel widths), i.e., the driving capabilities of the plurality of PMOS transistors BS0 to BS7 are set to different values. Then, one of the plurality of PMOS transistors BS0 to BS7 is selectively turned on using write bit line current waveform signals BS<0> to BS<7>.

The third method is a combination of the first and second methods. That is, the sizes of the PMOS transistors BS0 to BS7 are set to different values, and the number of PMOS transistors BS0 to BS7 in the ON state is changed, thereby controlling the value (magnitude) of the write current.

④ Write Current Waveform Control Circuit/Setting Circuit

An example of the write current waveform control circuit/setting circuit which generates the write word line drive signal WWLDRV, write word line sink signal WWLSNK, write bit line drive signal WBLDRV, and write bit line sink signal WBLSNK will be described next.

FIG. 30 shows an example of the write current waveform control circuit/setting circuit 14-2 in FIG. 27.

FIG. 30 shows the write current waveform control circuit/setting circuit 14-2 corresponding to only one row. Hence, the actual number of each of the elements (write word line driver/sinker trigger circuit 25 and setting circuit 23A) shown in FIG. 30 equals the number of rows.

The write current waveform control circuit/setting circuit 14-2 is formed from the write word line driver/sinker trigger circuit 25 and setting circuit 23A.

The write word line driver/sinker trigger circuit 25 generates the write word line drive signal WWLDRV and write word line sink signal WWLSNK on the basis of the write signal WRITE.

The setting circuit 23A outputs the write word line current waveform signals WS<0> to WS<3> on the basis of setting data. The setting data is programmed in advance in a programming element (fuse element, MTJ element, or the like) in the setting circuit 23A on the basis of the program signal PROG, address signal (row i), and input data D<0> to D<3>.

In this example, the setting data can be programmed at any time, e.g., in a wafer state or in a product state after assembly. When the setting data should be programmed after assembly, the setting data can be registered in the setting circuit 23A by inputting the input data D<0> to D<3> from, e.g., a data input pin, address pin, or dedicated pin.

The write signal WRITE changes to "H" in the write operation.

When the write signal WRITE changes to "H", the write word line driver/sinker trigger circuit 25 changes the write word line drive signal WWLDRV and write word line sink signal WWLSNK to "H".

The setting circuit 23A always outputs the write word line current waveform signals WS<0> to WS<3> based on the setting data. The write word line current waveform signals WS<0> to WS<3> determine the current waveform of the write word line current.

FIG. 31 shows an example of the write current waveform control circuit/setting circuit 16A-2 in FIG. 27.

FIG. 31 shows the write current waveform control circuit/setting circuit 16A-2 corresponding to only one column. Hence, the actual number of each of the elements (write bit line driver/sinker trigger circuit 26-1 and setting circuit 23B-1) shown in FIG. 31 equals the number of columns.

The write current waveform control circuit/setting circuit 16A-2 is formed from the write bit line driver/sinker trigger circuit 26-1 and setting circuit 23B-1.

The write bit line driver/sinker trigger circuit 26-1 generates the write bit line drive signal WBLDRV and write bit line sink signal WBLSNK on the basis of the write signal WRITE.

The setting circuit 23B-1 outputs the write bit line current waveform signals BS<0> to BS<3> on the basis of setting data. The setting data is programmed in advance in a programming element (fuse element, MTJ element, or the like) in the setting circuit 23B-1 on the basis of the program signal PROG, address signal (column i), and input data D<0> to D<3>.

In this example, the setting data can be programmed at any time, e.g., in a wafer state or in a product state after assembly. When the setting data should be programmed after assembly, the setting data can be registered in the setting circuit 23B-1 by inputting the input data D<0> to D<3> from, e.g., a data input pin, address pin, or dedicated pin.

The write signal WRITE changes to "H" in the write operation.

When the write signal WRITE changes to "H", the write bit line driver/sinker trigger circuit 26-1 changes the write bit line drive signal WBLDRV and write bit line sink signal WBLSNK to "H".

The setting circuit 23B-1 always outputs the write bit line current waveform signals BS<0> to BS<3>. The write bit line current waveform signals BS<0> to BS<3> determine the current waveform of the write bit line current.

FIG. 32 shows an example of the write current waveform control circuit/setting circuit 17A-2 in FIG. 27.

FIG. 32 shows the write current waveform control circuit/setting circuit 17A-2 corresponding to only one column. Hence, the actual number of each of the elements (write bit line driver/sinker trigger circuit 26-2 and setting circuit 23B-2) shown in FIG. 32 equals the number of columns.

The write current waveform control circuit/setting circuit 17A-2 is formed from the write bit line driver/sinker trigger circuit 26-2 and setting circuit 23B-2.

The write bit line driver/sinker trigger circuit 26-2 generates the write bit line drive signal WBLDRV and write bit line sink signal WBLSNK on the basis of the write signal WRITE.

The setting circuit 23B-2 outputs the write bit line current waveform signals BS<4> to BS<7> on the basis of setting data. The setting data is programmed in advance in a programming element (fuse element, MTJ element, or the like) in the setting circuit 23B-2 on the basis of the program signal PROG, address signal (column i), and input data D<4> to D<7>.

In this example, the setting data can be programmed at any time, e.g., in a wafer state or in a product state after assembly. When the setting data should be programmed after assembly, the setting data can be registered in the setting circuit 23B-2 by inputting the input data D<4> to D<7> from, e.g., a data input pin, address pin, or dedicated pin.

The write signal WRITE changes to "H" in the write operation.

When the write signal WRITE changes to "H", the write bit line driver/sinker trigger circuit 26-2 changes the write bit line drive signal WBLDRV and write bit line sink signal WBLSNK to "H".

The setting circuit 23B-2 always outputs the write bit line current waveform signals BS<4> to BS<7>. The write bit line current waveform signals BS<4> to BS<7> determine the current waveform of the write bit line current.

⑤ Write Word Line Driver/Sinker Trigger Circuit

Figure 33:
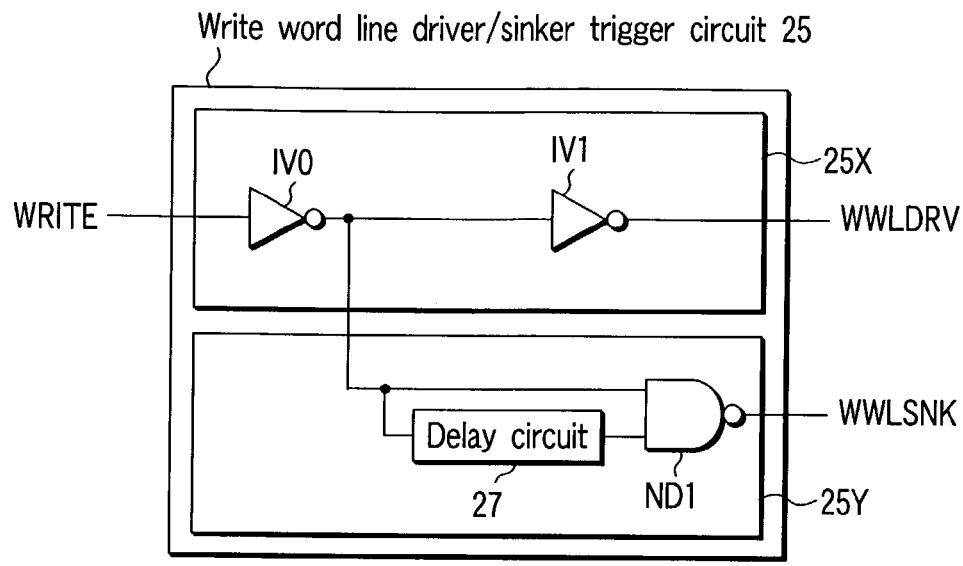
FIG. 33 is a view showing an example of a write word line driver/sinker trigger circuit.

FIG. 33 shows an example of the write word line driver/sinker trigger circuit shown in FIG. 30.

The write word line driver/sinker trigger circuit 25 is formed from a current supply/cutoff timing determining circuit 25X which determines the current supply/cutoff timing of the write current and a current absorption timing determining circuit 25Y which determines the current absorption timing of the write current.

The current supply/cutoff timing determining circuit 25X is formed from a plurality of (in this example, two) inverters IV0 and IV1. The current supply/cutoff timing determining circuit 25X determines the timing to change the write word line drive signal WWLDRV to "H" or "L" in accordance with the timing to change the write signal WRITE to "H" or "L".

The current absorption timing determining circuit 25Y is formed from a NAND gate circuit ND1 and delay circuit 27. When the write signal WRITE changes to "H", the current absorption timing determining circuit 25Y almost simultaneously changes the write word line sink signal WWLSNK to "H". After the write signal WRITE changes to "L", and a delay time determined by the delay circuit 27 elapses, the current absorption timing determining circuit 25Y changes the write word line sink signal WWLSNK to "L".

As described above, the write signal WRITE is changed to "L" first. After a predetermined interval, the write word line sink signal WWLSNK is changed to "L". With this arrangement, the write word line WWLi can be completely set to 0 V after the end of write operation.

⑥ Write Bit Line Driver/Sinker Trigger Circuit

Figure 34:
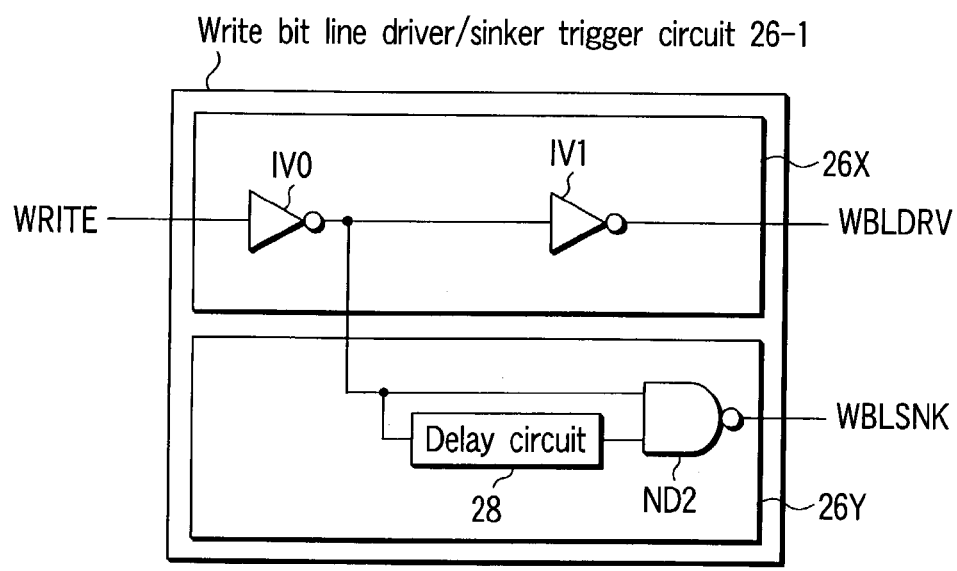
FIG. 34 is a view showing an example of a write bit line driver/sinker trigger circuit.

FIG. 34 shows an example of the write bit line driver/sinker trigger circuit shown in FIG. 31.

The write bit line driver/sinker trigger circuit 26-1 is formed from a current supply/cutoff timing determining circuit 26X which determines the current supply/cutoff timing of the write current and a current absorption timing determining circuit 26Y which determines the current absorption timing of the write current.

The current supply/cutoff timing determining circuit 26X is formed from the plurality of (in this example, two) inverters IV0 and IV1. The current supply/cutoff timing determining circuit 26X determines the timing to change the write bit line drive signal WBLDRV to "H" or "L" in accordance with the timing to change the write signal WRITE to "H" or "L".

The current absorption timing determining circuit 26Y is formed from a NAND gate circuit ND2 and delay circuit 28. When the write signal WRITE changes to "H", the current absorption timing determining circuit 26Y almost simultaneously changes the write bit line sink signal WBLSNK to "H". After the write signal WRITE changes to "L", and a delay time determined by the delay circuit 28 elapses, the current absorption timing determining circuit 26Y changes the write bit line sink signal WBLSNK to "L".

As described above, the write signal WRITE is changed to "L" first. After a predetermined interval, the write bit line sink signal WBLSNK is changed to "L". With this arrangement, the write bit line WBLi can be completely set to 0 V after the end of write operation.

Figure 35:
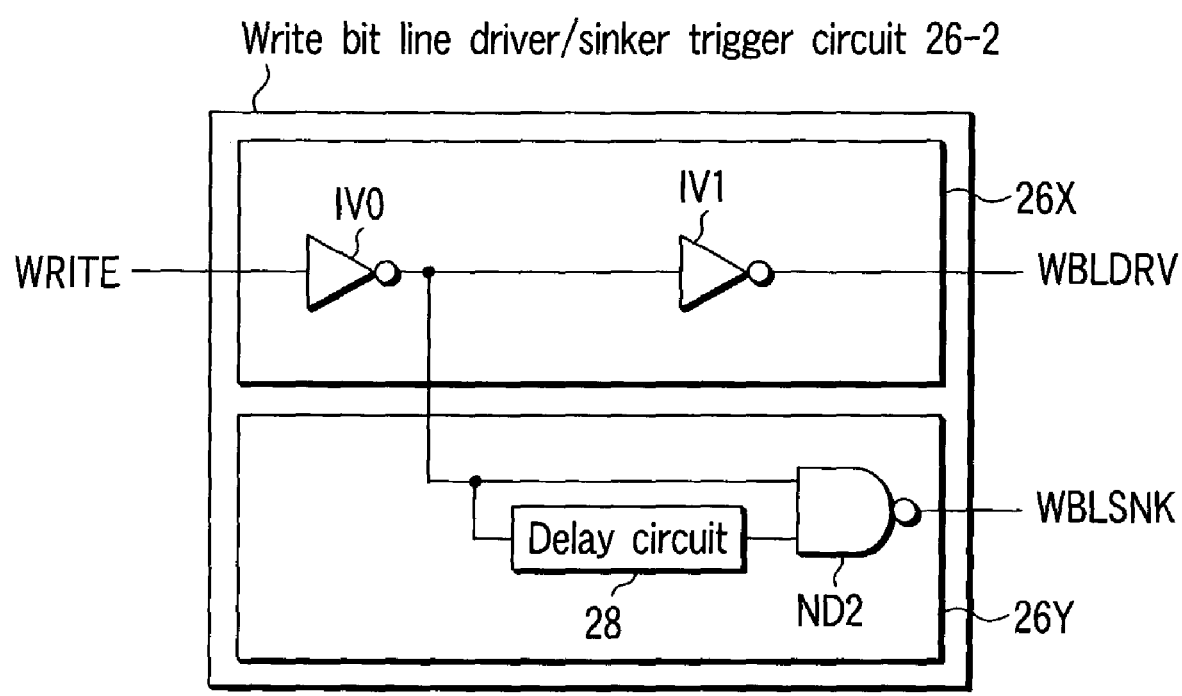
FIG. 35 is a view showing another example of the write bit line driver/sinker trigger circuit.

FIG. 35 shows an example of the write bit line driver/sinker trigger circuit shown in FIG. 32.

The write bit line driver/sinker trigger circuit 26-2 is formed from the current supply/cutoff timing determining circuit 26X which determines the current supply/cutoff timing of the write current and a current absorption timing determining circuit 26Y which determines the current absorption timing of the write current.

The current supply/cutoff timing determining circuit 26X is formed from the plurality of (in this example, two) inverters IV0 and IV1. The current supply/cutoff timing determining circuit 26X determines the timing to change the write bit line drive signal WBLDRV to "H" or "L" in accordance with the timing to change the write signal WRITE to "H" or "L".

The current absorption timing determining circuit 26Y is formed from the NAND gate circuit ND2 and delay circuit 28. When the write signal WRITE changes to "H", the current absorption timing determining circuit 26Y almost simultaneously changes the write bit line sink signal WBLSNK to "H". After the write signal WRITE changes to "L", and a delay time determined by the delay circuit 28 elapses, the current absorption timing determining circuit 26Y changes the write bit line sink signal WBLSNK to "L".

As described above, the write signal WRITE is changed to "L" first. After a predetermined interval, the write bit line sink signal WBLSNK is changed to "L". With this arrangement, the write bit line WBLi can be completely set to 0 V after the end of write operation.

⑦ Setting Circuit

FIG. 36 shows an example of the setting circuit 23A shown in FIG. 30.

The setting circuit 23A has a MTJ element MTJ which stores setting data. In this example, 1-bit data is stored on the basis of the presence/absence of breakdown of the tunneling barrier of the MTJ element MTJ. Note that 1-bit data may be stored in accordance with the magnetized state (parallel or antiparallel) of the MTJ element MTJ.

One terminal of the MTJ element MTJ is connected to the ground point VSS through an NMOS transistor N2.

The NMOS transistor N2 is always ON because the power supply potential VDD is applied to the gate of the NMOS transistor N2.

The other terminal of the MTJ element MTJ is connected to the power supply potential VDD through an NMOS transistor N1 and PMOS transistor P1. The PMOS transistor P1 is always ON because the ground potential VSS is applied to the gate of the PMOS transistor P1.

A clamp potential Vclamp is applied to the gate of the NMOS transistor N1.

The NMOS transistor N1 whose gate receives the clamp potential Vclamp has a function of preventing any high voltage from being applied to the MTJ element MTJ (preventing breakdown of the MTJ element MTJ) in the is normal operation, i.e., when the write word line current waveform signals WS<0> to WS<3> are output from the setting circuit 23A in the write operation.

A Vclamp generation circuit which generates the clamp potential Vclamp can be formed from the circuit as shown in FIG. 23.

A NAND gate circuit ND4 and PMOS transistor P2 are used when setting data which determines the current waveform or the like of the write current is to be written in the MTJ element MTJ.

More specifically, as described above, in this example, the setting data is stored in the MTJ element MTJ semipermanently on the basis of the presence/absence of breakdown of the tunneling barrier. To break the tunneling barrier of the MTJ element MTJ, the PMOS transistor P2 is turned on to apply a high voltage across the MTJ element MTJ.

The program signal PROG changes to "H" in writing setting data. For example, the program signal PROG can be supplied from the data input pin or address pin after assembly. The program signal PROG may be supplied from a dedicated pin.

When setting data should be written in the setting circuit 23A in the row i, all the bits of the address signal for selecting the row i change to "H".

For this reason, in writing the setting data, the value of the output signal from the NAND gate circuit ND4 changes in accordance with the values of the input data D<0> to D<3> in the setting circuit 23A in the row i.

For example, when the input data D<0> is "1" (="H"), the output signal from the NAND gate circuit ND4 is "L". For this reason, the PMOS transistor P2 is turned on to break the tunneling barrier of the MTJ element MTJ, and "1" is stored in the MTJ element MTJ. In this case, the write word line current waveform signal WS<0> is "H".

When the input data D<0> is "0" (="L"), the output signal from the NAND gate circuit ND4 is "H". For this reason, the PMOS transistor P2 is turned off. The tunneling barrier of the MTJ element MTJ is not broken, and "0" is stored in the MTJ element MTJ. In this case, the write word line current waveform signal WS<0> is "L".

In this way, setting data can be written in the setting circuit 23A in accordance with the input data D<0> to D<3>, and the values of the write word line current waveform signals WS<0> to WS<3> are determined.

Figure 38:
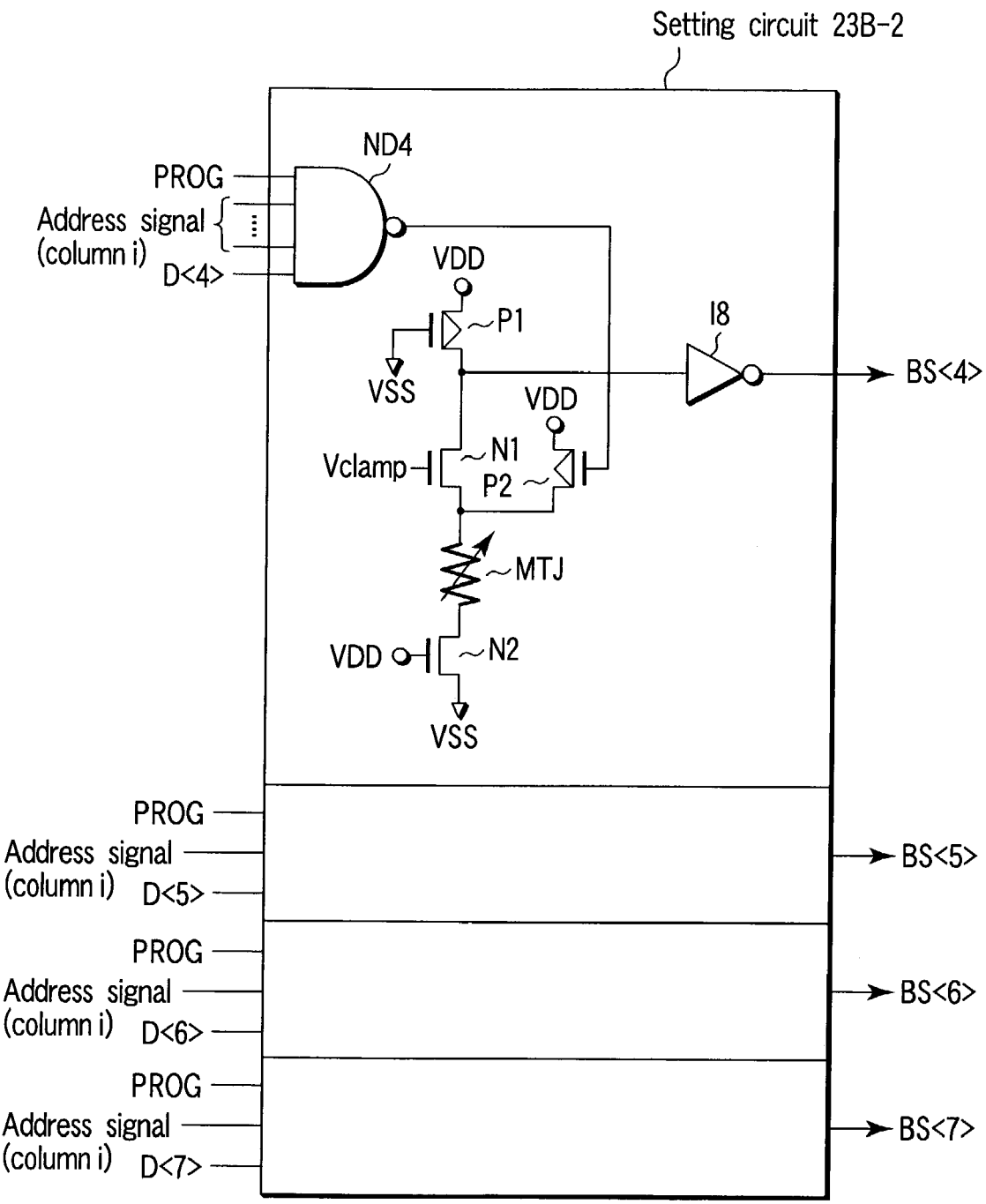
FIG. 38 is a view showing still another example of the setting circuit.

FIG. 37 shows an example of the setting circuit 23B-1 shown in FIG. 31. FIG. 38 shows an example of the setting circuit 23B-2 shown in FIG. 32.

The setting circuits 23B-1 and 23B-2 shown in FIGS. 37 and 38 have the same arrangement as that of the setting circuit 23A in FIG. 36 described above. Setting data is stored semipermanently on the basis of the presence/absence of breakdown of the tunneling barrier of the MTJ element MTJ.

The program signal PROG changes to "H" in writing setting data. When setting data should be written in the setting circuit 23B-1 or 23B-2 in the column i, all the bits of the address signal for selecting the column i change to "H".

For this reason, in writing the setting data, the value of the output signal from the NAND gate circuit ND4 changes in accordance with the values of the input data D<0> to D<7> in the setting circuit 23B-1 or 23B-2 in the column i.

For example, when the input data D<0> is "1" (="H"), the output signal from the NAND gate circuit ND4 is "L". For this reason, the PMOS transistor P2 is turned on to break the tunneling barrier of the MTJ element MTJ, and "1" is stored in the MTJ element MTJ.

In this case, the write bit line current waveform signal BS<0> is "H".

When the input data D<0> is "0" (="L"), the output signal from the NAND gate circuit ND4 is "H". For this reason, the PMOS transistor P2 is turned off. The tunneling barrier of the MTJ element MTJ is not broken, and "0" is stored in the MTJ element MTJ.

In this case, the write bit line current waveform signal BS<0> is "L".

In this way, when the input data D<0> to D<7> are written in the setting circuit 23B-1 or 23B-2 as setting data, the values of the write bit line current waveform signals BS<0> to BS<3> and the values of the write bit line current waveform signals BS<4> to BS<7> are determined.

The input data D<0> to D<3> determine the current waveform of the write bit line current in one direction, and the input data D<4> to D<7> determine the current waveform of the write bit line current in the other direction opposite to one direction.

In each write bit line, when the write bit lines should have the same current waveform independently of the write data, i.e., the direction of the write bit line current, the setting circuit 23B-2 shown in FIG. 38 can be omitted. In this case, both the write bit line drivers/sinkers 16A-1 and 17A-1 are controlled by the write bit line current waveform signals BS<0> to BS<3>.

⑧ Conclusion

As described above, according to the magnetic random access memory of this embodiment, the current waveform (magnitude) of the write current for the write word/bit line can be set for each write word line and each write bit line by programming. In addition, for the write bit line current, the current waveform of the write current can be determined individually for each write data value (direction of the write current).

With this arrangement, for example, Write Principles 1 to 5 described above can be implemented, the magnetizing direction of the storing layer of the MTJ element can reliably be reversed, and the write characteristics can be improved.

(3) Setting for Each TMR Element

As a modification of the circuit scheme for setting the current waveform of a write current for each write word/bit line described in (2), a circuit scheme for setting the current waveform of the write current for each MTJ element can be implemented.

In this case, the setting circuits 23A, 23B-1, and 23B-2 shown in FIGS. 36 to 38 are prepared to be equal in number to the MTJ elements and selected by a row address signal and column address signal. The circuit scheme can theoretically be implemented although the numbers of setting circuits 23A, 23B-1, and 23B-2 largely increase.

(4) Stacking Memory Cell Arrays

In recent years, to implement highly integrated memory cells (MTJ elements), a number of cell array structures in which a plurality of stages of memory cell arrays are stacked on a semiconductor substrate (chip) have been proposed.

The write principles according to the embodiments of the present invention and circuit schemes which implement them have been described above. They can also be applied to a magnetic random access memory having memory cell arrays stacked in a plurality of stages.

① Setting for Each Chip or Cell Array

An example in which the current waveform of a write word/bit line current is set for each chip or cell array will be described.

Figure 39:
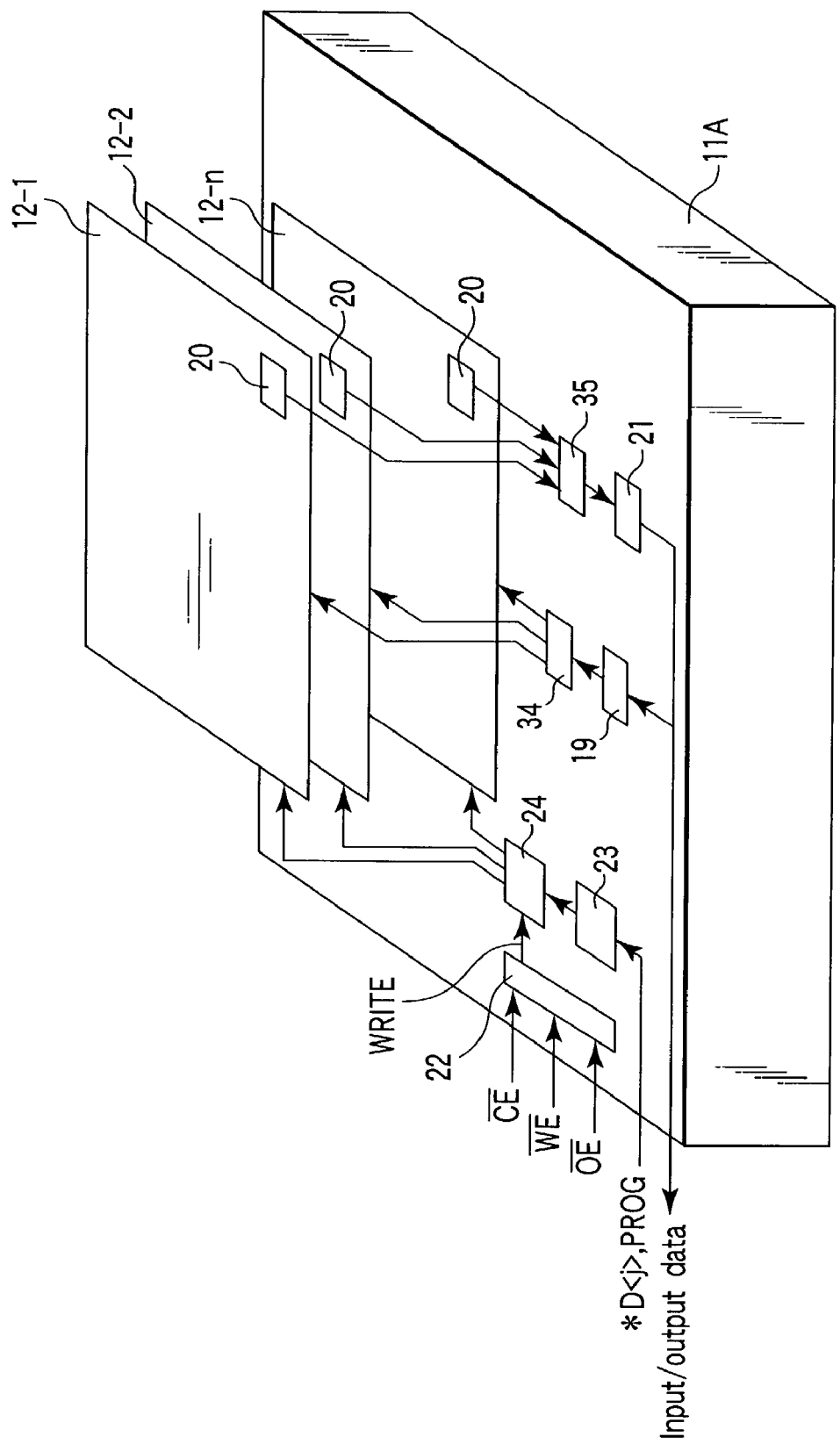
FIG. 39 is a perspective view showing Example 1 in which the circuit scheme according to the present invention is applied to an MRAM having memory cell arrays stacked in a plurality of stages.

FIG. 39 shows the schematic arrangement of a magnetic random access memory having memory cell arrays stacked in a plurality of stages.

This example corresponds to a case wherein above-described circuit examples for "(1) Setting for Each Chip or Cell Array" are applied to the magnetic random access memory having memory cell arrays stacked in a plurality of stages.

Memory cell arrays 12-1, 12-2, . . . , 12-n are stacked in n (n is an integer: n≧2) stages on a semiconductor substrate (magnetic random access memory chip) 11A. Each of the memory cell arrays 12-1, 12-2, . . . , 12-n includes some peripheral circuits, e.g., a row decoder & write word line driver/sinker, column decoder & write bit line driver/sinker, and the like.

Input data is input to a selector 34 through a data input receiver 19. The selector 34 transfers the input data to a selected memory cell array 12-i. A demultiplexer may be used in place of the selector 34.

Output data is transferred from a sense amplifier 20 of a corresponding one of the memory cell arrays 12-1, 12-2, . . . , 12-n to a data output driver 21 through a selector 35. The selector 35 transfers the output data from the sense amplifier 20 of the selected memory cell array 12-i to the data output driver 21. A multiplexer may be used in place of the selector 35.

A setting circuit 23 stores setting data which determines the current waveform of a write word/bit line current. A write current waveform control circuit 24 actually determines the current waveform of the write word/bit line current on the basis of a write signal WRITE from the control circuit 22 and the setting data from the setting circuit 23.

The current waveform may be common to all the memory cell arrays (the current waveform is set for each chip) or may be changed between the memory cell arrays (the current waveform is set for each memory cell array). In the latter case, for example, the setting circuit 23 and write current waveform control circuit 24 are arranged for each memory cell array.

② Setting for Each Write Word/Bit Line

An example in which the current waveform of a write word/bit line current is set for each write word/bit line will be described.

Figure 40:
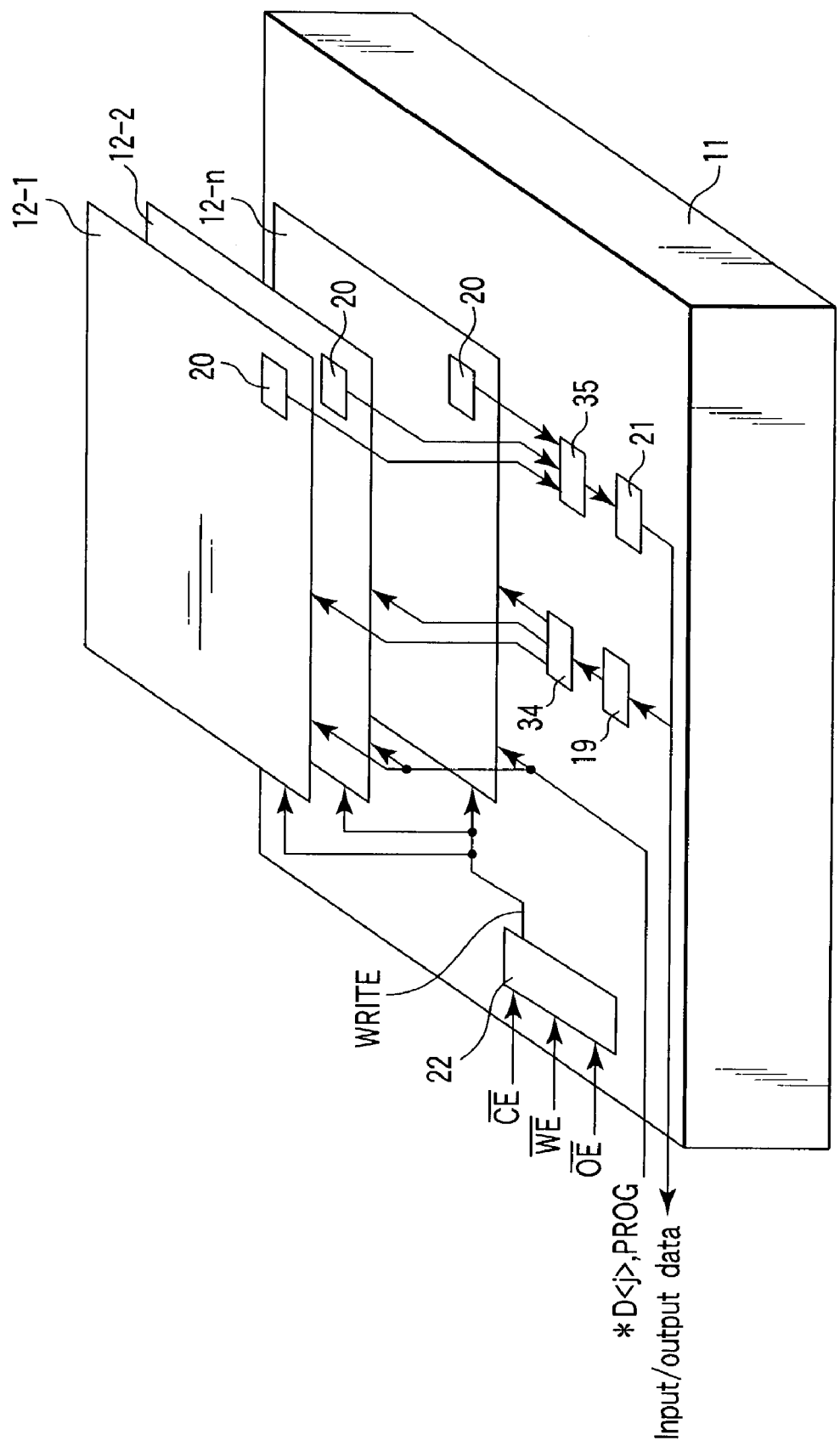
FIG. 40 is a perspective view showing Example 2 in which the circuit scheme according to the present invention is applied to an MRAM having memory cell arrays stacked in a plurality of stages.
Figure 41:
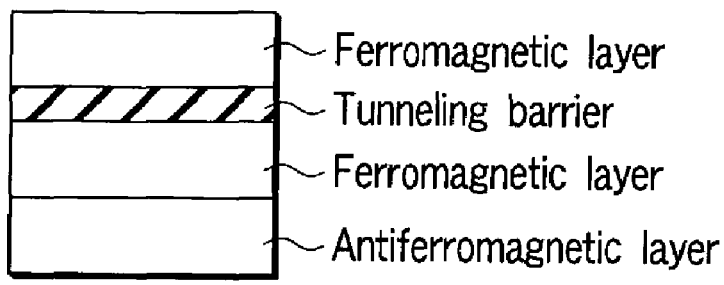
FIG. 41 is a view showing a structural example of a MTJ element.
Figure 42:
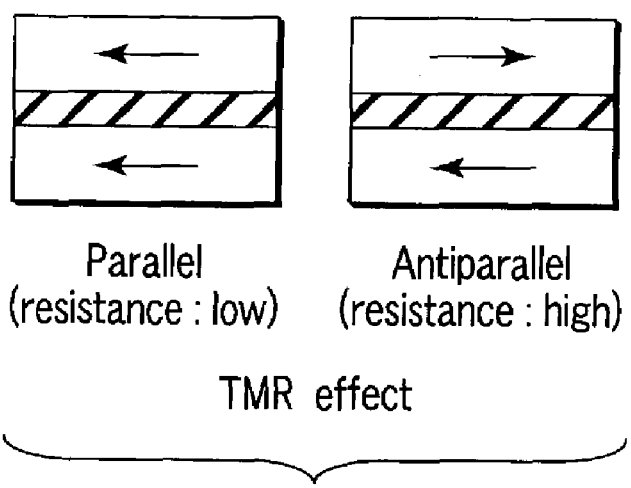
FIG. 42 is a view showing two states of the MTJ element.

FIG. 40 shows the schematic arrangement of a magnetic random access memory having memory cell arrays stacked in a plurality of stages.

This example corresponds to a case wherein above-described circuit examples for "(2) Setting for Each Write Word/Bit Line" are applied to the magnetic random access memory having memory cell arrays stacked in a plurality of stages.

The memory cell arrays 12-1, 12-2, ..., 12-n are stacked in n (n is an integer: n≧2) stages on the semiconductor substrate (magnetic random access memory chip) 11A. Each of the memory cell arrays 12-1, 12-2, ..., 12-n includes some peripheral circuits, e.g., a row decoder & write word line driver/sinker, column decoder & write bit line driver/sinker, and the like.

Input data is input to the selector 34 through the data input receiver 19. The selector 34 transfers the input data to the selected memory cell array 12-i. A demultiplexer may be used in place of the selector 34.

Output data is transferred from the sense amplifier 20 of a corresponding one of the memory cell arrays 12-1, 12-2, ..., 12-n to the data output driver 21 through the selector 35. The selector 35 transfers the output data from the sense amplifier 20 of the selected memory cell array 12-i to the data output driver 21. A multiplexer may be used in place of the selector 35.

The write signal WRITE from the control circuit 22 is supplied to the memory cell arrays 12-1, 12-2, ..., 12-n. Each of the memory cell arrays 12-1, 12-2, ..., 12-n has a write current waveform control circuit/setting circuit.

A setting circuit in the write current waveform control circuit/setting circuit stores setting data which determines the current waveform of a write word/bit line current. The write current waveform control circuit/setting circuit actually determines the current waveform of the write word/bit line current on the basis of the write signal WRITE and setting data.

③ Conclusion

As described above, the write principles according to the embodiments of the present invention and circuit schemes which implement them can also be applied to a magnetic random access memory having memory cell arrays stacked in a plurality of stages.

Hence, even in the magnetic random access memory having the memory cell arrays stacked in the plurality of stages, the current waveform of the write current for the write word/bit line can be set for each write word/bit line by programming. The magnetization of the storing layer of an MTJ element can reliably be inverted, and the write characteristics can be improved.

3. Others

The write principles according to the embodiments of the present invention and the circuit schemes that implement them can be applied to any magnetic random access memory independently of the cell array structure type.

Figure 43:
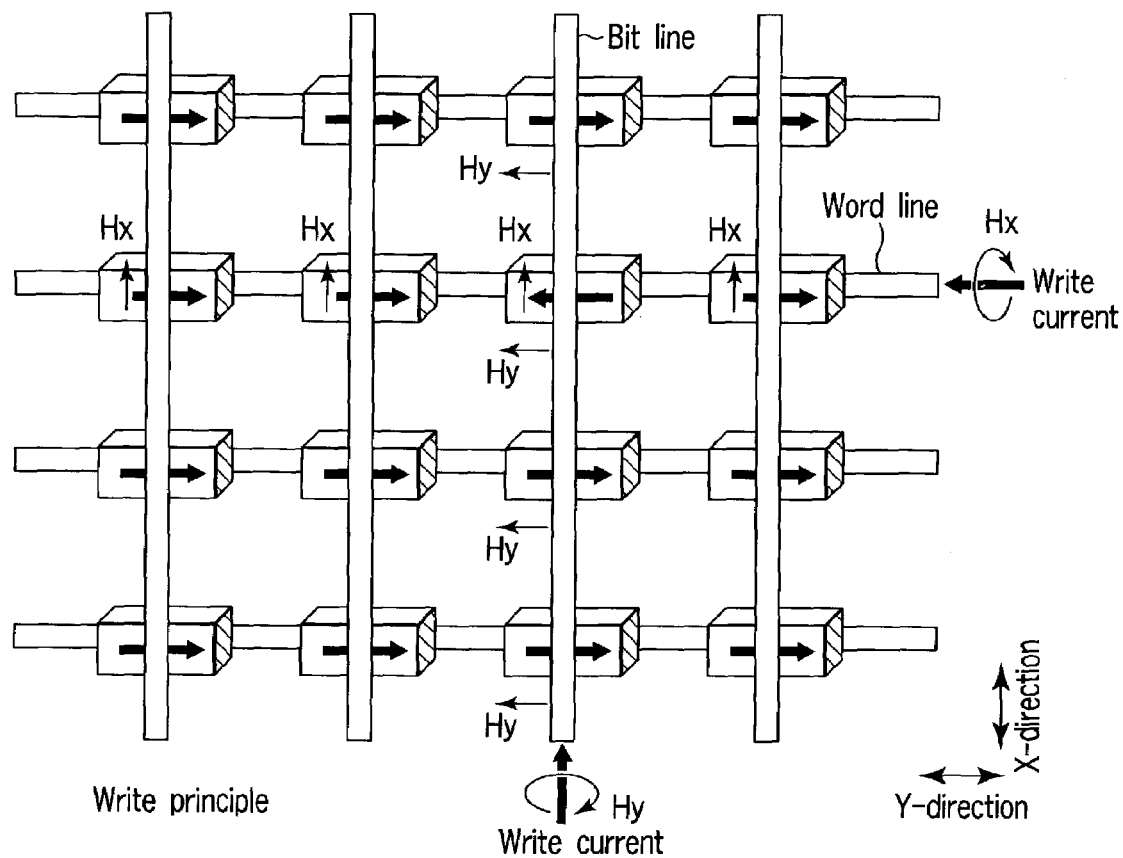
FIG. 43 is a view showing the write operation principle of a magnetic random access memory.
Figure 46:
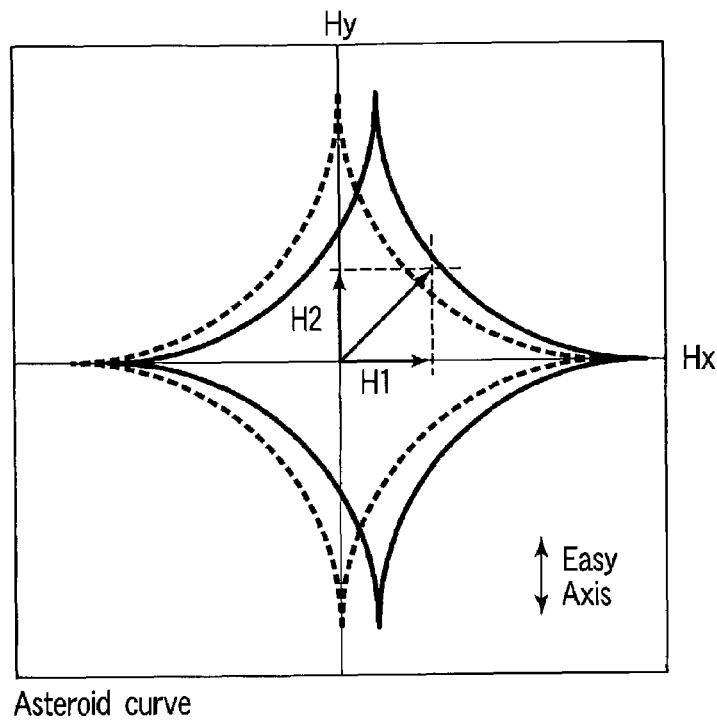
FIG. 46 is a view showing an example of the pattern of the shift of the asteroid curve.
Figure 47:
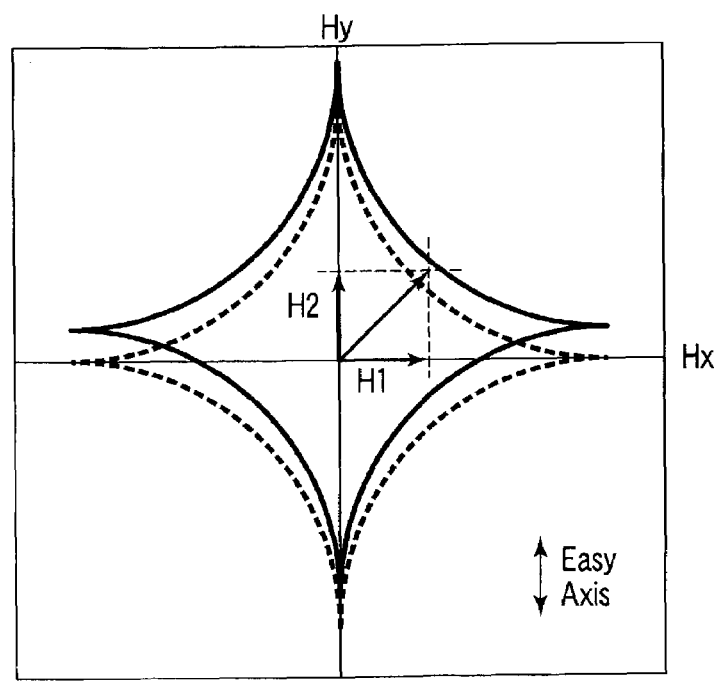
FIG. 47 is a view showing another example of the pattern of the shift of the asteroid curve.
Figure 48:
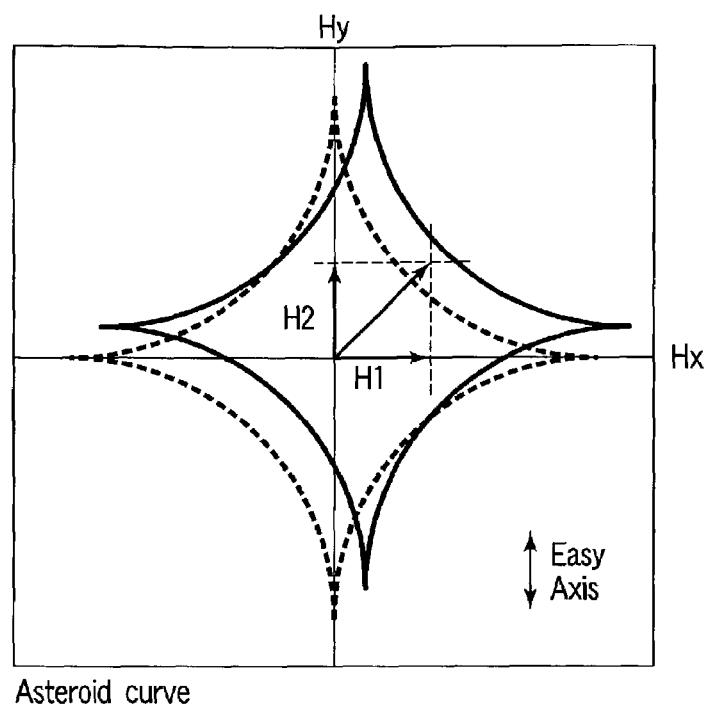
FIG. 48 is a view showing still another example of the pattern of the shift of the asteroid curve.
Figure 49:
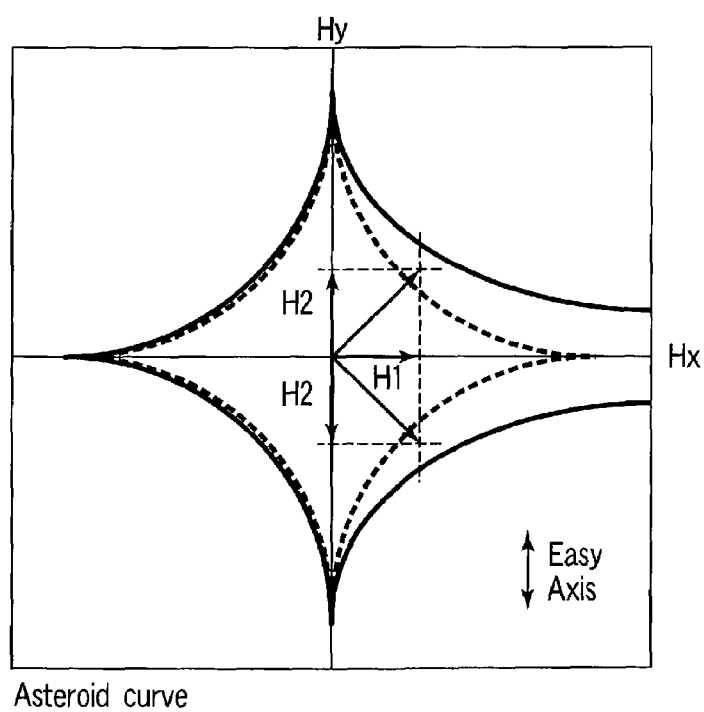
FIG. 49 is a view showing still another example of the pattern of the shift of the asteroid curve.

For example, the write principles according to the present invention and the circuit schemes that implement them can be applied to even a magnetic random access memory having a cross-point cell array structure as shown in FIG. 43 or a magnetic random access memory having a cell array structure in which a read select switch (MOS transistor) is connected to one or a plurality of MTJ elements.

The write principles according to the present invention and the circuit schemes that implement them can also be applied to a magnetic random access memory which is not of a cross-point type and has no read select switch, a magnetic random access memory having read bit lines and write bit lines separated from each other, or a magnetic random access memory which stores a plurality of bits in one MTJ element.

As has been described above, according to the magnetic random access memory of each embodiment of the present invention, in consideration of a variation in write characteristics between MTJ elements, the current waveform of the write word/bit line current is determined for each chip, each memory cell array, or each word line/bit line. When the write characteristics vary, the value of the write word line current and the value of the write bit line current are individually controlled to eliminate the influence of the variation. As a result, the magnetizing direction of the storing layer of a MTJ element can reliably be reversed, the write characteristics and yield can be improved, and the manufacturing cost can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing method of a magnetic random access memory, comprising:

testing write characteristics of a magnetoresistive element having a hard axis and an easy axis;

independently determining a value of a first write current which generates a magnetic field in the hard axis direction, which is necessary for magnetization inversion of the magnetoresistive element, and a value of a second write current which generates a magnetic field in the easy axis direction on the basis of the write characteristics;

programming the values of the first and second write currents as setting data that include a current amplitude; and generating the first and second write currents on the basis of the setting data to write data in the magnetoresistive element.

2. The method according to claim 1, wherein testing the write characteristics is executed by confirming presence/absence of magnetization inversion of the magnetoresistive element when intensities of the magnetic fields in the hard and easy axis directions are independently changed.

3. The method according to claim 2, wherein the intensities of the magnetic fields in the hard and easy axis directions are independently changed on the basis of input data.

4. The method according to claim 1, wherein the values of the first and second write currents are determined for each chip.

5. The method according to claim 1, wherein the values of the first and second write currents are determined for each memory cell array.

6. The method according to claim 1, wherein the value of the first write current is determined for each write line that runs in the easy axis direction, and the value of the second write current is determined for each write line that runs in the hard axis direction.

7. The method according to claim 1, wherein the write characteristics of the magnetoresistive element are grasped in accordance with an asteroid curve.

8. The method according to claim 7, wherein when the asteroid curve shifts in the hard axis direction, the value of the first write current is changed from a design value.

9. The method according to claim 7, wherein when the asteroid curve shifts in the hard axis direction, the values of the first and second write currents are changed from design values.

10. The method according to claim 7, wherein when the asteroid curve shifts in the easy axis direction, the value of the second write current is changed from a design value.

11. The method according to claim 7, wherein when the asteroid curve shifts in the easy axis direction, the values of the first and second write currents are changed from design values.

12. The method according to claim 1, wherein the first and second write currents have different values.

13. The method according to claim 1, wherein the first and second write currents have the same value.

14. The method according to claim 1, wherein the first write current has a predetermined direction.

15. The method according to claim 1, wherein a direction of the second write current determines a value of write data for the magnetoresistive element.

16. The method according to claim 15, wherein the value of the second write current is controlled independently of the direction of the second write current.

17. A magnetic random access memory comprising:
first and second write lines;
a magnetoresistive element which is arranged at an intersection between the first and second write lines, wherein the first and second write lines orthogonally cross each other at a position above or below the magnetoresistive element;
a first driver which supplies a first write current to the first write line;
a second driver which supplies a second write current to the second write line; and
a setting circuit in which first setting data to control a current waveform of the first write current and second setting data to control a current waveform of the second write current are registered, wherein the first and second setting data include a current amplitude.

18. The memory according to claim 17, wherein the first driver is controlled by the first setting data or data obtained by decoding the first setting data, and the second driver is controlled by the second setting data or data obtained by decoding the second setting data.

19. The memory according to claim 17, wherein the current waveforms of the first and second write currents are determined for each chip.

20. The memory according to claim 17, wherein the current waveforms of the first and second write currents are determined for each memory cell array.

21. The memory according to claim 17, wherein the current waveform of the first write current is determined uniquely for the first write line, and the current waveform of the second write current is determined uniquely for the second write line.

22. The memory according to claim 17, further comprising
a first sinker which absorbs the first write current, and
a second sinker which absorbs the second write current.

23. The memory according to claim 22, wherein operation of the first sinker is ended after an elapse of a predetermined time from an end of operation of the first driver.

24. The memory according to claim 22, wherein operation of the second sinker is ended after an elapse of a predetermined time from an end of operation of the second driver.

25. The memory according to claim 17, wherein the first setting data is data which determines a value of the first write current for the first write line.

26. The memory according to claim 17, wherein the second setting data is data which determines a value of the second write current for the second write line.

27. The memory according to claim 17, wherein the first write current has a predetermined direction independently of a value of write data for the magnetoresistive element.

28. The memory according to claim 17, wherein the second write current has a direction which changes in accordance with a value of write data for the magnetoresistive element.

29. The memory according to claim 28, wherein the current waveform of the second write current is controlled independently of a direction of the second write current.

30. The memory according to claim 17, wherein the first driver has a plurality of current supply sources, and the first setting data is data to control operations of said plurality of current supply sources.

31. The memory according to claim 30, wherein said plurality of current supply sources have the same current supply capability.

32. The memory according to claim 30, wherein said plurality of current supply sources have different current supply capabilities.

33. The memory according to claim 17, wherein the second driver has a plurality of current supply sources, and the second setting data is data to control operations of said plurality of current supply sources.

34. The memory according to claim 33, wherein said plurality of current supply sources have the same current supply capability.

35. The memory according to claim 33, wherein said plurality of current supply sources have different current supply capabilities.

36. The memory according to claim 17, wherein the setting circuit has an output circuit which outputs the first and second setting data in normal operation, and a transfer circuit which transfers first and second test data that control the first and second write currents in test operation.

37. The memory according to claim 17, wherein the setting circuit has a storage element to store the first and second setting data semipermanently.

38. The memory according to claim 37, wherein the storage element is a laser blow fuse.

39. The memory according to claim 37, wherein the storage element is a magnetoresistive element.

40. The memory according to claim 37, wherein the storage element is an antifuse which stores data on the basis of presence/absence of breakdown of a tunneling barrier of a magnetoresistive element.

41. The memory according to claim 40, further comprising a circuit which electrically programs the first and second setting data in the antifuse.

42. The memory according to claim 17, wherein the magnetoresistive element has an easy axis and a hard axis, the easy axis being parallel to a direction in which the first write line runs, and the hard axis being parallel to a direction in which the second write line runs.

43. The memory according to claim 42, wherein the first write line is a write word line, and the second write line is a write bit line.

44. The memory according to claim 17, wherein the magnetoresistive element is a tunneling magnetoresistive element having two ferromagnetic layers and a tunneling barrier layer inserted between the two ferromagnetic layers.

* * * * *